United States Patent
Wodrich et al.

(10) Patent No.: US 12,248,737 B2
(45) Date of Patent: *Mar. 11, 2025

(54) AGENT SUPPORTABLE DEVICE INDICATING AN ITEM OF INTEREST IN A WIRELESS COMMUNICATION AREA

(71) Applicant: Middle Chart, LLC, Jacksonville, FL (US)

(72) Inventors: Michael Wodrich, Jacksonville, FL (US); Michael S. Santarone, Jacksonville, FL (US); Randall Pugh, Jacksonville, FL (US); Jason E. Duff, Jacksonville, FL (US); Frederick Flitsch, Framingham, MA (US)

(73) Assignee: Middle Chart, LLC, Jacksonville, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/424,749

(22) Filed: Jan. 27, 2024

(65) Prior Publication Data
US 2024/0242000 A1    Jul. 18, 2024

Related U.S. Application Data

(63) Continuation of application No. 18/123,294, filed on Mar. 19, 2023, now Pat. No. 11,893,317, which is a
(Continued)

(51) Int. Cl.
*G06F 30/13*    (2020.01)
*G01S 19/01*    (2010.01)
(Continued)

(52) U.S. Cl.
CPC .............. *G06F 30/13* (2020.01); *G01S 19/48* (2013.01); *G06Q 99/00* (2013.01); *G06T 17/05* (2013.01); *G06T 19/006* (2013.01); *G01S 19/01* (2013.01)

(58) Field of Classification Search
CPC .......... G06F 30/13; G01S 19/48; G01S 19/01; G01S 5/0284; G01S 5/186; G06Q 99/00; (Continued)

(56) References Cited

U.S. PATENT DOCUMENTS

| 5,884,202 A | 3/1999 | Arjomand |
| 5,933,479 A | 8/1999 | Michael et al. |

(Continued)

FOREIGN PATENT DOCUMENTS

| CN | 102147597 A | 8/2011 |
| EP | 2042885 B1 | 10/2009 |

(Continued)

OTHER PUBLICATIONS

Amekudzi, Adjo A., Rebecca Shelton, and Tim R. Bricker. "Infrastructure Rating Tool: Using Decision Support Tools to Enhance ASCE Infrastructure Report Card Process." Leadership and Management in Engineering 13.2 (2013): 76-82. (Year: 2013).

(Continued)

*Primary Examiner* — Brandon J Miller
(74) *Attorney, Agent, or Firm* — Tracnik Law PLLC; Joseph P. Kincart

(57) ABSTRACT

Apparatus for display of digital content associated with a location of a Node in a wireless communication area. A user interface is generated with a digital representation of content associated with a physical tag or other Node. The user interface includes interactive portions based upon positions in the wireless communication area. The interactive portions may be activated to display the digital content associated with the physical tag in a user interface.

20 Claims, 26 Drawing Sheets

Related U.S. Application Data continuation of application No. 17/835,899, filed on Jun. 8, 2022, now Pat. No. 11,610,033, which is a continuation of application No. 17/410,526, filed on Aug. 24, 2021, now Pat. No. 11,468,209, which is a continuation of application No. 16/951,550, filed on Nov. 18, 2020, now Pat. No. 11,100,260, which is a continuation of application No. 16/900,753, filed on Jun. 12, 2020, now Pat. No. 10,872,179, which is a continuation-in-part of application No. 16/817,926, filed on Mar. 13, 2020, now Pat. No. 10,831,945, and a continuation-in-part of application No. 16/721,906, filed on Dec. 19, 2019, now Pat. No. 10,726,167, said application No. 16/817,926 is a continuation-in-part of application No. 16/688,775, filed on Nov. 19, 2019, now Pat. No. 10,628,617, said application No. 16/721,906 is a continuation of application No. 16/688,775, filed on Nov. 19, 2019, now Pat. No. 10,628,617, which is a continuation-in-part of application No. 16/657,660, filed on Oct. 18, 2019, now abandoned, which is a continuation-in-part of application No. 16/597,271, filed on Oct. 9, 2019, now abandoned, and a continuation-in-part of application No. 16/549,503, filed on Aug. 23, 2019, now Pat. No. 11,054,335, and a continuation-in-part of application No. 16/528,104, filed on Jul. 31, 2019, now Pat. No. 10,671,767, which is a continuation-in-part of application No. 16/504,919, filed on Jul. 8, 2019, now Pat. No. 10,740,502, which is a continuation-in-part of application No. 16/503,878, filed as application No. PCT/US2019/033134 on May 20, 2019, now Pat. No. 10,776,529, said application No. 16/503,878 is a continuation-in-part of application No. 16/297,383, filed on Mar. 8, 2019, now Pat. No. 10,762,251, said application No. 16/549,503 is a continuation-in-part of application No. 16/297,383, filed on Mar. 8, 2019, now Pat. No. 10,762,251, said application No. 16/503,878 is a continuation of application No. 16/249,574, filed on Jan. 16, 2019, now Pat. No. 10,831,943, said application No. PCT/US2019/033134 is a continuation of application No. 16/249,574, filed on Jan. 16, 2019, now Pat. No. 10,831,943, said application No. 16/297,383 is a continuation-in-part of application No. 16/176,002, filed on Oct. 31, 2018, now Pat. No. 10,268,782, said application No. 16/249,574 is a continuation-in-part of application No. 16/176,002, filed on Oct. 31, 2018, now Pat. No. 10,268,782, which is a continuation-in-part of application No. 16/171,593, filed on Oct. 26, 2018, now Pat. No. 10,620,084, which is a continuation-in-part of application No. 16/165,517, filed on Oct. 19, 2018, now Pat. No. 10,733,334, which is a continuation-in-part of application No. 16/161,823, filed on Oct. 16, 2018, now Pat. No. 10,467,353, said application No. 16/597,271 is a continuation of application No. 16/161,823, filed on Oct. 16, 2018, now Pat. No. 10,467,353, said application No. 16/165,517 is a continuation-in-part of application No. 16/142,275, filed on Sep. 26, 2018, now Pat. No. 10,433,112, said application No. 16/597,271 is a continuation-in-part of application No. 15/887,637, filed on Feb. 2, 2018, now abandoned, said application No. 16/142,275 is a continuation-in-part of application No. 15/887,637, filed on Feb. 2, 2018, now abandoned, said application No. 16/161,823 is a continuation-in-part of application No. 15/716,133, filed on Sep. 26, 2017, now Pat. No. 10,025,887, said application No. 15/887,637 is a continuation-in-part of application No. 15/716,133, filed on Sep. 26, 2017, now Pat. No. 10,025,887, said application No. 16/161,823 is a continuation-in-part of application No. 15/703,310, filed on Sep. 13, 2017, now abandoned, said application No. 15/887,637 is a continuation-in-part of application No. 15/703,310, filed on Sep. 13, 2017, now abandoned.

(60) Provisional application No. 62/909,061, filed on Oct. 1, 2019, provisional application No. 62/871,499, filed on Jul. 8, 2019, provisional application No. 62/793,714, filed on Jan. 17, 2019, provisional application No. 62/769,133, filed on Nov. 19, 2018, provisional application No. 62/712,714, filed on Jul. 31, 2018, provisional application No. 62/531,955, filed on Jul. 13, 2017, provisional application No. 62/531,975, filed on Jul. 13, 2017, provisional application No. 62/462,347, filed on Feb. 22, 2017.

(51) Int. Cl.
*G01S 19/48* (2010.01)
*G06Q 99/00* (2006.01)
*G06T 17/05* (2011.01)
*G06T 19/00* (2011.01)

(58) Field of Classification Search
CPC ...... G06T 17/05; G06T 19/006; H04W 4/021; G01W 5/0247
See application file for complete search history.

(56) References Cited

U.S. PATENT DOCUMENTS

| | | |
|---|---|---|
| 5,991,437 A | 11/1999 | Migdal et al. |
| 6,006,021 A | 12/1999 | Tognazzini |
| 6,292,108 B1 | 9/2001 | Straser et al. |
| 6,321,158 B1 | 11/2001 | DeLorme et al. |
| 6,853,958 B1 | 2/2005 | Turin et al. |
| 6,963,282 B1 | 11/2005 | Yeates et al. |
| 7,057,557 B2 | 6/2006 | Lee |
| 7,994,981 B1 | 8/2011 | Farrokhi et al. |
| 8,280,404 B1 | 10/2012 | Roskind |
| 8,731,301 B1 | 5/2014 | Bushman et al. |
| 8,818,758 B1 | 8/2014 | Singh et al. |
| 8,843,350 B2 | 9/2014 | Jacobi et al. |
| 8,862,415 B1 | 10/2014 | Adams |
| 8,965,741 B2 | 2/2015 | McCulloch et al. |
| 8,996,156 B2 | 3/2015 | Melzer-Jokisch et al. |
| 9,008,979 B2 | 4/2015 | Miura |
| 9,037,124 B1 | 5/2015 | Ledet |
| 9,064,219 B2 | 6/2015 | Hall et al. |
| 9,107,043 B2 | 8/2015 | Gupta |
| 9,342,928 B2 | 5/2016 | Rasane et al. |
| 9,529,072 B2 | 12/2016 | Matzner |
| 9,668,106 B2 | 5/2017 | Lin et al. |
| 9,703,517 B2 | 7/2017 | Andolina |
| 9,772,396 B2 | 9/2017 | Liao et al. |
| 9,791,542 B2 | 10/2017 | Ryan et al. |
| 9,792,020 B1 | 10/2017 | Kelley et al. |
| 9,857,162 B1 | 1/2018 | Gum et al. |
| 9,892,559 B2 | 2/2018 | Yoshida et al. |
| 9,934,335 B2 | 4/2018 | Pettersson |
| 9,952,569 B2 | 4/2018 | Brissman |
| 9,973,275 B2 | 5/2018 | Nyarko et al. |
| 10,025,887 B1 | 7/2018 | Santarone et al. |
| 10,042,341 B1 | 8/2018 | Jacob |
| 10,054,914 B2 | 8/2018 | Vartiainen et al. |
| 10,130,285 B1 | 11/2018 | Singamsetty et al. |
| 10,149,141 B1 | 12/2018 | Stamatakis et al. |
| 10,210,353 B1 | 2/2019 | Li et al. |
| 10,222,301 B2 | 3/2019 | Silva et al. |

(56) References Cited

U.S. PATENT DOCUMENTS

| | | | |
|---|---|---|---|
| 10,278,016 B2 | 4/2019 | Bitra et al. | |
| 10,295,647 B1 | 5/2019 | Hulvey | |
| 10,355,351 B2 | 7/2019 | Cummings et al. | |
| 10,444,324 B2 | 10/2019 | Dackefjord et al. | |
| 10,469,984 B1* | 11/2019 | Xin | H04W 4/024 |
| 10,565,731 B1 | 2/2020 | Reddy et al. | |
| 10,775,177 B2 | 9/2020 | Rivers | |
| 10,824,774 B2 | 11/2020 | Santarone et al. | |
| 10,825,247 B1 | 11/2020 | Vincent et al. | |
| 10,872,179 B2 | 12/2020 | Wodrich et al. | |
| 11,080,439 B2 | 8/2021 | Wodrich et al. | |
| 11,087,039 B2 | 8/2021 | Duff et al. | |
| 11,096,025 B1 | 8/2021 | Thompson | |
| 11,100,260 B2 | 8/2021 | Wodrich et al. | |
| 11,194,938 B2 | 12/2021 | Kincart et al. | |
| 11,429,761 B2 | 8/2022 | Wodrich et al. | |
| 11,436,388 B2 | 9/2022 | Santarone et al. | |
| 11,468,209 B2 | 10/2022 | Wodrich et al. | |
| 11,507,714 B2 | 11/2022 | Kincart et al. | |
| 11,640,486 B2 | 5/2023 | Santarone et al. | |
| 11,900,023 B2* | 2/2024 | Wodrich | G02B 27/0093 |
| 2002/0095269 A1 | 7/2002 | Natalini et al. | |
| 2002/0181405 A1 | 12/2002 | Ying | |
| 2003/0080978 A1 | 5/2003 | Navab et al. | |
| 2003/0110001 A1 | 6/2003 | Chassin et al. | |
| 2003/0135324 A1 | 7/2003 | Navab | |
| 2003/0163440 A1 | 8/2003 | Tonack | |
| 2003/0195008 A1 | 10/2003 | Mohi et al. | |
| 2004/0002786 A1 | 1/2004 | Sasaki | |
| 2004/0119662 A1 | 6/2004 | Dempski | |
| 2004/0122628 A1 | 6/2004 | Laurie | |
| 2004/0141173 A1 | 7/2004 | Rekimoto | |
| 2004/0162084 A1 | 8/2004 | Wang | |
| 2005/0165576 A1 | 7/2005 | Jesmonth | |
| 2005/0208951 A1 | 9/2005 | Annunziato et al. | |
| 2005/0275525 A1 | 12/2005 | Ahmed | |
| 2006/0028345 A1 | 2/2006 | Lee | |
| 2006/0084436 A1 | 4/2006 | Green et al. | |
| 2006/0084463 A1 | 4/2006 | Yoo et al. | |
| 2006/0164382 A1 | 7/2006 | Kulas et al. | |
| 2007/0004449 A1 | 1/2007 | Sham | |
| 2007/0266395 A1 | 11/2007 | Lee et al. | |
| 2007/0296571 A1 | 12/2007 | Kolen | |
| 2008/0103835 A1 | 5/2008 | Corcoran et al. | |
| 2008/0180246 A1 | 7/2008 | Malik | |
| 2008/0246734 A1 | 10/2008 | Tsui et al. | |
| 2008/0319654 A1 | 12/2008 | Shintani et al. | |
| 2009/0097710 A1 | 4/2009 | Sroka et al. | |
| 2009/0167919 A1 | 7/2009 | Anttila et al. | |
| 2009/0189810 A1 | 7/2009 | Murray | |
| 2009/0216438 A1 | 8/2009 | Shafer | |
| 2009/0293051 A1 | 11/2009 | Krywaniuk | |
| 2010/0024318 A1 | 2/2010 | Zhang et al. | |
| 2010/0103036 A1 | 4/2010 | Malone et al. | |
| 2010/0107635 A1 | 5/2010 | Tsubone | |
| 2010/0228588 A1 | 9/2010 | Nielsen et al. | |
| 2010/0271263 A1 | 10/2010 | Moshfeghi | |
| 2010/0287485 A1 | 11/2010 | Bertolami et al. | |
| 2010/0296075 A1 | 11/2010 | Hinderling et al. | |
| 2010/0309044 A1 | 12/2010 | Ische et al. | |
| 2011/0047516 A1 | 2/2011 | Pavan et al. | |
| 2011/0068906 A1 | 3/2011 | Shafer et al. | |
| 2011/0075835 A1 | 3/2011 | Hill | |
| 2011/0115816 A1 | 5/2011 | Brackney | |
| 2011/0153101 A1 | 6/2011 | Thomas et al. | |
| 2011/0182202 A1 | 7/2011 | Olofsson et al. | |
| 2011/0199479 A1 | 8/2011 | Waldman | |
| 2011/0251787 A1 | 10/2011 | Gupta et al. | |
| 2011/0264520 A1 | 10/2011 | Puhakka | |
| 2012/0087212 A1 | 4/2012 | Vartanian et al. | |
| 2012/0127306 A1 | 5/2012 | Oh et al. | |
| 2012/0127976 A1 | 5/2012 | Lin et al. | |
| 2012/0173456 A1 | 7/2012 | Hirl | |
| 2012/0188847 A1 | 7/2012 | Miyamoto et al. | |
| 2012/0204646 A1 | 8/2012 | Lee et al. | |
| 2012/0214507 A1 | 8/2012 | Vartanian et al. | |
| 2012/0240077 A1 | 9/2012 | Vaittinen et al. | |
| 2012/0259594 A1 | 10/2012 | Khan et al. | |
| 2012/0296610 A1 | 11/2012 | Hailemariam et al. | |
| 2012/0316930 A1 | 12/2012 | Clemenson | |
| 2013/0010103 A1 | 1/2013 | Ihara et al. | |
| 2013/0033158 A1 | 2/2013 | Schmidt et al. | |
| 2013/0073059 A1 | 3/2013 | Brian et al. | |
| 2013/0084886 A1 | 4/2013 | Crilly, Jr. et al. | |
| 2013/0120630 A1 | 5/2013 | Kim et al. | |
| 2013/0141461 A1 | 6/2013 | Salter et al. | |
| 2013/0143603 A1 | 6/2013 | Diacetis et al. | |
| 2013/0169681 A1 | 7/2013 | Rasane et al. | |
| 2013/0169801 A1 | 7/2013 | Martin et al. | |
| 2013/0197685 A1 | 8/2013 | Matsunaga et al. | |
| 2013/0201311 A1 | 8/2013 | Hirakawa | |
| 2013/0223261 A1 | 8/2013 | Aggarwal et al. | |
| 2013/0278635 A1 | 10/2013 | Maggiore | |
| 2013/0283529 A1 | 10/2013 | Hayes et al. | |
| 2013/0288719 A1 | 10/2013 | Alonzo | |
| 2013/0297555 A1 | 11/2013 | Fadell et al. | |
| 2013/0314398 A1 | 11/2013 | Coates et al. | |
| 2013/0335528 A1 | 12/2013 | Vishwanath et al. | |
| 2013/0345975 A1 | 12/2013 | Vulcano et al. | |
| 2014/0058572 A1 | 2/2014 | Stein et al. | |
| 2014/0084909 A1 | 3/2014 | Pagani | |
| 2014/0107828 A1 | 4/2014 | Zhu et al. | |
| 2014/0129599 A1 | 5/2014 | Boccon-Gibod | |
| 2014/0146038 A1 | 5/2014 | Kangas et al. | |
| 2014/0156455 A1 | 6/2014 | Atwood et al. | |
| 2014/0186049 A1 | 7/2014 | Oshima et al. | |
| 2014/0188394 A1 | 7/2014 | Febonio et al. | |
| 2014/0210856 A1 | 7/2014 | Finn et al. | |
| 2014/0225814 A1 | 8/2014 | English et al. | |
| 2014/0244160 A1 | 8/2014 | Cragun et al. | |
| 2014/0266755 A1 | 9/2014 | Arensmeier et al. | |
| 2014/0267420 A1 | 9/2014 | Schowengerdt et al. | |
| 2014/0274151 A1 | 9/2014 | Pattabiraman et al. | |
| 2014/0277594 A1 | 9/2014 | Nixon et al. | |
| 2014/0278065 A1 | 9/2014 | Ren | |
| 2014/0368373 A1 | 12/2014 | Crain et al. | |
| 2015/0005903 A1 | 1/2015 | Worek et al. | |
| 2015/0012307 A1 | 1/2015 | Moss | |
| 2015/0094081 A1 | 4/2015 | Gupta | |
| 2015/0094865 A1 | 4/2015 | Choi et al. | |
| 2015/0109338 A1 | 4/2015 | Mckinnon et al. | |
| 2015/0116132 A1 | 4/2015 | Nohra et al. | |
| 2015/0121222 A1 | 4/2015 | Lacaze et al. | |
| 2015/0137967 A1 | 5/2015 | Wedig et al. | |
| 2015/0142179 A1 | 5/2015 | Ito et al. | |
| 2015/0154803 A1 | 6/2015 | Meier et al. | |
| 2015/0156423 A1 | 6/2015 | Lundberg | |
| 2015/0168154 A1 | 6/2015 | Boerger | |
| 2015/0177718 A1 | 6/2015 | Vartiainen et al. | |
| 2015/0178633 A1 | 6/2015 | ElBsat et al. | |
| 2015/0192656 A1 | 7/2015 | Werner et al. | |
| 2015/0193982 A1 | 7/2015 | Mihelich et al. | |
| 2015/0206348 A1 | 7/2015 | Koreeda et al. | |
| 2015/0207316 A1 | 7/2015 | Saussele et al. | |
| 2015/0220875 A1 | 8/2015 | Tamaki et al. | |
| 2015/0227123 A1 | 8/2015 | Laycock et al. | |
| 2015/0256963 A1 | 9/2015 | Dahlen | |
| 2015/0262421 A1 | 9/2015 | Bell et al. | |
| 2015/0287318 A1 | 10/2015 | Nair et al. | |
| 2015/0294506 A1 | 10/2015 | Bare et al. | |
| 2015/0302495 A1 | 10/2015 | Stuckman et al. | |
| 2015/0327010 A1 | 11/2015 | Gottschalk et al. | |
| 2015/0347854 A1 | 12/2015 | Bare et al. | |
| 2015/0356786 A1 | 12/2015 | Bare et al. | |
| 2015/0356789 A1 | 12/2015 | Komatsu et al. | |
| 2015/0382145 A1 | 12/2015 | Smith et al. | |
| 2016/0004805 A1 | 1/2016 | Drees et al. | |
| 2016/0019721 A1 | 1/2016 | Bare et al. | |
| 2016/0026253 A1 | 1/2016 | Bradski et al. | |
| 2016/0026729 A1 | 1/2016 | Gil et al. | |
| 2016/0048200 A1 | 2/2016 | Kim et al. | |
| 2016/0054971 A1 | 2/2016 | Yu et al. | |
| 2016/0063671 A1 | 3/2016 | Piippo et al. | |
| 2016/0066068 A1 | 3/2016 | Schultz et al. | |

(56) References Cited

U.S. PATENT DOCUMENTS

| | | |
|---|---|---|
| 2016/0069675 A1 | 3/2016 | Bando et al. |
| 2016/0071196 A1 | 3/2016 | Joshi et al. |
| 2016/0077532 A1 | 3/2016 | Lagerstedt et al. |
| 2016/0084936 A1 | 3/2016 | Smith et al. |
| 2016/0091217 A1 | 3/2016 | Verberkt et al. |
| 2016/0095188 A1 | 3/2016 | Verberkt et al. |
| 2016/0132046 A1 | 5/2016 | Beoughter et al. |
| 2016/0135006 A1 | 5/2016 | Fjeldsoe-Nielsen |
| 2016/0178383 A1 | 6/2016 | Mays et al. |
| 2016/0183057 A1 | 6/2016 | Steiner |
| 2016/0202678 A1 | 7/2016 | Aggarwal et al. |
| 2016/0216879 A1 | 7/2016 | Park et al. |
| 2016/0238692 A1 | 8/2016 | Hill et al. |
| 2016/0258760 A1 | 9/2016 | Beaumont et al. |
| 2016/0284075 A1 | 9/2016 | Phan et al. |
| 2016/0284128 A1 | 9/2016 | Michalscheck et al. |
| 2016/0285416 A1 | 9/2016 | Tiwari et al. |
| 2016/0285644 A1 | 9/2016 | Lu et al. |
| 2016/0298969 A1 | 10/2016 | Glenn, III et al. |
| 2016/0323149 A1 | 11/2016 | Hu et al. |
| 2016/0335731 A1 | 11/2016 | Hall |
| 2016/0343093 A1 | 11/2016 | Riland et al. |
| 2016/0343243 A1 | 11/2016 | Rabb et al. |
| 2016/0345137 A1 | 11/2016 | Ruiz |
| 2016/0356593 A1 | 12/2016 | Huang et al. |
| 2016/0358189 A1 | 12/2016 | Furry et al. |
| 2016/0360429 A1 | 12/2016 | Li et al. |
| 2016/0379083 A1 | 12/2016 | Sala et al. |
| 2017/0006487 A1 | 1/2017 | Baldwin et al. |
| 2017/0023659 A1 | 1/2017 | Bruemmer et al. |
| 2017/0055126 A1 | 2/2017 | O'Keeffe |
| 2017/0079001 A1 | 3/2017 | Lewis |
| 2017/0103577 A1 | 4/2017 | Mendhekar et al. |
| 2017/0115022 A1 | 4/2017 | Grosshart et al. |
| 2017/0131426 A1 | 5/2017 | Sgarz et al. |
| 2017/0169683 A1 | 6/2017 | Ryder |
| 2017/0200312 A1 | 7/2017 | Smith et al. |
| 2017/0212668 A1 | 7/2017 | Shah et al. |
| 2017/0212669 A1 | 7/2017 | Kim et al. |
| 2017/0230930 A1 | 8/2017 | Frey |
| 2017/0234962 A1 | 8/2017 | Yang et al. |
| 2017/0235290 A1 | 8/2017 | Weber et al. |
| 2017/0237892 A1 | 8/2017 | Sakai |
| 2017/0255450 A1 | 9/2017 | Mullins et al. |
| 2017/0270362 A1 | 9/2017 | Barnehama et al. |
| 2017/0286568 A1 | 10/2017 | Dean et al. |
| 2017/0289344 A1 | 10/2017 | Greenberger et al. |
| 2017/0358140 A1 | 12/2017 | Kohler et al. |
| 2017/0363504 A1 | 12/2017 | Winant et al. |
| 2017/0372545 A1 | 12/2017 | Deluca et al. |
| 2017/0374515 A1 | 12/2017 | Cox et al. |
| 2018/0018826 A1 | 1/2018 | Maier et al. |
| 2018/0031618 A1 | 2/2018 | Friedlander et al. |
| 2018/0035263 A1 | 2/2018 | Titus et al. |
| 2018/0048693 A1 | 2/2018 | Gulbinas et al. |
| 2018/0053141 A1 | 2/2018 | Shydo, Jr. et al. |
| 2018/0075168 A1 | 3/2018 | Tiwari et al. |
| 2018/0084623 A1 | 3/2018 | Joppi et al. |
| 2018/0101803 A1 | 4/2018 | Tiwari et al. |
| 2018/0102858 A1 | 4/2018 | Tiwari et al. |
| 2018/0108079 A1 | 4/2018 | Traub |
| 2018/0113506 A1 | 4/2018 | Hall |
| 2018/0121571 A1 | 5/2018 | Tiwari et al. |
| 2018/0130260 A1 | 5/2018 | Schmirler et al. |
| 2018/0131907 A1 | 5/2018 | Schmirler et al. |
| 2018/0159904 A1 | 6/2018 | Hu et al. |
| 2018/0206096 A1 | 7/2018 | Sharma et al. |
| 2018/0211404 A1 | 7/2018 | Zhu et al. |
| 2018/0239313 A1 | 8/2018 | Santarone et al. |
| 2018/0239840 A1 | 8/2018 | Santarone et al. |
| 2018/0242907 A1 | 8/2018 | Bonomi |
| 2018/0253876 A1 | 9/2018 | Lin et al. |
| 2018/0284964 A1* | 10/2018 | Kang .............. H04M 1/0268 |
| 2018/0285482 A1 | 10/2018 | Santos et al. |
| 2018/0295526 A1 | 10/2018 | Wills et al. |
| 2018/0316885 A1 | 11/2018 | Reis et al. |
| 2018/0328753 A1 | 11/2018 | Stenning et al. |
| 2018/0357823 A1 | 12/2018 | Koniki et al. |
| 2018/0357907 A1 | 12/2018 | Reiley et al. |
| 2018/0365495 A1 | 12/2018 | Laycock et al. |
| 2018/0374269 A1 | 12/2018 | Smith |
| 2019/0025905 A1 | 1/2019 | Godina et al. |
| 2019/0033833 A1 | 1/2019 | Acharya et al. |
| 2019/0041972 A1 | 2/2019 | Bae |
| 2019/0043328 A1* | 2/2019 | Thomas .............. G08B 13/2402 |
| 2019/0052638 A1 | 2/2019 | Agarwal et al. |
| 2019/0057169 A1 | 2/2019 | Santarone et al. |
| 2019/0069263 A1 | 2/2019 | Ylamurto et al. |
| 2019/0096232 A1 | 3/2019 | Wedig et al. |
| 2019/0145648 A1 | 5/2019 | Sinha et al. |
| 2019/0156576 A1 | 5/2019 | Ndolo |
| 2019/0162854 A1 | 5/2019 | Plank et al. |
| 2019/0180060 A1 | 6/2019 | Mountz |
| 2019/0188895 A1 | 6/2019 | Miller, IV et al. |
| 2019/0216333 A1 | 7/2019 | Lai et al. |
| 2019/0219662 A1 | 7/2019 | Siessegger et al. |
| 2019/0228370 A1 | 7/2019 | Lien |
| 2019/0268062 A1 | 8/2019 | Josefiak |
| 2019/0281573 A1 | 9/2019 | Tyagi et al. |
| 2019/0294834 A1 | 9/2019 | Mountz |
| 2019/0355177 A1 | 11/2019 | Manickam et al. |
| 2019/0392088 A1 | 12/2019 | Duff et al. |
| 2019/0392640 A1 | 12/2019 | Qian et al. |
| 2020/0053096 A1 | 2/2020 | Bendersky et al. |
| 2020/0057825 A1 | 2/2020 | Motahar |
| 2020/0072538 A1 | 3/2020 | Woolf et al. |
| 2020/0108926 A1 | 4/2020 | Smith et al. |
| 2020/0120772 A1 | 4/2020 | Boring et al. |
| 2020/0151450 A1 | 5/2020 | Hishinuma et al. |
| 2020/0267681 A1 | 8/2020 | Ferrari et al. |
| 2020/0286300 A1 | 9/2020 | Shih |
| 2020/0382212 A1 | 12/2020 | Engelen et al. |
| 2021/0163021 A1 | 6/2021 | Frazzoli et al. |
| 2021/0166473 A1 | 6/2021 | Smith et al. |
| 2021/0243509 A1 | 8/2021 | Jin et al. |
| 2021/0325679 A1 | 10/2021 | Layne |
| 2021/0334863 A1 | 10/2021 | Hirata et al. |
| 2021/0365602 A1 | 11/2021 | Gifford |
| 2022/0066405 A1 | 3/2022 | Harvey |
| 2022/0070820 A1 | 3/2022 | Liu |
| 2022/0167112 A1 | 5/2022 | Loberg et al. |
| 2022/0254481 A1 | 8/2022 | Avisar et al. |
| 2022/0309748 A1 | 9/2022 | Lewis et al. |
| 2022/0329988 A1 | 10/2022 | Zhu et al. |
| 2022/0398082 A1 | 12/2022 | Decrop et al. |
| 2023/0056305 A1 | 2/2023 | Karri et al. |
| 2023/0213941 A1 | 7/2023 | Banerjee et al. |
| 2023/0236280 A1 | 7/2023 | Chen et al. |
| 2023/0267667 A1 | 8/2023 | Brudy et al. |
| 2023/0305565 A1 | 9/2023 | Morris |

FOREIGN PATENT DOCUMENTS

| | | |
|---|---|---|
| EP | 2726817 B1 | 9/2018 |
| GB | 2498177 A | 7/2013 |
| JP | 2008309530 A | 12/2008 |
| KR | 101354688 B1 | 1/2014 |
| WO | 2008124713 A2 | 10/2008 |
| WO | 2011019810 A1 | 2/2011 |
| WO | 2014204753 A1 | 12/2014 |
| WO | 2016130571 A1 | 8/2016 |
| WO | 2016192916 A1 | 12/2016 |
| WO | 2017149526 A2 | 9/2017 |
| WO | 2017223008 A1 | 12/2017 |

OTHER PUBLICATIONS

ASCE 2014 Report Card of Montana's Infrastructure, accessed at https://www.infrastructurereportcard.org/wp-contentluploads/2014/11/2014-Report-Card-for-Montanas-Infrastructure.pdf (Year: 2014).

Aukstakalnis, Steve. Practical augmented reality: A guide to the technologies, applications, and human factors for AR and VR. Addison-Wesley Professional, 2016. (Year: 2016).

(56) References Cited

OTHER PUBLICATIONS

Azeez et al., "Wireless Indoor Localization Systems and Techniques: Survey and Comparative Study" Indonesian Journal of Electrical Engineering and Computer Science, vol. 3, No. 2, Aug. 2016, pp. 392-409 (Year: 2016).

Brainergiser, "Large holographic projector—a real use case". Sep. 19, 2015, https://www.youtube.com/watch?v=JwnS-EKTW2A&feature=youtu.be.

Carmelo Scuro et al., IoT for Structural Health Monitoring, Dec. 2018, IEEE Instrumentation & Measurement Magazine, pp. 4-14.

Dong et ai, "Evaluation of the Reliability of RSSI for Indoor localization", 2012, pp. 6. downloaded from the internet https://ieeexplore.ieee.org/document16402492 (Year: 2012).

Edwards, Luke, "Holograms are finally here: Plasma lasers used to create images in mid-air." Pocket-Lint.com, Nov. 5, 2014, https://www.pocket-lint.com/gadgets/news/131622-holograms-are-finally-here-plasma-lasers-used-to-create-images-in-mid-air.

Extended European Search Report issued Jun. 23, 2023 in correlated application, EP20837285.

Gifford, Matthew, "Indoor Positioning with Ultrasonic/Ultrasound", Oct. 19, 2018, 7 pages, https://www.leverege.com/blogpost/ultrasonic-indoor-positioning.

Hexamite, "HX19V2 RFID Ultrasonic Positioning System", 1999, https://www.hexamite.com/hx19.htm.

Hu. Wi-Fi Based Indoor Positioning System Using Smartphones. Nov. 2013. [retrieved on Apr. 23, 2018]. Retrieved [from the Internet: (91 pages total).

International Search Report and Written Opinion mailed Feb. 6, 2020 issued in connection with corresponding [International Application No. PCT/US2018/019185 (9 pages total).

International Search Report and Written Opinion mailed Feb. 10, 2020 issued in connection with corresponding [International Application No. PCT/US2018/019154 (9 pages total).

International Search Report and Written Opinion mailed May 14, 2018 issued in connection with corresponding International Application No. PCT/US2018/019154 (10 pages total).

International Search Report and Written Opinion mailed May 7, 2018 issued in connection with corresponding [International Application No. PCT/US2018/019185 (7 pages total).

Khemapech et al., Bridge Structural Monitoring and Warning System Aplication in Thailand—Experiences Learned, 2017, TRON Forum ISBN 978-4-89362-330-0, pp. 1-8.

Kyle, "Property Management" Dearborn Real Estate, 2000—Business & Economics, pp. 40-41.

Liu et al. "A Hybrid Smartphone Indoor Positioning Solution for Mobile LBS" Sensors 2012, issue 12, pp. 17208-17233 (Year: 2012).

Liu, "Survey of Wireless Based Indoor Localization Technologies" accessed at http://www.cse.wustl.edu/-jain/cse574-14/ftp/indoor/index.html, May 5, 2014, 17 pg printout (Year: 2014).

Mordue, Stefan, Paul Swaddle, and David Philp. Building information modeling for dummies. John Wiley & Sons, 2015. (Year: 2015).

Qi, J.; Liu, G.-P. A Robust High-Accuracy Ultrasound Indoor Positioning System Based on a Wireless Sensor Network. Sensors 2017, 17, 2554.

Suermann, Patrick C. Evaluating the impact of building information modeling (BIM) on construction. Florida Univ GainesvilleGraduate School, 2009. (Year: 2009).

Thomson, C. P. H. From Point Cloud to Building Information Model: Capturing and Processing Survey Data Towards Automation forHigh Quality 3D Models to Aid a BIM Process. Diss. UCL (University College London), 2016. (Year: 2016).

Wang et al. A wireless structural health monitoring system with multithreaded sensing devices: design and validation. • In: Structure and Infrastructure Engineering. Feb. 16, 2007 (Feb. 16, 2007) Retrieved on Jul. 21, 2019 (Jul. 21, 2019) from entire document.

Wang et al. Performance Evaluation of Automatically Generated BIM from Laser Scanner Data for Sustainability Analyses. 2015. [retrieved on Apr. 23, 2018]. Retrieved from the Internet: . (8 pages total).

Wang, Siqi, Jinsheng Du, and Jianyong Song. "A Framework of BIM-Based Bridge Health Monitoring System." 2016 InternationalConference on Civil, Transportation and Environment. Atlantis Press, 2016. (Year: 2016).

Wikipedia article "Building Information Modeling", archive data Jan. 15, 2016 on the Wayback machine (Year: 2016).

Yang et al, "Wi Fi-Based Indoor Positioning", 2015, pp. 150-157 downloaded from the internet I EEE.com databases. (Year: 2015).

Zhihua Wang et al., A Review of Wearable Technologies for Elderly Care that Can Accurately Track Indoor Position, Recognize Physical Activities and Monitor Vital Signs in Real Time, Feb. 10, 2017, Sensors (Basel), 17(2), 341, p. 1-36; doi: 10.3390/s 17020341 (Year: 2017).

Zou et al., "SmartScanner: Know More in Walls with Your Smartphone!" IEEE Transactions on Mobile Computing, vol. 15, No. 11, Nov. 2016, pp. 2865-2877 (Year: 2016).

Wikipedia, "triangulation," 2024, p. 3, downloaded from https://en.wikipedia.org/wiki/Triangulation#:%60:text=In%20trigonometry%20and%20geometry%2C%20triangulation,station%20signed%20by%20iton%20rod(Year: 2024).

* cited by examiner

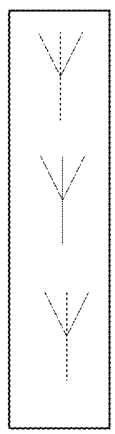
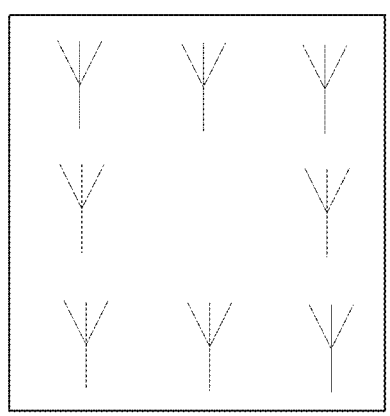
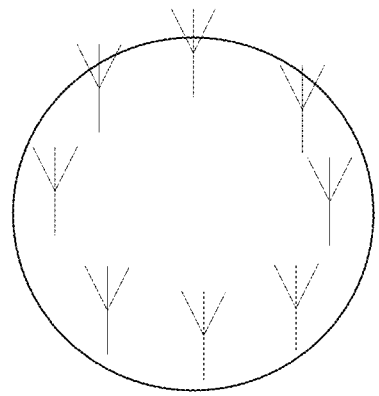
FIG. 4A    FIG. 4B    FIG. 4C
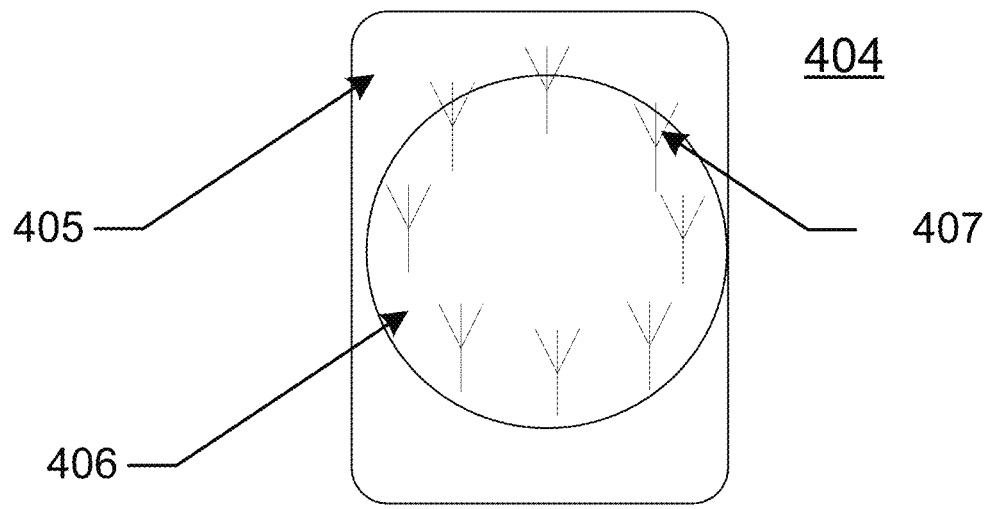
FIG. 4D

```
┌─────────────────────────────────────────────────────────────────┐
│ RECEIVE WIRELESS ENERGY OF A FIRST WAVELENGTH INTO A WIRELESS RECEIVER │
│                                                            1001 │
└─────────────────────────────────────────────────────────────────┘
                                │
┌─────────────────────────────────────────────────────────────────┐
│ GENERATE A PATTERN OF DIGITAL VALUES BASED UPON RECEIPT OF WIRELESS │
│               ENERGY INTO THE WIRELESS RECEIVER                 │
│                                                            1002 │
└─────────────────────────────────────────────────────────────────┘
                                │
┌─────────────────────────────────────────────────────────────────┐
│ OPTIONALLY RECEIVE THE WIRELESS ENERGY FROM THE RECEIVER AS AN ANALOG │
│                             SIGNAL                         1003 │
└─────────────────────────────────────────────────────────────────┘
                                │
┌─────────────────────────────────────────────────────────────────┐
│ COORDINATES REPRESENTATIVE OF A WIRELESS NODE MAY BE DETERMINED │
│                   RELATIVE TO A BASE NODE                       │
│                                                            1004 │
└─────────────────────────────────────────────────────────────────┘
                                │
┌─────────────────────────────────────────────────────────────────┐
│ DETERMINE THE POSITION OF THE BASE NODE RELATIVE TO THE DEFINED PHYSICAL │
│                              AREA                          1005 │
└─────────────────────────────────────────────────────────────────┘
                                │
┌─────────────────────────────────────────────────────────────────┐
│ GENERATE A TARGET AREA WITHIN A CONTROLLER OF THE SMART DEVICE  │
│                                                            1006 │
└─────────────────────────────────────────────────────────────────┘
                                │
┌─────────────────────────────────────────────────────────────────┐
│ RESPECTIVE POSITIONS OF ONE OR MORE WIRELESS NODES WITHIN THE TARGET │
│                     AREA ARE DETERMINED                         │
│                                                            1007 │
└─────────────────────────────────────────────────────────────────┘
                                │
┌─────────────────────────────────────────────────────────────────┐
│ A USER INTERFACE MAY BE GENERATED ON THE SMART DEVICE BASED UPON THE │
│         PATTERN OF DIGITAL VALUES GENERATED AT STEP 1002        │
│                                                            1008 │
└─────────────────────────────────────────────────────────────────┘
                                │
┌─────────────────────────────────────────────────────────────────┐
│            ICON IS GENERATED IN THE USER INTERFACE              │
│                                                            1009 │
└─────────────────────────────────────────────────────────────────┘
                                │
                                ▼
```

FIG. 10A

AGENT SUPPORTABLE DEVICE INDICATING AN ITEM OF INTEREST IN A WIRELESS COMMUNICATION AREA

INCORPORATION BY REFERENCE TO RELATED APPLICATIONS

This application makes priority claims in the Application Data Sheet. The entire contents of the priority claimed documents are hereby incorporated by reference. This application references the Non-Provisional U.S. patent application Ser. No. 18/123,294, filed Mar. 19, 2023, and entitled METHOD AND APPARATUS FOR ASSOCIATING DIGITAL CONTENT WITH WIRELESS TRANSMISSION NODES IN A WIRELESS COMMUNICATION AREA. This application references the Non-Provisional U.S. patent application Ser. No. 17/835,899, filed Jun. 8, 2022, and entitled METHOD AND APPARATUS FOR AUGMENTED REALITY DISPLAY OF DIGITAL CONTENT ASSOCIATED WITH A LOCATION. This application references the Non-Provisional U.S. patent application Ser. No. 17/410,526, filed Aug. 24, 2021, and entitled METHOD AND APPARATUS FOR DISPLAY OF DIGITAL CONTENT ASSOCIATED WITH A LOCATION IN A WIRELESS COMMUNICATIONS AREA. This application references the Non Provisional U.S. patent application Ser. No. 16/951,550, filed Nov. 18, 2020 and entitled METHOD AND APPARATUS FOR INTERACTING WITH A TAG IN A WIRELESS COMMUNICATION AREA; Non Provisional U.S. patent application Ser. No. 16/900,753, filed Jun. 12, 2020, entitled METHOD AND APPARATUS FOR AUTOMATED SITE AUGMENTATION, and to Non Provisional U.S. patent application Ser. No. 16/504,919, filed Jul. 8, 2019 and entitled METHOD AND APPARATUS FOR POSITION BASED QUERY WITH AUGMENTED REALITY HEADGEAR, the entire contents of which are hereby incorporated by reference. This application references the Non-Provisional patent application Ser. No. 16/688,775, filed Nov. 19, 2019, and entitled METHOD AND APPARATUS FOR WIRELESS DETERMINATION OF POSITION AND ORIENTATION OF A SMART DEVICE the entire contents of which are hereby incorporated by reference. This application references the Non-Provisional patent application Ser. No. 16/503,878, filed Jul. 5, 2019, and entitled METHOD AND APPARATUS FOR ENHANCED AUTOMATED WIRELESS ORIENTEERING, the entire contents of which are hereby incorporated by reference. This application references the Non-Provisional patent application Ser. No. 16/297,383, filed Mar. 8, 2019, and entitled SYSTEM FOR CONDUCTING A SERVICE CALL WITH ORIENTEERING, the entire contents of which are hereby incorporated by reference. This application references the Non-Provisional patent application Ser. No. 16/249,574, filed Jan. 16, 2019, and entitled ORIENTEERING SYSTEM FOR RESPONDING TO AN EMERGENCY IN A STRUCTURE, the entire contents of which are hereby incorporated by reference. This application references the Non-Provisional patent application Ser. No. 16/176,002, filed Oct. 31, 2018, and entitled SYSTEM FOR CONDUCTING A SERVICE CALL WITH ORIENTEERING, the entire contents of which are hereby incorporated by reference. This application references the Non-Provisional patent application Ser. No. 16/171,593, filed Oct. 26, 2018, and entitled SYSTEM FOR HIERARCHICAL ACTIONS BASED UPON MONITORED BUILDING CONDITIONS, the entire contents of which are hereby incorporated by reference. This application references the Non-Provisional patent application Ser. No. 16/165,517, filed Oct. 19, 2018, and entitled BUILDING VITAL CONDITIONS MONITORING, the entire contents of which are hereby incorporated by reference. This application references the Non-Provisional patent application Ser. No. 16/161,823, filed Oct. 16, 2018, and entitled BUILDING MODEL WITH CAPTURE OF AS BUILT FEATURES AND EXPERIENTIAL DATA, the entire contents of which are hereby incorporated by reference. This application references the Non-Provisional patent application Ser. No. 16/142,275, filed Sep. 26, 2018, and entitled METHODS AND APPARATUS FOR ORIENTEERING, the entire contents of which are hereby incorporated by reference. This application references the Non-Provisional patent application Ser. No. 15/887,637, filed Feb. 2, 2018, and entitled BUILDING MODEL WITH CAPTURE OF AS BUILT FEATURES AND EXPERIENTIAL DATA, the entire contents of which are hereby incorporated by reference. This application references the Non-Provisional patent application Ser. No. 15/716,133, filed Sep. 26, 2017, and entitled BUILDING MODEL WITH VIRTUAL CAPTURE OF AS BUILT FEATURES AND OBJECTIVE PERFORMANCE TRACKING, the entire contents of which are hereby incorporated by reference. This application references the Non-Provisional patent application Ser. No. 15/703,310, filed Sep. 13, 2017, and entitled BUILDING MODEL WITH VIRTUAL CAPTURE OF AS BUILT FEATURES AND OBJECTIVE PERFORMANCE TRACKING, the entire contents of which are hereby incorporated by reference. This application references the Non-Provisional patent application Ser. No. 16/528,104, filed Jul. 31, 2019, and entitled SMART CONSTRUCTION WITH AUTOMATED DETECTION OF ADVERSE STRUCTURE CONDITIONS AND REMEDIATION, the entire contents of which are hereby incorporated by reference. This application references the Non-Provisional U.S. patent application Ser. No. 16/657,660, filed Oct. 18, 2019, and entitled METHOD AND APPARATUS FOR CONSTRUCTION AND OPERATION OF CONNECTED INFRASTRUCTURE, the entire contents of which are hereby incorporated by reference. This application references the Non-Provisional U.S. patent application Ser. No. 16/721,906, filed Dec. 19, 2019, and entitled METHOD AND APPARATUS FOR WIRELESS DETERMINATION OF POSITION AND ORIENTATION OF A SMART DEVICE, the entire contents of which are hereby incorporated by reference. This application references the Non-Provisional patent application Ser. No. 16/549,503, filed Aug. 23, 2019, and entitled METHOD AND APPARATUS FOR AUGMENTED VIRTUAL MODELS AND ORIENTEERING, the entire contents of which are hereby incorporated by reference. This application references the Non-Provisional patent application Ser. No. 16/775,223, filed Jan. 28, 2020, and entitled SPATIAL SELF-VERIFYING ARRAY OF NODES, the entire contents of which are hereby incorporated by reference. This application references the Non-Provisional patent application Ser. No. 16/817,926, filed Mar. 13, 2020, and entitled APPARATUS FOR OPERATION OF CONNECTED INFRASTRUCTURE, the entire contents of which are hereby incorporated by reference. This application references the Non-Provisional patent application Ser. No. 16/597,271, filed Oct. 9, 2019, and entitled BUILDING MODEL WITH CAPTURE OF AS BUILT FEATURES AND EXPERIENTIAL DATA, the entire contents of which are hereby incorporated by reference. This application references the Provisional Patent Application Ser. No. 62/531,955, filed Jul. 13, 2017, and entitled BUILDING MODELING WITH VIRTUAL CAP- TURE OF AS BUILT FEATURES, the entire contents of which are hereby incorporated by reference. This application references the Provisional Patent Application Ser. No. 62/531,975, filed Jul. 13, 2017, and entitled BUILDING MAINTENANCE AND UPDATES WITH VIRTUAL CAPTURE OF AS BUILT FEATURES, the entire contents of which are hereby incorporated by reference. This application references the Provisional Patent Application Ser. No. 62/462,347, filed Feb. 22, 2017, and entitled VIRTUAL DESIGN, MODELLING AND OPERATIONAL MONITORING SYSTEM, the entire contents of which are hereby incorporated by reference. This application references the Provisional Patent Application Ser. No. 62/909,061 filed Oct. 1, 2019, and entitled METHOD AND APPARATUS FOR HOLOGRAPHIC DISPLAY SYSTEMS, the entire contents of which are hereby incorporated by reference. This application references the Provisional Patent Application Ser. No. 62/712,714 filed Jul. 31, 2018, and entitled BUILDING MODEL WITH AUTOMATED WOOD DESTROYING ORGANISM DETECTION AND MODELING, the entire contents of which are hereby incorporated by reference. This application references the Provisional Patent Application Ser. No. 62/769,133 filed Nov. 19, 2018, and entitled METHODS AND APPARATUS FOR ORIENTEERING, the entire contents of which are hereby incorporated by reference. This application references the Provisional Patent Application Ser. No. 62/871,499 filed Jul. 8, 2019, and entitled METHOD AND APPARATUS FOR CONSTRUCTION AND OPERATION OF A SMART STRUCTURE, the entire contents of which are hereby incorporated by reference. This application references the Provisional Patent Application Ser. No. 62/793,714 filed Jan. 1, 2019, and entitled METHOD AND APPARATUS FOR ORIENTEERING WITH AUGMENTED REALITY HEADGEAR, the entire contents of which are hereby incorporated by reference. The entire contents of all the matters heretofore referenced are hereby incorporated by reference.

FIELD OF THE INVENTION

The present invention relates to augmentation of a physical local environment. More specifically, the present invention joins a physical area with digital content and virtual capabilities. The virtual capabilities allow for tracking of items and/or people in real time and also memorializes content that may be presented to a user at any time subsequent to the memorialization.

BACKGROUND OF THE INVENTION

The use of smart devices has become a daily part of life for many people. A smart device may be used as a communication tool and to receive information. Communication is generally on a point-to-point basis, and sometimes on a point-to-many-points basis. Information dissemination to unknown recipients, or to recipients that are not ascertainable at a time of generation of the information, requires posting, or storing of the information in a centralized server where the information may be retrieved using traditional queries and search engines, such as Google or social media.

However, it is difficult, if not impossible to automatically receive information pertinent to a designated area. And it is especially difficult to receive information related to a subject area when a user does not know what to ask for, or what type of information may be available to the user.

SUMMARY OF THE INVENTION

Accordingly, the present invention combines methods and apparatus for providing content to a user based upon a geospatial position of the user and a direction of interest provided by the user. Based upon who the user is, where the user is, and which direction the user is looking, the present invention will provide an interactive user interface that combines quantification of an immediate environment with virtual content. Simply by directing a Smart Device towards an area, the present invention is able to generate a virtual environment that combines a rendition of the physical environment with location specific information.

For example, a Node may be co-located with a sensor and wirelessly provide coordinates indicating where the sensor is located. The sensor quantifies a condition at a specific location. When a user views the physical area containing the sensor with the Smart Device, the Smart Device displays a rendition of the area with the sensor location and the conditions measured by the sensor.

Essentially, the present invention enables point and query (or ask and query) access to information or other content close to a Smart Device. The Smart Device may be used to generate an interface indicating what people, equipment, vehicles, or other items are viewable to the Smart Device and place those items into the context of the environment surrounding the Smart Device.

This functionality is accomplished by establishing a target area and determining which tags are present within the target area. Tags may be virtual; in which case the virtual tags are associated with positional coordinates and viewable whenever a target area is designated to encompass the coordinates the virtual tag.

Alternatively, the tags may be physical, such as a small disk adhered to an item of equipment, vehicle, or a person's employee badge. Tracking of a position and content associated with a physical tag may be updated in real time or on a periodic basis. Physical tags may be moved into a target area, or the target area may be moved to encompass the physical tag. The present invention will automatically generate an interface indicating which tags are contained in the interface, what those tags are associated with, and where a tag is in relation to the Smart Device. It will also access any information that has been stored and associated with the tag and present it on the Smart Device.

By aligning real world and virtual world content, a real-world site experience is enriched with content from a geospatially linked virtual world. The virtual world content is made available to an Agent based upon a position and a direction of a Radio Target Area ("RTA") specified by a Smart Device supported by the Agent. A geospatial position and direction of interest that is contained within the RTA is generated using wireless communication with reference point transmitters. Wireless communication capabilities of the Reference Point Transmitters determine parameters associated with a Wireless Communication Area ("WCA"). The RTA is a subset of the WCA.

The present invention provides for methods and apparatus for executing methods that augment a physical area, such as an area designated as a wireless communication area. The method may include the steps of transceiving a wireless communication between a Smart Device and multiple reference Position Transceivers fixedly located at a position within a wireless communication area; generating positional coordinates for the Smart Device based upon the wireless communication between the Smart Device and the multiple reference transceivers; establishing a radio target area for an energy receiving sensor; receiving energy into the energy receiving sensor from the radio target area; generating a digital representation of the energy received into the energy receiving sensor at an instance in time; generating positional coordinates for a tag at the instance in time, the tag comprising digital content and access rights to the digital content; determining the tag is located within the radio target area based upon the positional coordinates for the tag; generating a user interactive interface comprising static portions based upon the digital representation of the energy received into the energy receiving sensor; generating a dynamic portion of the user interactive interface based upon the positional coordinates for the tag and the positional coordinates for the Smart Device; receiving a user input into the dynamic portion of the user interactive interface; and based upon the user input received into the dynamic portion of the user interactive interface, including the digital content in the user interactive interface.

In some embodiments, multiple disparate energy levels may be received into the energy receiving sensor at the instance in time, each disparate energy level received from a different geospatial location; associating positional coordinates with the disparate energy levels; and indicating the disparate energy levels and relative positions of the disparate energy levels in the user interactive interface. A tag may include a virtual tag with the digital content and a location identified via positional coordinates.

In another aspect, a physical tag may include a transceiver capable of wireless communication with the multiple reference transceivers and the method may include transceiving a wireless communication between a tag and multiple reference Position Transceivers; and generating positional coordinates for the tag based upon the wireless communication between the tag and the multiple reference transceivers. The wireless communication between the Smart Device and the multiple reference Position Transceivers may be accomplished by transceiving using an Ultra Wideband modality; Bluetooth modality, or other wireless modality, such as WiFi.

A wireless communication area may be identified as including a radio transmission area of the energy receiving sensor and the wireless communication area may be based upon a communication distance of the Ultra Wideband modality in an area encompassing the energy receiving sensor.

Transceiving a wireless communication between a tag and multiple reference Position Transceivers may be accomplished using wireless modality such as, for example, a UWB or Bluetooth modality; and generating positional coordinates for the tag based upon the wireless communication between the tag and the multiple reference transceivers may be accomplished using the same modalities. Positional coordinates may include one or more of: Cartesian Coordinates, an angle of arrival and an angle of departure and a distance.

In another aspect, access rights to tag content may be required and based upon an identifier of the Smart Device or a user operating the Smart Device. A dynamic portion of the user interactive interface may include an icon indicative of the digital content associated with the tag.

The details of one or more examples of the invention are set forth in the accompanying drawings and the description below. The accompanying drawings that are incorporated in and constitute a part of this specification illustrate several examples of the invention and, together with the description, serve to explain the principles of the invention: other features, objects, and advantages of the invention will be apparent from the description, drawings, and claims herein.

In some examples, the present invention provides for a self-verifying array of Nodes (sometimes referred to herein as "SVAN") that verifies positions of respective Nodes included in the array.

DESCRIPTION OF THE DRAWINGS

The accompanying drawings, which are incorporated in and constitute a part of this specification, illustrate several embodiments of the invention and, together with the description, serve to explain the principles of the invention:

FIGS. 4A-4D illustrate exemplary configurations of antenna arrays.

FIGS. 10A-10B illustrate an exemplary method for generating an augmented-reality Radio Target Area for a Smart Device.

DETAILED DESCRIPTION

Figure 1:
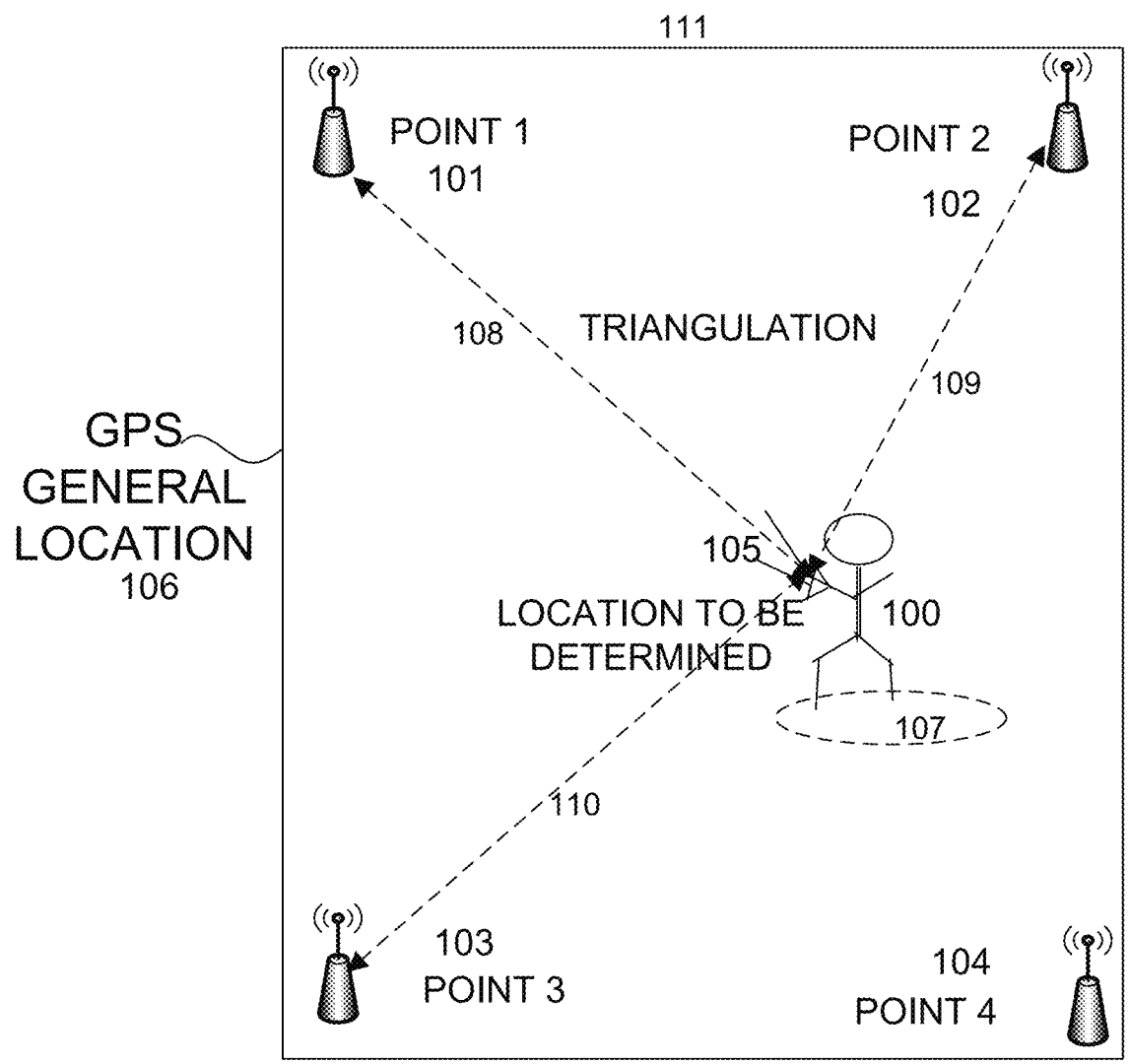
FIG. 1 illustrates location determination with wireless communication to reference points.

The present invention relates to methods and apparatus for determining the existence of and displaying real-world and aligned virtual-world content.

In the following sections, detailed descriptions of examples and methods of the invention will be given. The description of both preferred and alternative examples though thorough are exemplary only, and it is understood that, to those skilled in the art, variations, modifications, and alterations may be apparent. It is therefore to be understood that the examples do not limit the broadness of the aspects of the underlying invention as defined by the claims.

In some embodiments, the location of a Node may be determined via discernment of a physical artifact, such as, for example a visually discernable feature, shape, or printed aspect. A pattern on a surface may convey a reference point by a suitable shape, such as a cross, Vernier, or box structure as non-limiting examples. The printing may also include identification information, bar codes, or lists of location coordinates directly. A Smart Device ascertaining a physical reference mark and a distance of the Smart Device to the mark may determine a relative location in space to a coordinate system of the marks.

Marks tied to a geospatial coordinate system may be utilized to determine a relative location. A number of methods may be executed to determine a distance from the Smart Device to a mark such as, for example, a sensed reflection of light beams (preferably laser beams), electromagnetic beams of wavelength outside of the visible band such as IR, UV, radio and the like, or sound-based emanations. It may be important that the means of determining the distance can be focused into a relatively small size. It may be important that the means of determining the distance is reflected by the physical mark. For example, a light-source means of determining the distance may benefit from a mirror surface upon the physical mark, and it may be important that the reflected signal emerges significantly towards the user. It may be desirable that the physical reference points are placed with high accuracy at specific reference locations, or it may be desirable to be able to measure with high accuracy the specific reference locations after placement.

In some examples, a carefully placed reference point Node may function as a transceiver of signals. For example, a Node may receive and transmit signals in a radio frequency band of the electromagnetic spectrum. In a simple form, a Node may detect an incoming signal and broadcast a radio frequency wireless communication. Frequencies utilized for wireless communication may include those within the electromagnetic spectrum radio frequencies used in UWB, Wi-Fi, and Bluetooth modalities, as well as IR, visible and UV light as examples.

In some embodiments, sound emanations may also be used as a communication mechanism between a Smart Device and a reference point Node. In some examples, the Nodes may function to communicate data with their electromagnetic or sonic transmissions. Such communications may provide identifying information unique to the Node, data related to the synchronization of timing at different well-located reference points and may also function as general data communication Nodes. A triangulation calculation of the position of a Smart Device or a Node may result from a system of multiple reference position Nodes communicating timing signals to or from the Smart Device or Node. Methods of calculating positions via wireless communications may include one or more of: RTT, RSSI, AoD, AoA, timing signal differential, and the like. Triangulation or other mathematical techniques may also be employed in determining a location.

The process of determination of a position based upon triangulation with the reference points may be accomplished, for example via executable software interacting with the controller in a Smart Device, such as, for example via running an app on the Smart Device.

Reference points may be coded via identifiers, such as a UUID (Universally Unique Identifier), or other identification vehicles.

Referring now to FIG. 1, aspects of a system for enhanced wireless position and orientation are illustrated. Reference Position Transceivers 101-104 are shown deployed within or proximate to a Structure or Defined Area 106, to determine a Location 107 of an Agent Supported Transceiver 105 supported an Agent 100 within or proximate to the Structure or Defined Area 106. Reference Position Transceivers 101-104 may be fixed in a certain location within or proximate to the Structure or Defined Area 106 and define a Wireless Communication Area 111. The Reference Position Transceivers 101-104 may transceive in a manner suitable for determination of a position of one or more Agent Supported Transceiver 105 supported by an Agent 100, such as, for example, an Agent Supported Transceiver 105 in or associated with a Smart Device, Headgear, or Tag supported by the Agent 100. Transceiving may be conducted via one or more wireless transmission modalities between an Agent Supported Transceiver 105 supported by the Agent 100 and one or more Reference Position Transceivers 101-104.

By way of non-limiting example, Agent Supported Transceiver 105 supported by the Agent 100 may be included in, and/or be in logical communication with, a Smart Device, such as a smart phone, tablet, headgear, ring, watch, wand, pointer, badge, Tag, Node or other Agent Supportable Device with Agent Supported Transceiver 105 able to transceive with the Reference Position Transceivers 101-104.

The Reference Position Transceivers 101-104 may include devices, such as, for example, a radio transmitter, radio receiver, a light generator, a light receiver, or a pattern recognizing device. A radio frequency transceiver may be operative to communicate via wireless modalities such as, for example: Wi-Fi, Bluetooth, Ultra-wideband ("UWB"), ultrasonic, infrared, or other communication modality capable of logical communication between Reference Position Transceivers 101-104 and Agent Supported Transceiver 105.

In some embodiments, a Reference Position Transceivers 101-104 may include a multi-modality transceiver, that communicates more locally via a first modality, such as UWB, Bluetooth, Wi-Fi, ANT, Zigbee, BLE, Z Wave, 6LoWPAN, Thread, Wi-Fi, Wi-Fi-ah, NFC (near field communications), Dash 7, Wireless HART or similar modality and to a greater distance via a second modality, such as cellular communication modalities (e.g. 3G, 4G 5G and the like), sub GHz, IP modalities and the like which may provide access to a distributed network, such as the Internet.

Wireless communications between Reference Position Transceivers 101-104 and Agent Supported Transceiver 105 may engage in logical communications to provide data capable of generating one or more of: Cartesian coordinates, polar coordinates, vector values, AoA, AoD, RTT, RSS, a GPS position, or other data that may be utilized for one or more of: locating one or both of an Agent 100; indicating a direction of interest; and identify a Structure or Defined Area 106.

A precise location may be determined via triangulation based upon a measured distance from three or more Reference Position Transceivers 101-104. For example, a radio transmission or light signal may be measured and compared from the three Reference Position Transceivers 101-103. Other embodiments may include a device recognizable via image analysis and a sensor or other Image Capture Device, such as a CCD device, may capture an image of three or more Reference Position Transceivers 101-104. Image analysis may recognize the identification of each of three or more of the Reference Position Transceivers 101-104 and a size ratio of the respective image captured Reference Position Transceivers 101-104 may be utilized to calculate a precise position. Similarly, a height designation may be made via triangulation using the position identifiers as reference to a known height or a reference height.

Transceivers 101-105 may include circuitry and logic capable of transceiving in a single modality, or multiple disparate modalities. Similarly, a Reference Position Transceivers 101-104 and/or an Agent Supported Transceiver 105 may include multiple transceiver devices, including, transmitters and receivers.

A modality, as used in conjunction with a Transceiver, transmitter, and/or receiver refers to one or both of a bandwidth of wireless communication and a protocol associated with a bandwidth. By way of non-limiting example, a modality, as used in relation to a Transceiver, transmitter, and/or receiver may include: Wi-Fi; Wi-Fi RTT; Bluetooth; UWB; Ultrasonic, sonic, infrared; ANT, Zigbee, BLE, Z Wave, 6LoWPAN, Thread, Wi-Fi, Wi-Fi 33-ah, NFC (near field communications), sub-GHz, Dash 7, Wireless HART, or other logical communication medium.

Triangulation essentially includes determining an intersection of three Distances 108-110, each Distance 108-110 calculated from a Reference Position Transceivers 101-104 to an Agent Supported Transceiver 105. The present invention allows for a First Distance 108, to be determined based upon a wireless communication in a first modality; and a Second Distance 109 and a Third Distance 110 to be determined based upon a wireless communication in a same or different modality as the first modality. For example, a First Distance 108 may be determined based upon a wireless communication using UWB; a Second Distance 109 may be determined based upon a wireless communication using Bluetooth; and a Third Distance may be determined based upon a wireless communication using ultrasonic communication (other combinations of same and/or different communication modalities are also within the scope of the present invention).

A Location 107 may be determined via triangulation based upon a measured distance from three or more Reference Position Transceivers 101-103 to the Agent Supported Transceiver 105 supported by the Agent 100. For example, timing associated with a radio transmission or light signal may be measured and compared from the three Reference Position Transceivers 101-103. Other embodiments may include a device recognizable via image analysis and a sensor or other Image Capture Device, such as a CCD device, may capture an image of three or more Reference Position Transceivers 101-104.

Additional embodiments may include image analysis of image data captured via a CCD included in a Smart Device to recognize the identification of each of three or more of the Reference Position Transceivers 101-104 and a size ratio of the respective image captured Reference Position Transceivers 101-104 may be utilized to calculate a precise position. Similarly, a height designation may be made via triangulation using the position identifiers as reference to a known height or a reference height. In a similar fashion, triangulation may be utilized to determine a relative elevation of the Smart Device as compared to a reference elevation of the reference points.

In some embodiments, the Location 107 of the Agent Supported Transceiver 105 may be ascertained via one or more of: triangulation; trilateration; and multilateration (MLT) techniques.

In some embodiments, a geospatial location based upon triangulation may be generated based upon a controller receiving a measurement of angles between the position and known points at either end of a fixed baseline. By way of non-limiting example, a point of a geospatial location may be determined based upon generation of a triangle with one known side and two known angles. Moreover, a geospatial location based upon multilateration may be generated based on a controller receiving measurement of a difference in distance to two reference positions, each reference position being associated with a known location. Wireless signals may be available at one or more of: periodically, within determined timespans and continually. The determination of the difference in distance between two reference positions provides multiple potential locations at the determined distance. A controller may be used to generate a plot of potential locations. In some embodiments, the potential determinations generally form a curve. Specific embodiments will generate a hyperbolic curve.

The controller may be programmed to execute code to locate a relatively exact position along a generated curve, which is used to generate a geospatial location. The multilateration system thereby receives as input multiple measurements of distance to reference points, wherein a second measurement taken to a second set of stations (which may include one station of a first set of stations) is used to generate a second curve. A point of intersection of the first curve and the second curve may be used to indicate a specific location.

In another aspect, in some embodiments, the location of a Transceiver 101-105 may be determined and/or aided via discernment of data based upon a physical artifact, such as, for example a visually discernable feature, shape, or printed aspect located within a Structure or Defined Area 106. Discernment of the physical artifact may for example, be based upon topographical renditions of physical aspects included in the Structure, such as those measured using LIDAR, a magnetic force, image data (or a point cloud derived from image data). A pattern on a surface may convey a reference point by a recognizable pattern (which may be unique to the setting), Vernier or three-dimensional structure as non-limiting examples. A Smart Device ascertaining a physical reference mark and a distance of the Smart Device to the mark may determine a relative location in space to a coordinate system of the marks.

Marks tied to a geospatial coordinate system may be utilized to determine a relative location. A number of methods may be executed to determine a distance from the Smart Device to a mark such as, for example, a sense reflection of light beams (preferably laser beams), electromagnetic beams of wavelength outside of the visible band such as IR, UV, Radio and the like, or sound-based emanations.

In some examples, a carefully placed reference point Node may function as a transceiver of signals. For example, a Node may receive and transmit signals in a radio frequency band of the electromagnetic spectrum. In a simple form, a Node may detect an incoming signal and coincidently broadcast a radio frequency wireless communication. Frequencies utilized for wireless communication may include those within the electromagnetic spectrum radio frequencies used in UWB, Wi-Fi, and Bluetooth modalities, as well as IR, Visible and UV light as examples.

In some embodiments, sound emanations may also be used as a communication mechanism between a Smart Device and a Reference Position Transceivers 101-104. In some examples, the Reference Position Transceivers 101-104 may function to communicate data with their electromagnetic or sonic transmissions. Such communications may provide identifying information unique to the Node, data related to the synchronization of timing at different well-located reference points and may also function as general Data Communication Nodes. A triangulation calculation of the position of a Smart Device or a Node may result from a system of multiple Reference Position Nodes communicating timing signals to or from the Smart Device or Node. Methods of calculating positions via wireless communications may include one or more of: RTT, RSSI, AoD, AoA, timing signal differential and the like, Triangulation, or other mathematical techniques may also be employed in determining a location.

The process of determination of a position based upon triangulation with the reference points may be accomplished, for example, via executable software interacting with the controller in a Smart Device, such as, for example, via running an app on the Smart Device.

Reference points may be coded via identifiers, such as a UUID (Universally Unique Identifier), or other identification vehicles.

Reference Position Transceivers 101-104 may be deployed in a Structure or Defined Area 106 to determine a Location 107 of an Agent 100 within or proximate to the Defined Wireless Communication Area 111. Reference Position Transceivers 101-104 may be fixed in a certain location and transceive in a manner suitable for a triangulation determination of the position of the Agent. Transceiving may occur via wireless transmission to one or more Agent Supported Transceiver 105 supported by the Agent 100. By way of non-limiting example, Agent Supported Transceiver 105 supported by the Agent 100 may be included in, or be in logical communication with, a Smart Device with Agent Supported Transceiver 105 able to transceive with the Reference Position Transceivers 101-104.

The Reference Position Transceivers 101-104 may include devices such as a radio transmitter, radio receiver, a light generator, or an image-recognizable device (i.e., an apparatus set out in a distinctive pattern recognizable by a sensor). A radio transmitter may include a UWB Node, Wi-Fi, Bluetooth, or other communication device for entering into logical communication between Reference Position Transceivers 101-104 and Agent Supported Transceiver 105. In some embodiments, Reference Position Transceivers 101-104 may include a Wi-Fi router that additionally provides access to a distributed network, such as the Internet. Cartesian coordinates (including Cartesian coordinates generated relative to a GPS or other reference point), or any other coordinate system, may be used as data that may be utilized for one or more of: locating one or both of an Agent 100; indicating a Direction of Interest; and identifying a Structure or a Defined Area 106. A radio transmitter may include a router or other Wi-Fi device. The radio transmitter may include transmissions via Ultra-Wideband ("UWB") frequencies including, for example, 3.5-6.5 GHz; on Wi-Fi frequencies (300 MHz-60 GHz), sub-GHz frequencies or another modality. A light generator may distribute light at human-safe intensities and at virtually any frequency known in the art. Such frequencies include, without limitation, infrared, ultraviolet, visible, or nonvisible light. Further, the light beacon may comprise a laser, which may transmit light at any of the aforementioned frequencies in a coherent beam.

This plurality of modalities allows for increased accuracy because each modality may have a different degree of reliability. For example, a Smart Device and/or Smart Receptacle may measure a timing signal transmitted by a Reference Position Transceivers 101-104 within a different error tolerance than it may measure the receipt into a photodetector of infrared laser light. This has at least two principal benefits. First, a location calculation may in some embodiments, be a weighted average of the location calculated from each modality. Second, outliers may be shed. For example, if the standard location calculation comprises a weighted average of the location as calculated by five modalities, but one modality yields a location greater than two standard deviations from the average computed location, then that modality may not be considered for future weighted location calculations.

Additionally, the radio transmitters and/or transceiver in the Smart Device may comprise multiple antennas that transmit signals in a staggered fashion to reduce noise. By way of non-limiting example, if there are three antennas, then they may transmit a signal in intervals of 20 milliseconds. Given this rate of transmission, a detected time of arrival may be used to determine the distance between the transmitter and the antenna (i.e., the Smart Device). Moreover, the antennas may comprise varying lengths to accommodate desirable wavelengths. Further, dead reckoning may be used to measure location, using traditional methods of numerical integration.

A precise location may be determined based upon wireless transmissions between Nodes, such as between a Smart Device and the Reference Position Transceivers. Timing determinations—as well as signal qualities like angle of arrival, angle of departure, transmission strength, transmission noise, and transmission interruptions—may be considered in generating relative positions of Nodes. Additional considerations may include AI and unstructured queries of transmissions between Nodes and triangulation logic based upon a measured distance from three or more Reference Position Transceivers 101-104. For example, a radio transmission or light emission may be measured, and timing associated with the radio transmission or light to determine a distance between Nodes. Distances from three Reference Position Transceivers 101-103 may be used to generate a position of a Node in consideration. Other methodologies include determination of a distance from one or more Nodes and a respective angle of arrival and/or angle of departure of a radio or light transmission between the Node in consideration and another Node (Reference Point Node or Dynamic Position Node).

In some embodiments of the invention, position determination in a Structure or on a Property contemplates determination of a geospatial location using triangulation, trilateration, or multilateration techniques. In some embodiments, a geospatial location relative to one or more known reference points is generated. The geospatial location in space may be referred to as having an X,Y position indicating a planar designation (e.g., a position on a flat floor), and a Z position (e.g., a level within a Structure, such as a second floor) may be generated based upon indicators of distance from reference points. Indicators of distance may include a comparison of timing signals received from wireless references. A geospatial location may be generated relative to the reference points. In some embodiments, a geospatial location with reference to a larger geographic area is associated with the reference points, however, in many embodiments, a controller will generate a geospatial location relative to the reference point(s) and it is not relevant where the position is located in relation to a greater geospatial area. In addition to these Cartesian coordinates, polar coordinates may be used, as further described below.

A geospatial location based upon triangulation may be generated based upon a controller receiving a measurement of angles between the position and known points at either end of a fixed baseline. A point of a geospatial location may be determined based upon generation of a triangle with one known side and two known angles.

Referring again to FIG. 1, triangulation essentially includes determining an intersection of three Distances 108-210, each Distance 108-110 calculated from a Reference Position Transceivers 101-104 to an Agent Supported Transceiver 105. The present invention allows for a first Distance 108 to be determined based upon a wireless communication in a first modality; and a Second Distance 109 and a Third Distance 110 determined based upon a wireless communication in a same or different modality as the first modality. For example, a First Distance 108 may be determined based upon a wireless communication using UWB; a Second Distance 109 may be determined based upon a wireless communication using Bluetooth; and a Third Distance may be determined based upon a wireless communication using ultrasonic communication (other combinations of same and/or different communication modalities are also within the scope of the present invention).

A geospatial location based upon trilateration may be generated based upon a controller receiving wireless indicators of distance and geometry of geometric shapes, such as circles, spheres, triangles, and the like.

A geospatial location based upon multilateration may be generated based on a controller receiving a measurement of a difference in distance to two reference positions, each reference position being associated with a known location. Wireless signals may be available at one or more of: periodically, within determined timespans, and continually. The determination of the difference in distance between two reference positions provides multiple potential locations at the determined distance. A controller (such as one in the Smart Device) may be used to generate a plot of potential locations. In some embodiments, the potential determinations generally form a curve. Specific embodiments will generate a hyperbolic curve.

The controller may be programmed to execute code to locate an exact position along a generated curve, which is used to generate a geospatial location. The multilateration thereby receives as input multiple measurements of distance to reference points, wherein a second measurement taken to a second set of stations (which may include one station of a first set of stations) is used to generate a second curve. A point of intersection of the first curve and the second curve is used to indicate a specific location.

In exemplary embodiments, as described herein, the distances may be triangulated based on measurements of UWB, Wi-Fi, or sub-GHz strength at two points. Transceiver signals propagate outward as a wave, ideally according to an inverse square law. Ultimately, a crucial feature of the present invention relies on measuring relative distances between two points. In light of the speed of Wi-Fi waves and the real-time computations involved in orienteering, these computations need to be as computationally simple as possible. Thus, depending upon a specific application and mechanism for quantifying a condition or location, such as a measurement, various coordinate systems may be desirable. In particular, if the Smart Device moves only in a planar direction while the elevation is constant, or only at an angle relative to the ground, the computation is less complicated.

One exemplary coordinate system includes a polar coordinate system. One example of a three-dimensional polar coordinate system is a spherical coordinate system. A spherical coordinate system typically comprises three coordinates: a radial coordinate, a polar angle, and an azimuthal angle (r, $\theta$, and $\varphi$, respectively, though $\theta$ and $\varphi$ are occasionally swapped conventionally).

By way of non-limiting example, suppose Point 1 is considered the origin for a spherical coordinate system (i.e., the point (0, 0, 0)). Each Reference Position Transceivers 101-104 and Agent Supported Transceiver 105 $e_1$, $e_2$, $e_3$ can be described as points $(r_1, \theta_1, \varphi_1)$, $(r_2, \theta_2, \varphi_2)$, and $(r_3, \theta_3, \varphi_3)$, respectively. Each of the $r_i$'s ($1 \leq i \leq 3$) represent the distance between the Reference Position Transceivers 101-104 and Agent Supported Transceiver 105 emitter and the Transceiver on the Smart Device or Smart Receptacle (see FIG. 5A).

It is understood that in some embodiments, an azimuth may include an angle, such as a horizontal angle determined in an arcuate manner from a reference plane or other base direction line, such as an angle formed between a reference point or reference direction; and line (ray or vector) such as a ray or vector generated from or continuing to a Smart Device. In preferred embodiments, the ray or vector may be generally directed from a Reference Position Transceiver towards, and/or intersect one or more of: an item of interest; a point of interest; an architectural aspect (such as a wall, beam, header, corner, arch, doorway, window, etc.); an installed component that may act as a reference in an augmented virtual model (AVM) (such as, for example, an electrical outlet, a light fixture, a plumbing fixture, an architectural aspect; an item of equipment; an appliance; a multimedia device, etc.); another Reference Position Transceiver or other identifiable destination.

Accordingly, in some embodiments, a spherical coordinate system may include Reference Position Transceiver that is capable of determining an angle of departure of a location signal and a Transceiver that is capable of determining an angle of arrival of the location signal; one or both of which may be used to facilitate determination of an applicable azimuth.

According to various embodiments of the present invention, one or both of an angle of departure and an angle of arrival may therefore be registered by a Transceiver that is transmitting and/or receiving wireless signals (e.g., radio frequency, UWB, Bluetooth 5.1, sonic frequency, or light frequency).

In some embodiments, locating an Agent occurs in or proximate to a Structure in which Reference Position Transceivers, (including, for example, one or more of: Wi-Fi Transceivers, UWB Transceivers, Bluetooth Transceivers, infrared Transceivers, and ultrasonic Transceivers) may be located above and/or below an Agent. In these embodiments, a cylindrical coordinate system may be more appropriate. A cylindrical coordinate system typically comprises three coordinates: a radial coordinate, an angular coordinate, and an elevation (r, $\theta$, and z, respectively). A cylindrical coordinate system may be desirable where, for example, all Wi-Fi emitters have the same elevation. Angles may be determined as described above.

In some embodiments, Reference Position Transceivers 101-104 and Agent Supported Transceiver 105 including arrays of antennas may be used to measure an angle of radio communication (e.g., angle of arrival and/or angle of departure). Various configurations of transmitting antennas and receiving antennas may be used. For example, a radio transmission may be transmitted with a single antenna and received with a receiver with an array of antennas, the phase or timing difference of arriving signals can be used to calculate the angle at which the signals emerged. In angle of departure schemes, a transmitter may contain an array of antennas and may send a pattern of signals through the array that arrive at a receiver with a single antenna where the angle of departure (AoD) is communicated.

Measurement of angle of arrival may be performed as mentioned by calculation of time difference of arrival at the antennas in an array or alternatively can be performed by rotation of antenna elements.

Some modalities, such as those modalities that adhere to the Bluetooth 5.1 or BLE5.1 standards, allow a Smart Device, Smart Receptacle, or other Node to determine an angle of arrival (AoA) or an angle of departure (AoD) for a wireless transmission. An array of antennas may be used to measure aspects of the Bluetooth signaling that may be useful to calculate these AoA and AoD parameters. By calibrating an antenna system, the system may be used to determine angles in one or two dimensions depending on the design of the antenna. The result may be significant improvement in pinpointing the location of origin of a signal.

An array of antennas may be positioned relative to each other and a transmitting transceiver to allow for extraction of an AoA/AoD. Such an array may include a rectangular array; a polar or circular array; a linear array; and a patterned array, where a number of antennas are deployed in a pattern conducive to a particular environment for transceiving. Antennas may be separated by characterized distances from each other, and in some examples, a training protocol for the antenna array results in antenna positioning incorporating superior angle and location precision. Some transceivers may transceive in 2.4-2.482 GHz frequency bands, and thus the radiofrequency transmissions may have wavelengths in the roughly 125 mm length scale. A collection of antennas separated by significantly less than the wavelength may function by comparing a phase of RF transmissions arriving at the antennas. An accurate extraction of phase differences can yield a difference in path length that, when accumulated, can lead to a solution for the angles involved. In some embodiments, Reference Position Transceivers 101-104 and Agent Supported Transceiver 105 may include antenna arrays combined with batteries and circuitry to form complete self-contained devices. Antenna arrays and methods of using the same for determining position and direction of a Smart Device or other Node are described in U.S. Ser. No. 16/775,223, the contents of which are incorporated herein by reference.

In an example, an Agent Supported Transceiver 105 may be located at a position and may transmit a signal of the various types as have been described. Nodes, such as Reference Position Transceivers 101-104 located at reference points in the wireless communication area around the position of the Agent 100 may receive the transmission and determine the angle of arrival of that transmission. Similarly, transmission associated with other Reference Position Transceivers 101-103 may also determine an angle of arrival of transmissions. In some embodiments, Reference Position Transceivers 101-103 may communicate with one or more of: each other, a Smart Device, a controller, or other processor to mathematically process multiple angles and locations of the transceivers and calculate a position of a transmission emanation. In examples where calculations are not performed at a smart device, a communication to the smart device of the calculated position may be communicated.

In certain embodiments of the invention, a Direction of Interest indicated by Smart Device 501 or a Smart Receptacle 502 (see FIG. 5A) may be determined based upon a movement of Smart Device 501 or a Smart Receptacle 502. For example, a device with a controller and an accelerometer, such as Smart Device 501, may include a User Display that allows a direction to be indicated by movement of the device from a determined location acting as a base position towards an As Built Feature in an extended position. In some implementations, the Smart Device 501 may first determine a First Position based upon triangulation with the reference points and a Second Position (extended position) also based upon triangulation with the reference points. These position determinations may proceed as described above. The process of determination of a position based upon triangulation with the reference points may be accomplished, for example via executable software interacting with the controller in the Smart Device 501, such as, for example via running an app on the Smart Device 501. Logical communications relevant to location determination may include, for example, one or more of: timing signals; SIM information; received signal strength; GPS data; raw radio measurements; Cell-ID; round trip time of a signal; phase; and angle of received/transmitted signal; time of arrival of a signal; a time difference of arrival; and other data useful in determining a location.

In another aspect, captured data may be compared to a library of stored data using image recognition software to ascertain and/or affirm a specific location, elevation and direction of an image capture location and proper alignment with the virtual model. In an example, a Position of a User may be determined by any of the means described herein. A User may position a Sensor of an associated Smart Device to be pointing in a Direction of Interest and obtain an image. The image may be passed on to a server with access to database of images containing stored images of the space around the User. Algorithms on the server may compare the stored images to the image captured by the User and may calculate adjustments to the comparative image based on where the reference image was taken in relationship to the location of the User. Based on the determination that the calculated adjusted image compared to the image obtained by the User in the Direction of Interest, a direction may be inferred with known location of objects in the reference image. In some variations, the differences in features of the user-obtained image compared to a reference image may be used to calculate a direction of interest based upon a location at which the reference image was obtained.

In some examples, stored images may be obtained at multiple angles to improve accuracy of orienteering. These examples may include sensor arrays, audio capture arrays, and sensor arrays with multiple data collection angles. In some examples, a full 360-degree sensor perspective may be obtained by such arrays. In some directional arrays, a Sensor array (including image capture sensors) may include at least 120 degrees of data capture. By collecting such image collections as the Sensor/Sensor systems are moved, a database of image perspectives may be formed and utilized to assist in orienteering as described.

Non-limiting examples may include image-based identification where a device with some imaging means, including but not limited to a mobile device sensor, tablet device sensor, computer sensor, security sensor, or AR headset sensor, may image points of interest in a direction of interest. These points of interest may be identified. Image recognition software may be used to identify the visualized landscape by its identifying features. Machine learning may be used to train systems using this software to identify specific features of the environment in question.

To create a supplemental topographic part of a model of the environment of a user, laser scanning and/or LiDAR may be performed during the acquisition of imagery for a reference database. A resulting three-dimensional shape model may be modelled with the captured imagery to help in the comparison to user data. Three-dimensional shapes can be used to infer comparative imagery at different angles of acquisition than exist in a database. In another example, a device of a user may have the means of performing laser scanning or LiDAR scanning of the environment as well as obtaining images. The resultant three-dimensional data or a composite of the three-dimensional data, and the imagery may be used to recognize features and determine a direction that the user was facing when they collected the image.

The results of scanning may be stored and presented in different manners. In some examples, the scanned data may be represented by a point cloud representation; in other examples an estimated topographic surface representation may be used to visualize the three-dimensional shape data obtained. In some examples, outward facing planes of the surface topography may have the captured imagery superimposed upon them. The resulting image and three-dimensional models may be used to calculate a direction of interest or a device field of view in a dynamic sense or alternatively upon user request.

In some examples other methods of capturing spatially accurate information may include the use of drones and optical scanning techniques which may include high resolution imagery obtained from multiple viewpoints. Scanning may be performed with light-based methods such as a CCD sensor. Other methods may include infrared, ultraviolet, acoustic, and magnetic and electric field mapping techniques.

In other embodiments, a single distance to a point of interest in an image, which may be obtained by a laser, other collimated light source, sound source or the like, may be used with models of the environment of the user. A comparison of the imagery and the measurement of the distance of the user to a prominent feature in the image may allow for an orientation of the user to be determined algorithmically.

Figure 2:
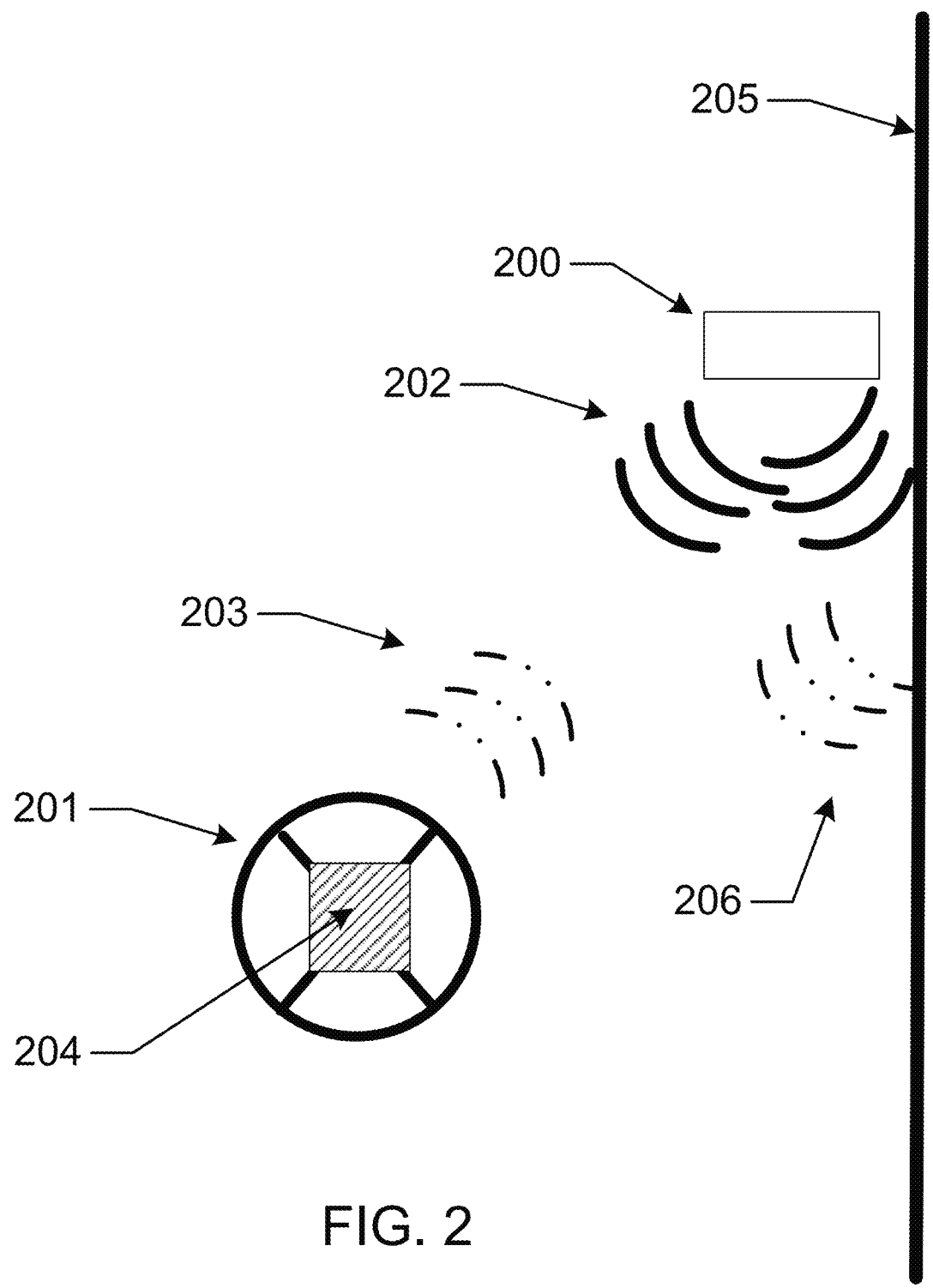
FIG. 2 illustrates locations aspects with sonic location.

Referring now to FIG. 2, an exemplary embodiment of sonic-wave aspects of the invention are shown. In some exemplary embodiments, radio frequencies used for wireless communication include sound waves used to perform one or more of: location determination; movement tracking in interior or exterior areas; and distance calculation. Sound wave transmissions include a number of significant attributes, which may translate into a benefit for a given set of circumstances when used for RF based location determination.

According to the present invention, sonic waves may be deployed independently, or in combination with electromagnetic transmissions and reception of logical communications utilizing other bandwidths, such as bandwidths associated with Ultrawideband, Wi-Fi, Bluetooth, Ultrawideband, ANT, infrared or almost any wavelength in the Industrial, Scientific and Medical bands (sometimes referred to as "ISM Bands").

For example, sound waves travel through an ambient atmosphere at a significantly slower speed than electromagnetic radiation ($6\times10^2$ m/sec versus $3\times10^8$ m/sec). Therefore, a relative accuracy for measurements related to travel times may be improved in some environments by orders of magnitude using sonic-based location tracking as compared to electromagnetic-based measurements. Therefore, using sonic communications may result in increased accuracy of location determination, in some environments.

The present invention also provides for sonic wave emanations may be used to complement electromagnetic emanations based upon a tendency that sonic waves generally do not efficiently penetrate walls, other physical items, or structures. Sonic transceivers may be particularly advantageous in a defined area where location can be unambiguously determined to be within a particular room (the use of multiple bandwidths transmitting and receiving for different purposes is further discussed below). Sound wave interaction with a solid surface, such as a wall, may require that for optimal performance, transceiver/transmitters/receivers to be located in each room where location detection is desired. In some embodiments, a reflected sonic transmission may be received and analyzed to determine an effect of the reflected nature of the transmission.

Accordingly, methods may be employed using sonic emanations and reception for location determination. In general, frequencies of effective indoor sonic location detection may be at ultrasonic bandwidths (commonly used bandwidths include frequencies of between 1 MHz and 10 MHz, although frequencies of less than 50 kHz to greater than 200 MHz are possible). The utilized frequencies may be either below or above audible detection by people or other animals in the location, such as at frequencies above 20 kHz.

Sound waves may be used to perform one or more of: location determination, movement tracking in interior or exterior locations, and distance calculation from a position to a Smart Device 501, which may be accomplished based upon transmission and receipt of sonic transmission. Sound wave transmissions include several significant attributes, which may be beneficial for a given set of circumstances when used for radiofrequency-based location determination. According to the present invention, sonic waves may be deployed independently, or in combination with, transmissions and reception of logical communications utilizing other bandwidths, such as bandwidths associated with Wi-Fi, Bluetooth, ANT, infrared or almost any wavelength in the ISM Bands. Methods, devices, and apparatus for using sound waves in location determination may be found, for example, in U.S. Pat. No. 10,628,617, the contents of which are incorporated herein.

As illustrated in FIG. 2, in some embodiments, a sonic Transceiver 200 may transmit a Sonic Transmission 202 and determine a Location 201 based upon receiving an Echo 203 back from an Agent-Supported Device 204. Walls 205 may also generate reflected Sonic Emanations 206.

In some examples, as may be used in orienteering herein, an Agent-Supported Device 204 may support receivers, transmitters, or transceivers that interact with Ultrasonic Transceivers fixedly secured to a Reference Point Position, such as via mechanical mounting within a room environment. An Ultrasonic Positioning System may have indoor positioning accuracy at centimeter, millimeter, and even sub-millimeter accuracy. Multiple Ultrasonic Transceivers may transceive from an Agent-Supported Device to communicate with fixed Reference Position Transceivers may transmit signals. Arrival of the sound transmissions may be accurately timed and converted to distances. In some embodiments, distance determinations may be improved with knowledge of temperatures in the environment containing the sound transceiving. For example, temperature may be measured at one or more of: an Agent-Supported Smart Device, a Reference Point Position, and an ambient environment.

In some examples, synchronized timing apparatus is able to generate a location of a stationary Agent to within centimeter accuracy using sonic wave transmissions and reception and preferably within several millimeters of accuracy. In addition, in some embodiments sensors are able to detect frequency shifts within the sonic emanations which may add information about the relative rate of movement of the Agent, which may then in turn allow for correction to the timing signals.

In some examples, a combination of radio frequency emissions and ultrasonic emissions may be used. For example, a complement of radio frequency emissions/receptions and ultrasonic of radio frequency emissions and ultrasonic emissions may be reconciled to generate more accurate location determination. In another aspect, a radio frequency signal may be used to transmit syncing signals that establish a time that ultrasonic signals are transmitted. Since the electromagnetic transmissions may be orders of magnitude faster than sound transmissions, the electromagnetic transmissions relatively small time of travel from the Transceivers to the Agent may be negligible and therefore used as "zero-time" setpoints as received at the Agent-Supported Transceiver. In such embodiments, a controller determining a Location may use not only relative arrival times, but also a delta time between a radiofrequency transmission and ultrasonic transmission to determine a distance from a transmitting Transceiver. An array of such ultrasonic and/or radiofrequency transceivers provide increased accuracy in triangulating a Location of the Agent.

In still further examples, RF communications may not only transmit a syncing pulse, but also transmit digital data about various aspects of a Defined Area, such as the Defined Area's identification, its relative and/or absolute Location in space and other refinements. In some examples, data related to improved distance calculation may also be transmitted by RF communication such as temperature of the environment, humidity and the like which may influence the speed of sound in the environment as a non-limiting example. In some examples, such a system may result in millimeter level accuracy of position determination.

In some examples, the process may be iterated to refine the direction of each of the ultrasonic transmitters and maximize signal levels of the transmission which may provide additional information in the calculation of a position. RF and Wi-Fi transmissions may be used for data communications and synchronizing as have been described. In other examples, as an Agent-Supported Device 204 is moving, an iterative process may be used to track the Agent-Supported Device 204 moves through space. Stationary Agents may be tracked with submillimeter accuracy in some embodiments.

A direction dimension may be based upon multiple transceivers included in a Smart Device or a Smart Receptacle or via a movement of a Smart Device or Smart Receptacle while an Agent supporting the Smart Device or Smart Receptacle remains in a stationary position in relation to reference, such as a ground plane position. For example, a device with a controller and an accelerometer, such as mobile Smart Device, may include a User Display that allows a direction to be indicated by movement of the device from a Determined Location acting as a base position towards a feature in the intended direction where the movement results in an extended position. In some implementations, the Smart Device may first determine a First Position based upon triangulation with the Reference Points and a Second Position (extended position) also based upon triangulation with the Reference Points.

As described above, facing a mobile device towards an area in a Structure and movement of the mobile device in a particular pattern may be used to ascertain a specific area in space to be interpreted by various methods. In some examples, the leading edge of a Smart Device, or the top portion of the user screen (in either portrait or landscape mode of display) may be the reference for the direction pointed in by the User. If the Smart Device is held at an angle relative to the ground, in some examples, the angle formed by the perpendicular to the top portion of the user screen may be projected upon the ground and that projection taken as the indication of direction.

Figure 3:
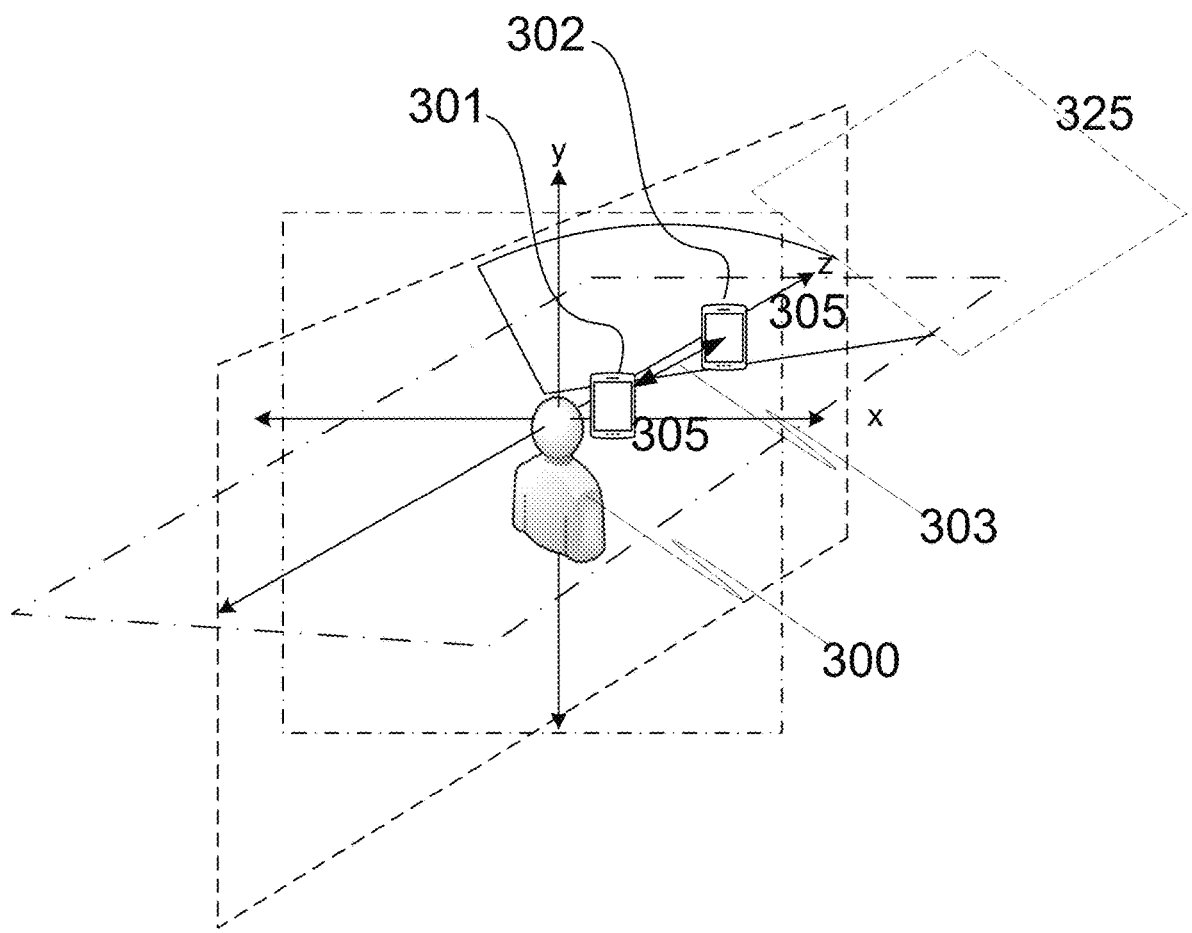
FIG. 3 illustrates methods of orienteering by device movement.

Referring now to FIG. 3, methods, and devices for determining a direction that may be referenced for one or both of data capture and data presentation of a particular portion of the virtual representation of surroundings of a user. An Agent 300 may position a Transceiver 305 in a First Position 301 proximate to a portion in an Area of Interest 325. The First Position 301 of the Transceiver 305 may be determined and recorded. The Agent 300 may then relocate the Transceiver 305 to a Second Position 302 in a general direction of the portion in an Area of Interest. With associated position information obtained for the First and Second Positions a controller in an external system or in an associated Transceiver 305 may generate one or both of a ray and a vector towards the portion of An Area of Interest.

In some embodiments, the vector may have a length determined by a controller that is based upon a distance to a feature of interest in space as represented in a model on the controller in the direction of the generated vector. The vector may represent a Distance 303 from the Second Position 302 to the Area of Interest 325 along the axis defined by a line between the First Position 301 and the Second Position 302. In contrast, a ray may include just a starting point and a direction.

In still other embodiments, a device with a controller and an accelerometer, such as mobile phone, tablet or other Smart Device that includes a Transceiver 305, may include a user display that allows a direction to be indicated by movement of the device from a determined location acting as a base position towards an point in a direction of interest or representing a center of an RTA of the device. The movement may occur to a Second Location in an extended position. In some implementations, the Smart Device determines a First Position 301 based upon triangulation with the Reference Points. The process of determination of a Position based upon triangulation with the Reference Points may be accomplished, for example via executable software interacting with a controller in the Smart Device, such as, for example by running an app on the Transceiver 305.

An array of antennas positioned at a User Reference Point may allow for the accurate receipt of orientation information from a transmitter. As discussed earlier, a combination device with arrays of antennas may be used to calculate a position. A single Node with an array of antennas can be used for orienteering and determining a direction of interest. Each of the antennas in such an array receiving a signal from a source may have different phase aspects of the received signal at the antennas due to different distances that the emitted signal passes through. The phase differences can be turned into a computed angle that the source makes with the antenna array.

Referring to FIGS. 4A-D, a series of exemplary devices employing matrices (or arrays) of antennas for use with Nodes 406 that communicate wirelessly, such as via exemplary UWB, Sonic, Bluetooth, a Wi-Fi, or other modality, is illustrated. Linear Antenna Arrays 401 are illustrated in FIG. 4A. Rectangular Antenna Arrays 402 are illustrated in FIG. 4B. Circular Antenna Arrays 403 are illustrated in FIG. 4C, other shapes for arrays are within the scope of the invention. In addition, an antenna array may be omni-directional or directional.

In some embodiments, see FIG. 4D, Composite Device 404, a Smart Device 405 may include one or more Nodes 406 internal to the Smart Device 405 or fixedly attached or removably attached to the Smart Device 405. Each Node 406 may include antenna arrays combined with a power source and circuitry to form complete self-contained devices. The Nodes 406 or a controller may determine an RTT, time of arrival, AoA and/or AoD or other related angular determinations based upon values for variables involved in wireless communications. For example, a Composite Device 404 may be formed when a Node 406 with a configuration of antennas, such as the illustrated exemplary circular configuration of Antennas 407, is attached to a Smart Device 405. The Node 406 attached to the Smart Device 405 may communicate information from and to the Smart Device 405, including calculated results received from or about another Node 406, such as a Node 406 fixed as a Reference Point Transceiver or a Node with dynamic locations, wherein the wireless communications are conducive to generation of data useful for determination of a position (e.g. timing data, angles of departure and/or arrival, amplitude, strength, phase change, etc.). A combination of angles from multiple fixed reference points to the antenna array can allow for a location of a user in space. However, with even a single wireless source able to communicate with the antenna array, it may be possible to determine a direction of interest or a device related field of view.

An array of antennas positioned at a Reference Point may allow for the accurate receipt of orientation information from a transmitter. As discussed earlier, a combination device with arrays of antennas may be used to calculate a position. A single Node with an array of antennas can be used for orienteering and determining a direction of interest. Each of the antennas in such an array receiving a signal from a source will have different phase aspects of the received signal at the antennas due to different distances that the emitted signal passes through. The phase differences can be turned into a computed angle that the source makes with the antenna array.

Figure 5A:
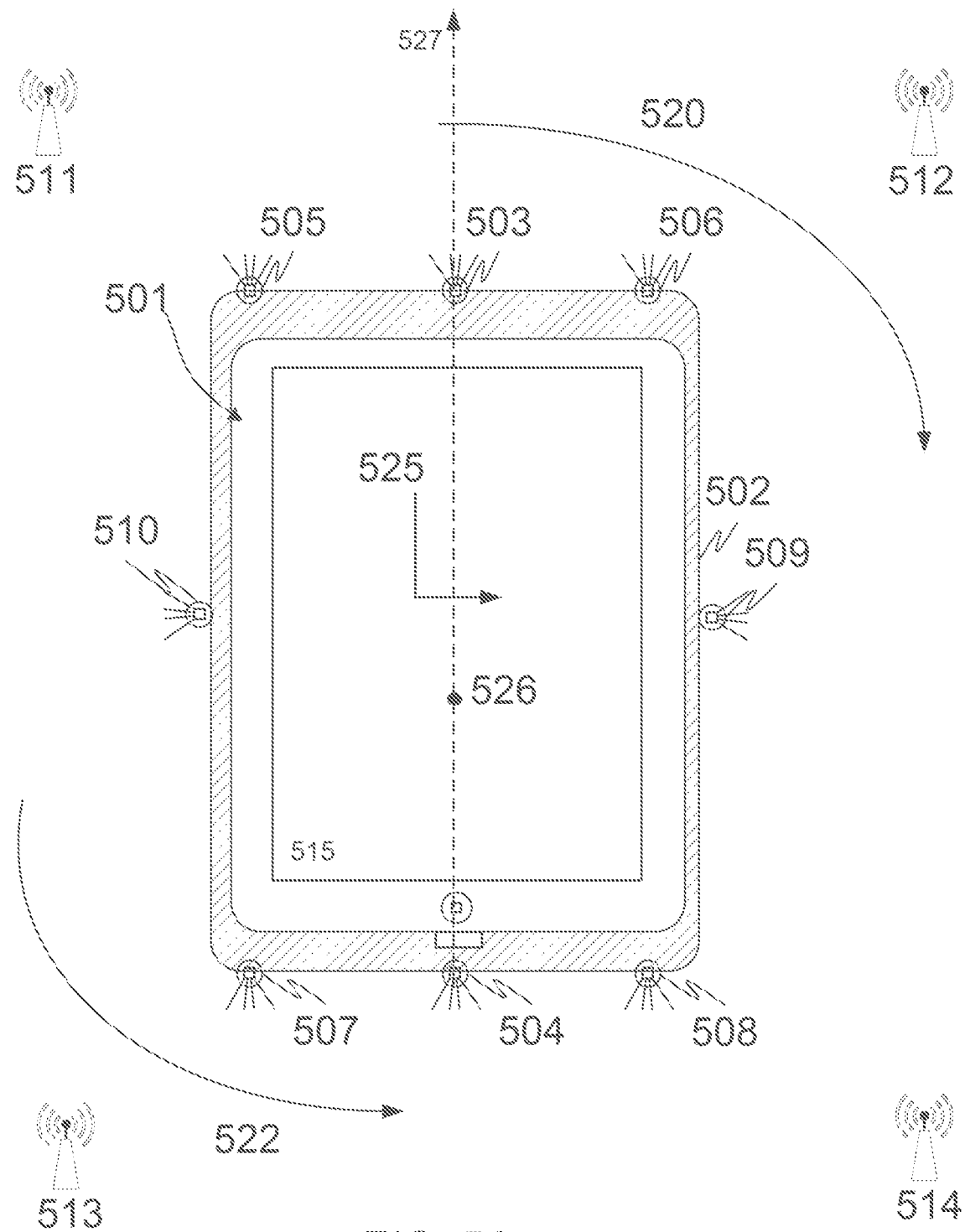
FIG. 5A illustrates an exemplary Smart Device with an array of antennas.

Referring now to FIG. 5A, in some embodiments, one or both of a Smart Device 501 and a Smart Receptacle 502 may incorporate multiple Transceivers 503-510 and a Direction of Interest may be ascertained by generating a Vector 527 passing through a respective position of each of at least two of the Transceivers (as illustrated through Transceiver 505 and 507). The respective positions of each of the Transceivers 503-510 supported by the Smart Device 501 and/or Smart Receptacle 502 may be ascertained according to the methods presented herein, including for example via triangulation, trilateration, signal strength analysis, RTT, AoD, AoA, topography recognition, and the like. Reference Position Transceivers 511-514 may be fixed in a certain location.

In some embodiments, one or both of the Smart Device 501 and the Smart Receptacle 502 incorporating Transceivers 503-510 may be rotated in a manner (such as, for example in a Clockwise 520 or Counterclockwise Movement 522 relative to a Display Screen 515) that repositions one or more Transceivers 503-510 from a First Position to a Second Position. Vector 526 may be generated at an angle that is zero degrees with a plane of a Display Screen 515 or Perpendicular 525 or some other designated angle in relation to the Smart Device 501 and an associated Display Screen 515. In some embodiments, an angle in relation to the Smart Device 501 is Perpendicular 525 to a Display Screen 515 and thereby viewable via a forward-looking sensor (or other CCD or LIDAR device) on the Smart Device 501. In addition, a mirror or other angle-altering device may be used in conjunction with a CCD, LIDAR or other energy receiving device.

Movements of a Smart Device 501 equipped with an antenna array can be determined via relative positions of the antenna and/or via operation of an Accelerometer within the Smart Device 501 or Smart Receptacle 502. Rough movement sense may be inferred with a single source to the antenna array. However, with multiple sources, the positional movement of each of the antennas can be used to sense many types of movements including translations and rotations.

A user may position the Smart Device 501 such that an object in a Direction of Interest is within in the CCD view. The Smart Device may then be moved to reposition one or more of the Transceivers 503-510 from a First Position to a Second Position and thereby capture the Direction of Interest via a generation of a Vector in the Direction of Interest.

In addition to movement of the Smart Device 501 and/or the Smart Receptacle 502 may include a Magnetic Force Detection Device, such as a magnetometer. A registration of a magnetic force may be determined in relation to a particular Direction of Interest and a subsequent determination of magnetic force referenced or provide a subsequent orientation of the Smart Device 501 or Smart Receptacle 502.

In some embodiments, the Magnetic Force Detection Device may be used in combination with, or in place of directional movement of the Smart Device Transceivers 503-507 to quantify a Direction of Interest to a user. Embodiments may include an electronic and/or magnetic sensor to indicate a Direction of Interest when a Smart Device 501 and/or Smart Receptacle 502 is aligned in a Direction of Interest. Alignment may include, for example, pointing a specified side of a Smart Device 501 and/or Smart Receptacle 502, or pointing an arrow or other symbol displayed upon a user interface on the Smart Device 501 towards a Direction of Interest.

A Magnetic Force Detection Device may detect a magnetic field particular to a setting where a Smart Device 501 is located. For example, in some embodiments, a particular structure or other setting may have a magnetic force that is primarily subject to the earth's magnetic field or may be primarily subject to electromagnetic forces from equipment, power lines, or some other magnetic influence or disturbance. An initial quantification of a magnetic influence at a first instance in time may be completed and may be compared to a subsequent quantification of magnetic influence at a later instance in time. In this manner an initial direction of interest indicated by a position, orientation, pitch, and yaw of a Node, such as a Smart Device 501 may be compared to a subsequent position, orientation, pitch, and yaw of the Smart Device 501.

In some embodiments, an initial position, pitch, and yaw of a Smart Device 501 may be described as a relative angle to a presiding magnetic force. Examples of presiding magnetic forces include, magnetic influences of electrical charges, Earth's magnetic field, magnetized materials, permanent magnetic material, strong magnetic fields, ferromagnetism, ferrimagnetism, antiferromagnetism, paramagnetism, and diamagnetism, or electric fields that are generated at reference nodes at known positions which may be locally used to indicate a Direction of Interest.

Smart Devices 501 may include electronic magnetic sensors as part of their device infrastructure. The magnetic sensors may typically include sensing elements deployed along three axes. In some examples, the magnetic sensors may be supplemented with electronic accelerometers, such as MEMS accelerometers.

In some examples, the magnetic sensors may measure a sensed magnetic field perpendicular to the body of the sensor through a Hall effect sensor. In some examples, a Hall effect sensor may be built into silicon to generate a relatively sensitive sensing capability for magnetic fields. In some Hall effect sensors, electrons and holes flowing in a region of the silicon may interact with the regional magnetic field and build up on the fringes of the conduction region, thus generating a measurable voltage potential. In other examples, anisotropic magnetoresistance sensors may sensitively detect the magnetic field at the device as a significant change in resistance of structure elements in the device.

In still further examples, giant magnetoresistance (GMR) sensors may detect the magnetic field. In some of these examples, the GMR sensors may detect a magnetic field with a current-perpendicular-to-plane (CPP) GMR configuration. In other examples, a current-in-plane (CIP) GMR sensor configuration may be used. The resulting three-axis magnetic sensors may perform a sensitive compass function to determine a direction of a specified portion of the Smart Device and/or an edge of the Smart Device 501 relative to the local magnetic field environment. A specified portion of the Smart Device 501 may be indicated via a user interface presented on a screen of the Smart Device 501.

Figure 5B:
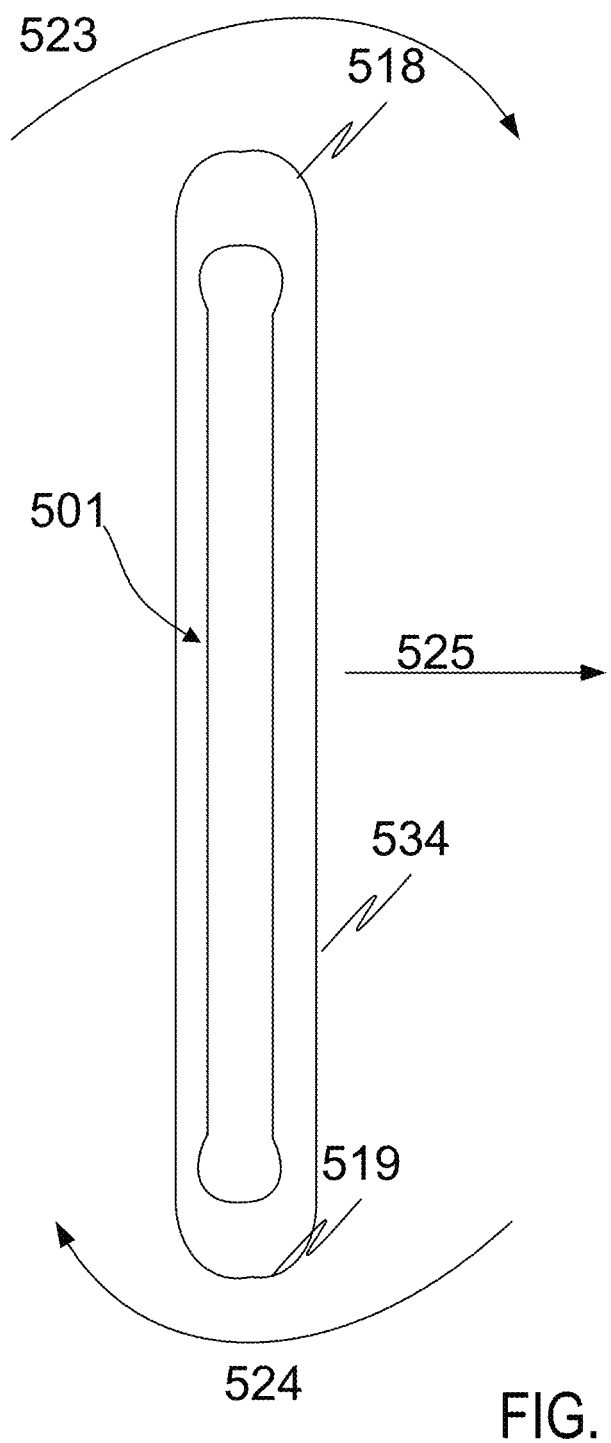
FIG. 5B illustrates exemplary methods of indicating directions with Smart Devices and antenna arrays.

Referring now to FIG. 5B, as illustrated, a vector in a Direction of Interest may be based upon a Rocking Motion of the Smart Device 501, such as a movement of an Upper Edge 518 in a Forward Arcuate Movement 523. The Lower Edge 519 may also be moved in a Complementary Arcuate Movement 524 or remain stationary. The movement of one or both the Upper Edge 518- and Lower Edge 519 also results in movement of one or more Transceivers 503-510 (Shown in FIG. 5A) and/or registration in an Accelerometer 534. The movement of the Transceivers 503-510 (Shown in FIG. 5A) will preferably be a sufficient distance to register disparate geospatial positions based upon wireless transmissions and/or sufficient to register movement via the Accelerometer 534.

As presented herein, a direction dimension may be based upon one or more of: a wireless position of two or more transceivers, a movement of a device, a magnetic force determination, a LIDAR transmission and receiving, CCD energy determinations and other assessments of an environment containing the Smart Device and/or Smart Receptacle. For example, a device with a controller and an accelerometer, such as a mobile Smart Device, may include a user display that allows a direction to be indicated by movement of the device from a determined location acting as a base position towards a feature in the intended direction where the movement results in an extended position. In some implementations, the Smart Device may first determine a First Position based upon triangulation with the reference points and a Second Position (extended position) also based upon triangulation with the reference points.

As described above, facing a mobile device towards an area in a Structure and movement of the mobile device in a particular pattern may be used to ascertain a specific area in space to be interpreted by various methods.

Figure 5C:
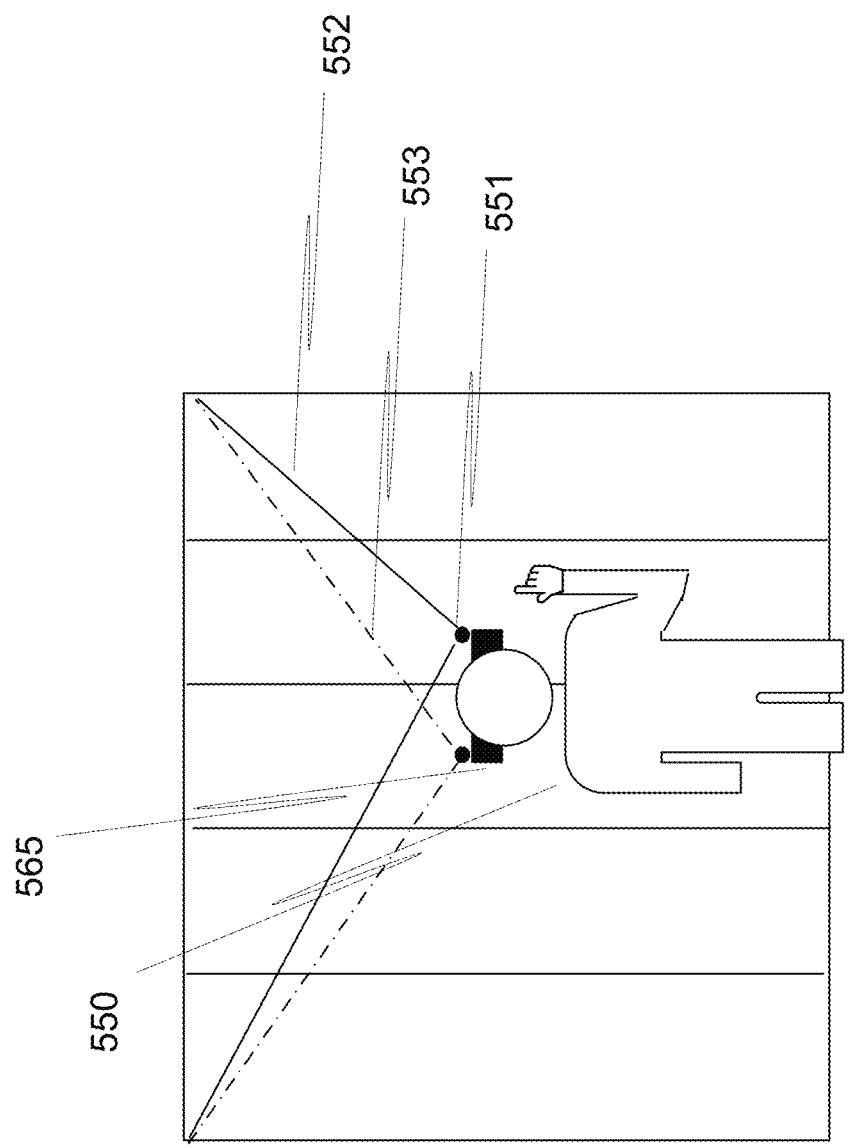
FIG. 5C illustrates an exemplary method of a user utilizing an oriented stereoscopic sensor system to orient a direction of interest.

Referring to FIG. 5C, an illustration of an Agent 550 utilizing an oriented Stereoscopic Sensor System 565 to orient a Direction of Interest is shown. The Stereoscopic Sensor System 551 may obtain two different images from different Viewpoints 552-553, which may be used to create topographical shape profiles algorithmically. A controller may obtain the image and topographic data and algorithmically compare them to previously stored images and topographic data in the general environment of the user. The resulting comparison of the imagery and topography may determine an orientation in space of the Smart Device 501 and in some examples determine a device field of view. The controller may utilize this determined field of view for various functionality as described herein.

Figure 6:
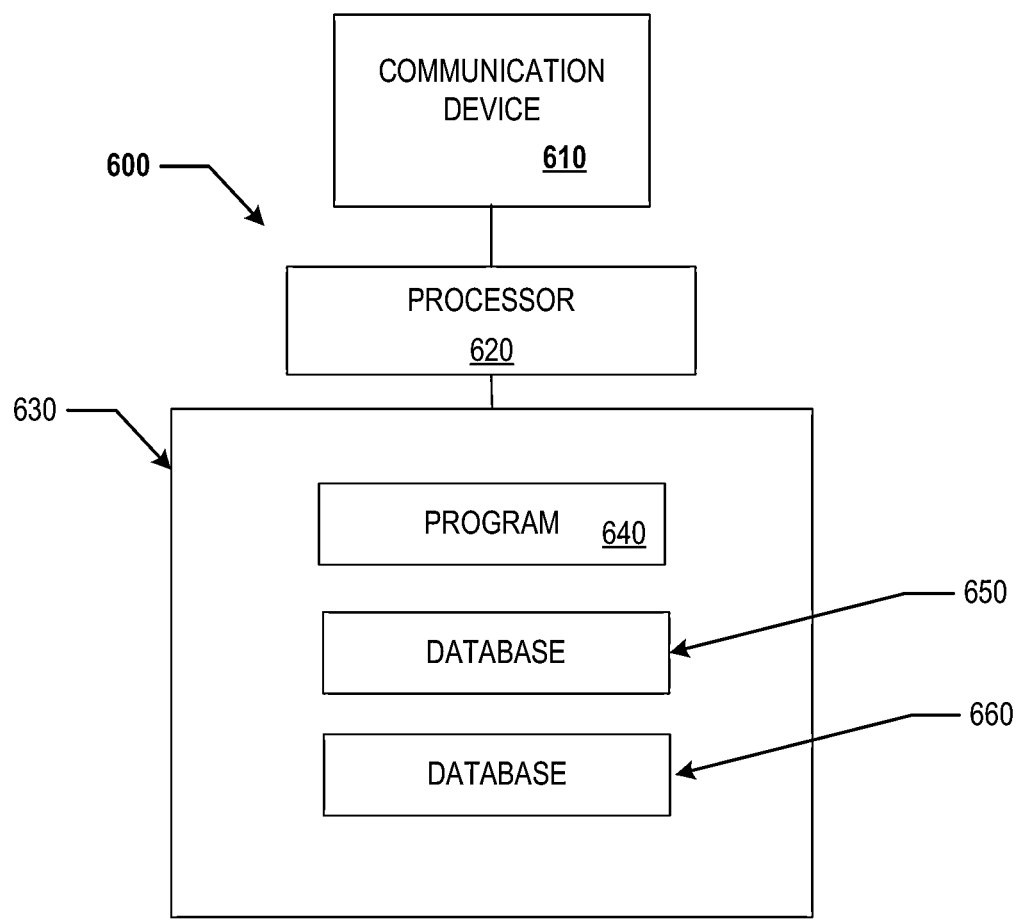
FIG. 6 illustrates apparatus that may be used to implement aspects of the present disclosure including executable software.

Referring now to FIG. 6 an automated Controller 600 is illustrated that may be used to implement various aspects of the present invention, in various embodiments, and for various aspects of the present invention, Controller 600 may be included in one or more of: a wireless tablet or handheld device, a server, a rack mounted processor unit. The Controller 600 may be included in one or more of the apparatuses described above, such as a Smart Device, Smart Tablet, Headgear, Smart Watch, Smart Ring, or other Smart Device. The Controller 600 includes a Processor Unit 620, such as one or more semiconductor-based processors, coupled to a Communication Device 610 configured to communicate via a communication network (not shown in FIG. 6). The Communication Device 610 may be used to communicate, for example, via a distributed network such as a cellular network, an IP network, the Internet, or other distributed logic communication network.

The Processor Unit 620 is also in communication with a Storage Device 630. The Storage Device 630 may comprise any appropriate information storage device, including combinations of digital data storage devices (e.g., solid state drives and hard disk drives), optical storage devices, and/or semiconductor memory devices such as Random Access Memory (RAM) devices and Read Only Memory (ROM) devices.

The Storage Device 630 can store a Software Program 640 with executable logic for controlling the Processor Unit 620. The Processor Unit 620 performs instructions of the Software Program 640, and thereby operates in accordance with the present invention. The Processor Unit 620 may also cause the Communication Device 610 to transmit information, including, in some instances, control commands to operate apparatus to implement the processes described above. The Storage Device 630 can additionally store related data in a Database 650 and Database 660, as needed.

Figure 7:
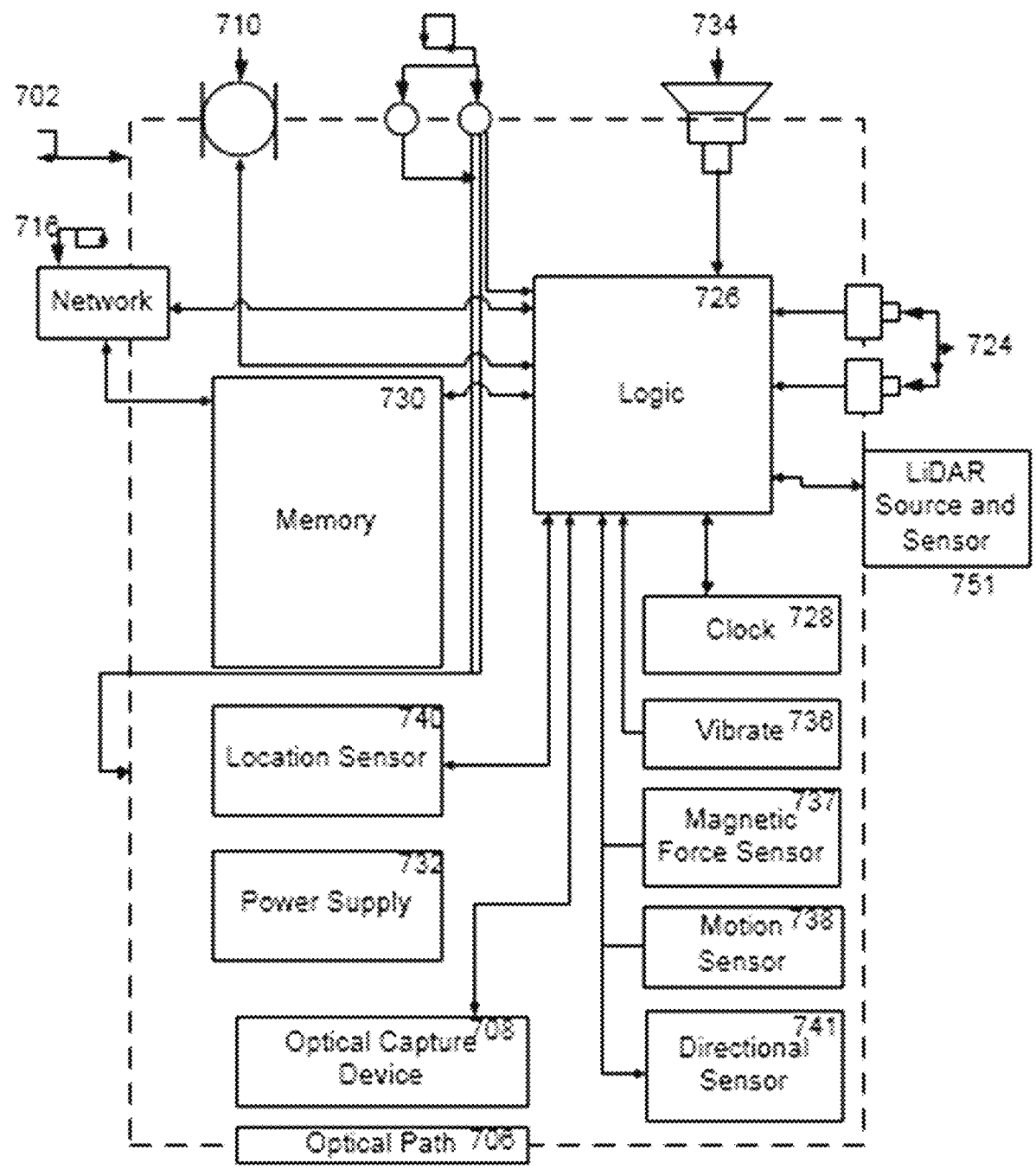
FIG. 7 illustrates an exemplary handheld device that may be used to implement aspects of the present disclosure including executable software.

Referring now to FIG. 7, a block diagram of an exemplary Smart Device 702 is shown. Smart Device 702 comprises an Optical Capture Device 708 to capture an image and convert it to machine-compatible data, and an Optical Path 706, typically a lens, an aperture, or an image conduit to convey the image from the rendered document to the Optical Capture Device 708. The Optical Capture Device 708 may incorporate a CCD, a Complementary Metal Oxide Semiconductor (CMOS) imaging device, or an Optical Sensor 724 of another type.

A Microphone 710 and associated circuitry may convert the sound of the environment, including spoken words, into machine-compatible signals. Input facilities may exist in the form of buttons, scroll wheels, or other tactile Sensors such as touchpads. In some embodiments, input facilities may include a touchscreen display.

Visual feedback to the user is possible through a visual display, touchscreen display, or indicator lights. Audible Feedback 734 may come from a loudspeaker or other audio transducer. Tactile feedback may come from Vibrate Module 736.

A Magnetic Force Sensor 737, such as a Hall Effect Sensor, solid state device, MEMS device or other silicon based or micro-electronic apparatus.

A Motion Sensor 738 and associated circuitry converts motion of the Smart Device 702 into a digital value or other machine-compatible signals. The Motion Sensor 738 may comprise an accelerometer that may be used to sense measurable physical acceleration, orientation, vibration, and other movements. In some embodiments, Motion Sensor 738 may include a gyroscope or other device to sense different motions.

A Location Sensor 740 and associated circuitry may be used to determine the location of the device. The Location Sensor 740 may detect Global Position System (GPS) radio signals from satellites or may also use assisted GPS where the mobile device may use a cellular network to decrease the time necessary to determine location. In some embodiments, the Location Sensor 740 may use radio waves to determine the distance from known radio sources such as cellular towers to determine the location of the Smart Device 702. In some embodiments these radio signals may be used in addition to GPS.

Smart Device 702 comprises Logic 726 to interact with the various other components, possibly processing the received signals into different formats and/or interpretations. Logic 726 may be operable to read and write data and program instructions stored in associated storage or Memory 730 such as RAM, ROM, flash, SSD, or other suitable memory. It may read a time signal from the Clock Unit 728. In some embodiments, Smart Device 702 may have an on-board Power Supply 732. In other embodiments, Smart Device 702 may be powered from a tethered connection to another device or power source.

Smart Device 702 also includes a Network Interface 716 to communicate data to a network and/or an associated computing device. Network Interface 716 may provide two-way data communication. For example, Network Interface 716 may operate according to internet protocol. As another example, Network Interface 716 may be a local area network (LAN) card allowing a data communication connection to a compatible LAN. As another example, Network Interface 716 may be a cellular antenna and associated circuitry which may allow the mobile device to communicate over standard wireless data communication networks. In some implementations, Network Interface 716 may include a Universal Serial Bus (USB) to supply power or transmit data. In some embodiments, other wireless links may also be implemented.

As an example of one use of Smart Device 702, a reader may scan some coded information from a location marker in a facility with Smart Device 702. The coded information may include for example, a hash code, bar code, RFID, or other data storage device. In some embodiments, the scan may include a bit-mapped image via the Optical Capture Device 708. Logic 726 causes the bit-mapped image to be stored in Memory 730 with an associated timestamp read from the Clock Unit 728. Logic 726 may also perform optical character recognition (OCR) or other post-scan processing on the bit-mapped image to convert it to text. Logic 726 may optionally extract a signature from the image, for example by performing a convolution-like process to locate repeating occurrences of characters, symbols, or objects, and determine the distance or number of other characters, symbols, or objects between these repeated elements. The reader may then upload the bit-mapped image (or text or other signature if post-scan processing has been performed by Logic 726) to an associated computer via Network Interface 716.

As an example of another use of Smart Device 702, a reader may recite words to create an audio file by using Microphone 710 as an acoustic capture port. Logic 726 causes the audio file to be stored in Memory 730. Logic 726 may also perform voice recognition or other post-scan processing on the audio file to convert it to text. As above, the reader may then upload the audio file (or text produced by post-scan processing performed by Logic 726) to an associated computer via Network Interface 716.

A Directional Sensor 741 may also be incorporated into Smart Device 702. The Directional Sensor 741 may be a compass and be based upon a magnetic reading or based upon network settings. The Directional Sensor 741 may include three axes of magnetic sensitive elements and may also be coupled with an accelerometer in the Directional Sensor 741.

A LiDAR Sensing System 751 may also be incorporated into Smart Device 702. The LiDAR Sensing System may include a scannable laser light (or other collimated) light source which may operate at nonvisible wavelengths such as in the infrared. An associated sensor device, sensitive to the light of emission may be included in the system to record time and strength of returned signal that is reflected off of surfaces in the environment of Smart Device 702. Aspects relating to capturing data with LiDAR and comparing it to a library of stored data (which may be obtained at multiple angles to improve accuracy) are discussed above.

Physical world and virtual world-based imagery related to the environment of a user may be presented via a user interface that may display on a Smart Device screen or other interactive mechanism, or in some embodiments, be presented in an augmented of virtual environment, such as via a VR or AR headset. The imagery displayed upon these devices may represent a composite of image data reflective of a real-world data stream as well as digitally added/superimposed image data from a virtual or digital source data stream. A user may be presented a typical image as it would look to the user's eyes physically, upon which digital shapes representing virtual "Tags" may be superimposed to represent the presence of digital information that may be accessed by a user. In other examples, the digital information may be directly displayed as a superposition. In some examples, the real-world and virtual-world environments may be displayed separately on a screen or separately in time.

In some examples, the "physical world image" may also be digitally formed or altered. For example, an imaging device may obtain images where the sensing elements of the imaging device are sensitive to a different frequency of electromagnetic radiation, such as, in a non-limiting sense, infrared radiation. The associated "real-world image" may be a color scale representation of the images obtained in the infrared spectrum. In still further examples, two different real-world images may be superimposed upon each other with or without additional virtual elements. Thus, a sensor image may have an IR sensor image superimposed over part or all of the image and a digital shape representing a virtual Tag may be superimposed.

In some implementations, a virtual reality headset may be worn by a user to provide an immersive experience from a vantage point such that the user may experience a virtual representation of what it would be like to be located at the vantage point within an environment at a specified point in time. The virtual representation may include a combination of simulated imagery, textual data, animations and the like and may be based on scans, image acquisition and other Sensor inputs, as examples. A virtual representation may therefore include a virtual representation of image data via the visual light spectrum, image data representing image scans obtained via infrared light spectrum, noise, and vibration reenactment. Although some specific types of exemplary sensor data have been described, the descriptions are not meant to be limiting unless specifically claimed as a limitation and it is within the scope of this disclosure to include a virtual representation based upon other types of captured sensor data may also be included in the AVM virtual reality representation.

It should be noted that although a Smart Device 702 is generally operated by a human Agent, some embodiments of the present disclosure include a Controller, Accelerometer, Data Storage Medium, Image Capture Device, such as a CCD capture device, and/or an infrared capture device being available in an Agent that is an unmanned vehicle, including for example an unmanned ground vehicle ("UGV") such as a unit with wheels or tracks for mobility and a radio control unit for communication. or an unmanned aerial vehicle ("UAV") or other automation.

In some embodiments, multiple unmanned vehicles may capture data in a synchronized fashion to add depth to the image capture and/or a three-dimensional and four-dimensional (over time) aspect to the captured data. In some implementations, UAV position may be contained within a perimeter and the perimeter may have multiple reference points to help each UAV (or other unmanned vehicle) determine a position in relation to static features of a building within which it is operating and also in relation to other unmanned vehicles. Still other aspects include unmanned vehicles that may not only capture data, but also function to perform a task, such as paint a wall, drill a hole, cut along a defined path, or other function. As stated throughout this disclosure, the captured data may be incorporated into a virtual model of a space or Structure.

Referring now to FIGS. 8A-8G, exemplary Wireless Communication Areas (Was) and Radio Target Areas (RTAs) are illustrated. In general, a WCA is an area through which wireless communication may be completed. A size of a WCA may be dependent upon a specified modality of wireless communication and an environment through which the wireless communication takes place. In this disclosure (and as illustrated), a WCA may be portrayed in a representative spherical shape; however, in a physical environment, a shape of a WCA may be amorphous or of changing shape and more resemble a cloud of thinning density around the edges. In general, an RTA is an area from which an energy-receiving Sensor will receive energy of a type and bandwidth that may be quantified by the energy-receiving Sensor. The RTA shape and size may be affected by an environment through which the energy must be conveyed and further effected by obstructions.

Figure 8A:
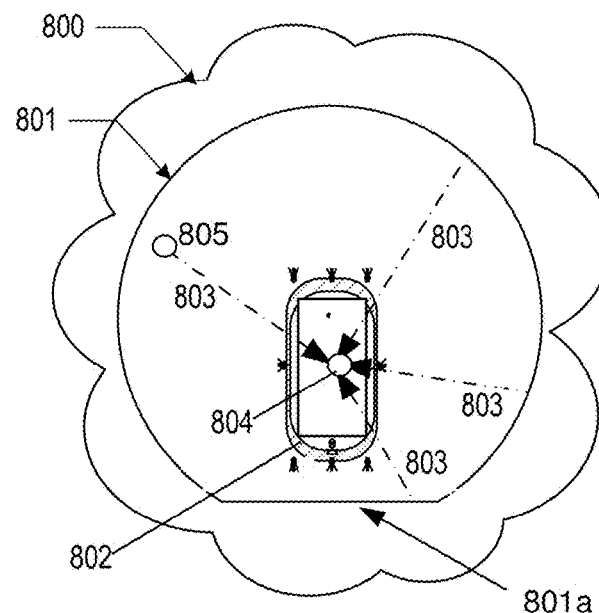
FIGS. 8A-8G illustrate aspects of the determination of directions of interest and Fields of View and information display.

Referring now to FIG. 8A, a side view illustrates a WCA 800 surrounding a Node, such as a Smart Device 802. Energy from exemplary Ray 803, which is illustrated as rays, is received by one or more energy-receiving Sensor 804 in the Smart Device 802 (energy-receiving Sensors may also be in a Smart Receptacle associated with the Smart Device 802, though this is not illustrated in FIG. 8A). An exemplary Ray 803 proceeds from a Position 805 within RTA 801 boundary to the Energy-Receiving Sensor 804.

As illustrated, a Portion 801a of the RTA 801 may flatten out in response to a ground plane, wall, partition, or other obstruction encountered. A Node 806 may be located on or within a surface that makes up a relevant obstruction and the Node 806 may appear to be along a perimeter of the RTA 801. Similarly, a Virtual Tag may be associated with location coordinates that appear on or within a floor, wall, partition, or other article acting as a radio frequency obstruction and thereby appear to be a part of the obstruction, however, since it is virtual, the Virtual Tag will not affect the physical properties of the obstruction. Essentially, a Virtual Tag may have location coordinates that correspond to anywhere in the physical real-world. In some examples, a software limit or setting may limit location coordinates of Virtual Tags to some distance from a base position or a distance from a designated position, such as a location of a designated Physical Tag, Reference Point Transceiver, or other definable position.

In addition to obstructions, a topography of an environment within an RTA 801 may also limit wireless conveyance of energy within an RTA 801 to an Energy-Receiving Sensor 804. Topography artifacts may include, for example, a terrain, buildings, infrastructure, machinery, shelving, or other items and/or other structures that may create impediments to the receipt of wireless energy.

Energy received from exemplary Ray 803 into the Energy-Receiving Sensor 804 may be used to create aspects of a user interface that is descriptive of the environment within the RTA 801. According to the present invention, environmental aspects, Nodes 806, Tags (both physical Tags and Virtual Tags) and the like may be combined with user interactive mechanisms, such as switches or other control devices built into a user interactive device and included in a user interactive interface. For example, energy levels received into an Energy-Receiving Sensor 804 may be combined with location coordinates of Physical Tags and/or Virtual Tags and a user interactive device may be positioned in an interactive user interface at a position correlating with the position coordinates and be surrounded with a visual indicator or the received energy levels.

In this manner, a single user interface will include a static image representative of received energy levels at an instance in time; a visual representation of a location(s) of Physical and/or Virtual Tag(s), and devices with user interactive functionality. In some embodiments, the devices with user interactive functionality may be positioned at a location in the user interactive interface correlating with the position(s) of the Physical and/or Virtual Tag(s).

This disclosure will discuss RTA 801 that are frustums of a generally conical shape, however, RTA 801 of other volume shapes are within the scope of the invention. For example, if an energy-receiving Sensor 804 included a receiving surface that was a shape other than round, or had multiple receiving surfaces, each of a round or other shape, the RTA 801 associated with such an energy-receiving Sensor may have a shape other than a frustum of generally conical shape.

Figure 8B:
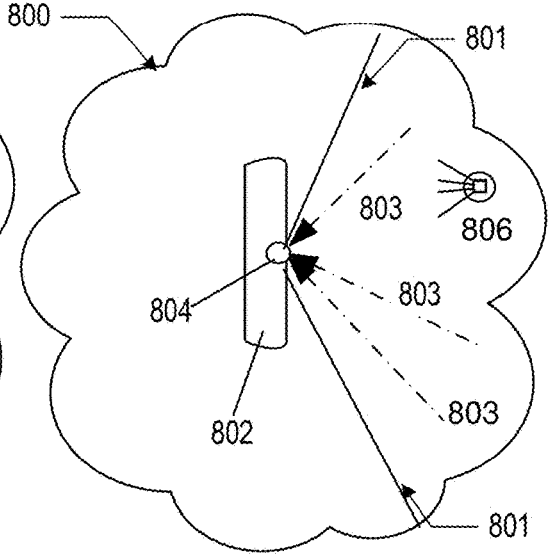

Referring now to FIG. 8B, a top-down view of an RTA 801 is depicted. An RTA 801 will include some portion of a WCA 800. As illustrated, the WCA 800 includes a space with irregular boundaries encompassing 360 degrees around the Smart Device 802. Aspects such as topography, strength of signals and atmospheric conditions (or other medium through which a wireless communication will travel) may affect and/or limit a perimeter of the WCA 800. A location of the RTA 801 may be referenced to determine which Tags (Physical and/or Virtual) such as Node 806 are included within an interactive user interface. Generally, preferred embodiments may only include Tags with location coordinates with the RTA 801 in the interactive user interface. However, embodiments may include Tags external to the RTA 801 in a particular interactive user interface.

Figure 8C:
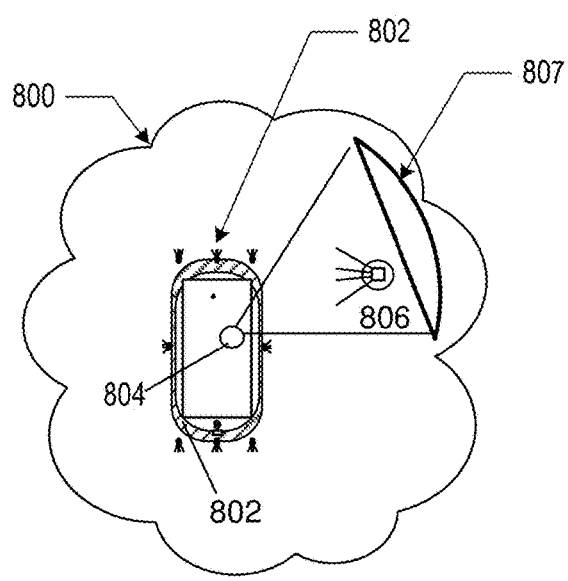

Referring now to FIG. 8C, a side view of a WCA 800 is presented where an Energy-Receiving Sensor 804 is capable of quantifying a particular form of energy, such as a particular bandwidth of energy received from a user-selected RTA 807. A Smart Device 802 may incorporate or be in logical communication with multiple Energy-Receiving Sensor 804, each Energy-Receiving Device capable of quantifying a limited energy spectrum in an environment defined by the RTA 807 selected by the user.

Some embodiments include an RTA 807 that varies according to a type of Energy-Receiving Sensor 804 receiving a corresponding type of energy. For example, an Energy-Receiving Sensor 804 that receives energy in a lower bandwidth may have an RTA 807 that extends a greater distance than an Energy-Receiving Sensor 804 that receives energy in a higher bandwidth. Similarly, an Energy-Receiving Sensor 804 may be affected by forces outside of the RTA 807, such as a magnetometer which may be sensitive to signal interactions around all of the WCA 800, and an RTA 807 associated with a magnetometer may accordingly be the same as the WCA 800.

By way of non-limiting example, an RTA 807 for a CCD-type energy receiver may be represented as a frustum with an expansion angle of approximately 60 degrees in shape. Accordingly, the RTA 807 subtends only a portion of the universal WCA 800.

Figure 8D:
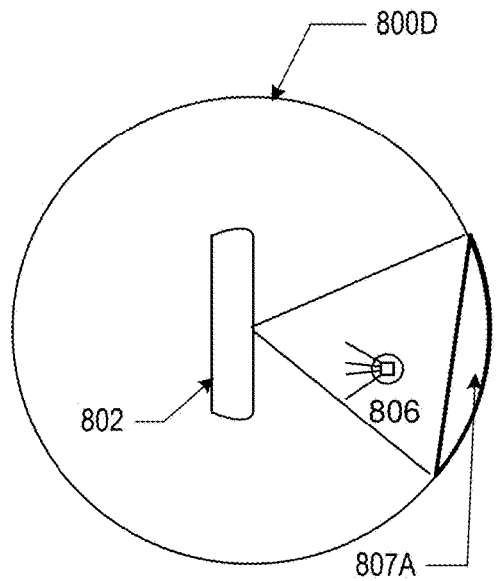

Referring now to FIG. 8D, a top view of a WCA 800D is illustrated with an RTA 807A comprising a frustum with an expansion angle of approximately 60 degrees. A Smart Device 802 with an energy receiver that quantifies a specified bandwidth of energy from the RTA 807A may generate a user interface with an image based upon energy quantified from RTA 807A.

In FIG. 8D, the WCA 800D is represented as a spherical area. A WCA 800D may be designated that is less than an entire area of possible radio communication using a specific designated wireless communication modality. For example, WCA 800D may be spherical and stay within boundaries of a modality based upon a UWB wireless communication protocol.

A user interface based upon quantified energy in an RTA 807, 807A, may present a representation of energy within the respective RTA 807, 807A as quantified by an Energy-Receiving Sensor 804. Energy levels of other three-dimensional spaces within the WCA 800 may be quantified by energy receivers and presented in a user interface by directing energy from a selected three-dimensional space into the energy receivers and thereby defining a different RTA. In this manner, energy levels may be quantified from essentially any area within the WCA 800D and represented as part of a user interface. Quantified energy levels may vary based upon a receiving Sensor. For example, a CCD Sensor may quantify visible light spectrum energy, and a LIDAR receiver a broad spectrum, an infrared energy receiver may quantify infrared energy levels, and energy-receiving Sensors. A particular feature present in a particular portion of the electromagnetic spectrum quantified by an energy-receiving Sensor may have a unique physical shape which characterizes it, and which may be associated with a corresponding virtual-world aspect and Tag associated with the location.

In some examples, as has been described, quantification of energy levels associated with aspects of the physical world may be for one or more of: characterizing an RTA 807, 807A by quantifying energy levels and patterns existing at an instance in time, determining a location and/or orientation of a Smart Device 802 or other Node, such as Node 806; and verifying a location and/or orientation of a Smart Device 802. In some examples, energy levels associated with aspects of the physical world may be communicated by the Smart Device 802 to a remote controller for further processing, and the remote controller may communicate information back to the Smart Device or to another user interface. Information communicated from the controller may include, for example, an orientation of physical and/or virtual aspects located within the universal RTA in relation to the Smart Device 802; quantified energy indicating of or more of: a topographical feature, a surface temperature, a vibration level, information associated with a Virtual Tag, information associated with a physical Tag, sensor data, or other information associated with the RTA 807A.

A view of a Radio Target Area 807 807A may be a relatively small portion of the entire wireless communication area (WCA) that surrounds a Smart Device 802. An area of energy to be quantified by a sensor (sometimes referred to herein as the Radio Target Area) may be displayed surrounded by the WCA 800D.

Figure 8E:
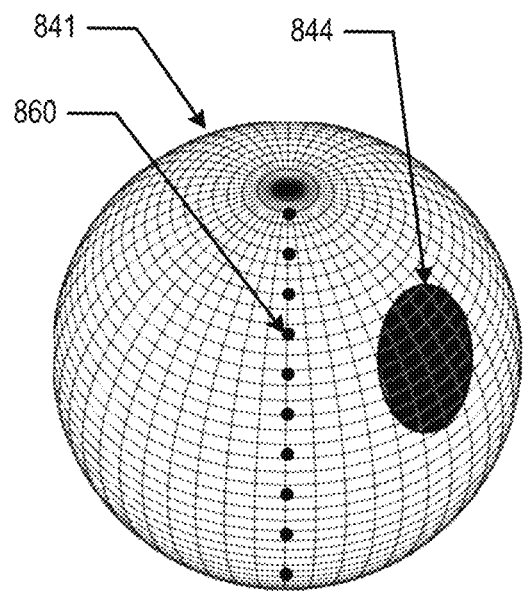

Referring now to FIG. 8E, an exemplary presentation of an RTA 844 superimposed upon a representation of a WCA 841 is illustrated. The WCA 841 is illustrated with a perspective view of a spheroid with an Alignment Feature 860 such as a spheroid dividing arc, or a line. A blackened ellipsoid feature is a representation of the RTA 844 associated with a particular Smart Device which would be located at a center of the spheroid WCA 841. If desired, one or more energy receiving devices associated with or incorporated into a Smart Device may be repositioned or have a changed orientation in space to ultimately scan all of the accessible universal Radio Target Area space.

Figure 8F:
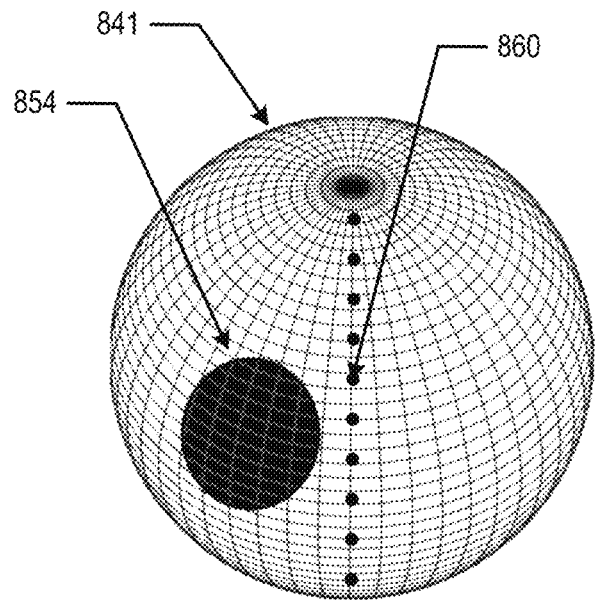

Referring to FIG. 8F, an illustration of how moving the one or more energy receiving devices around in space may alter an area defined as the RTA 854. The same orientation of the universal WCA 841 may be noted by a same location of the Alignment Feature 860. Relative movement of the ellipsoid feature illustrates a change in an area designated as RTA 854.

Figure 8G:
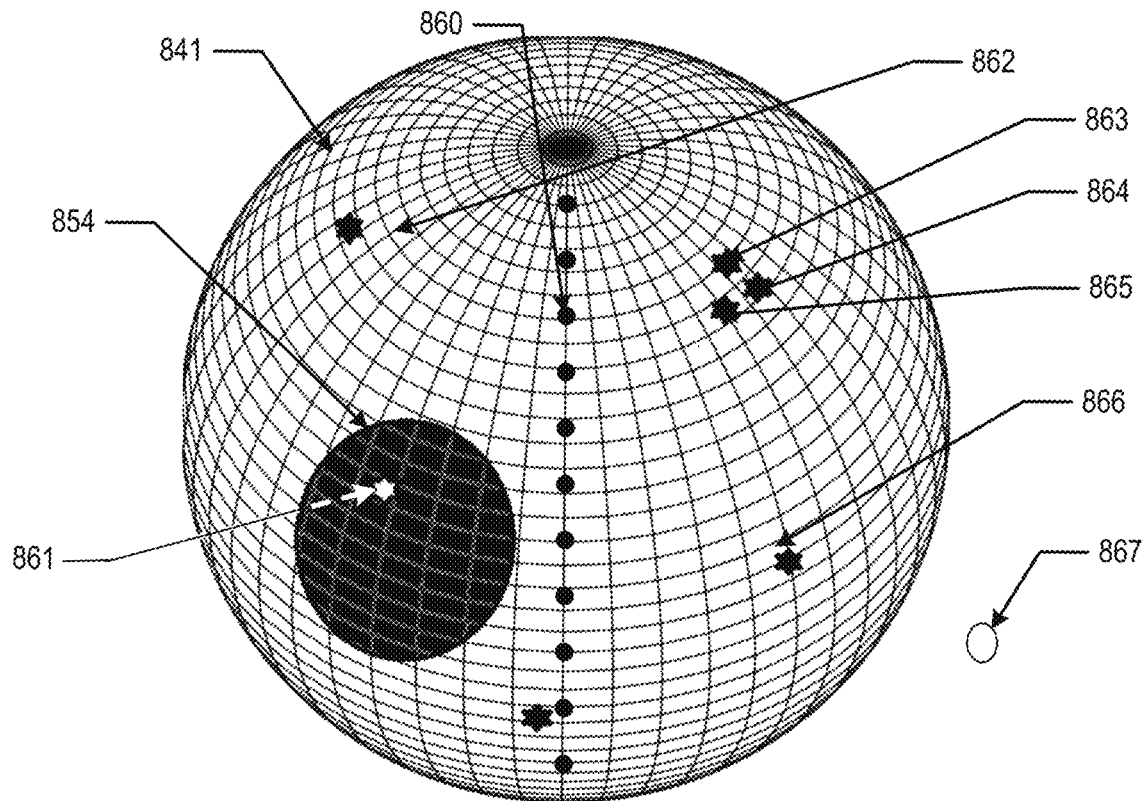

Referring to FIG. 8G, an illustration of adding Tag locations (which may be Physical Tags or Virtual Tags) to a mapping of the WCA 841 is provided. A Tag may be represented in the WCA, for example, as an icon (two- or three-dimensional) positioned in space according to a coordinate system, such as Cartesian coordinates, polar coordinates, spherical coordinates, or other mechanism for designating a position. Coordinates may specify one or both of physical real-world Tags and Virtual Tags.

A location of a real-world Tag or Virtual Tag may be in either RTA 854, the WCA 841 or external to both the RTA 854 and the WCA 841. Examples of Tags 861-866 outside the RTA 854 and within the WCA 841 include Tags 862-866. An example of a Tag in the device RTA is Tag. A Tag located external to the WCA 841 and the RTA 854 includes Tag 867.

In some examples, a display on the user's Smart Device may illustrate image data captured via a CCD included in a Smart Device. Portions of the image data captured via a CCD may be removed and replaced with an icon at position correlating to a position in space within the RTA 854. The icon may indicate a Tag located within the RTA 854, or at least the direction in the RTA 864 along which the Tag may be located at an instance in time. In addition, an area of a user interface portraying the Icon may user interactive device such that when the device is activated, the Smart Device is operative to perform an action.

The actual positions of the Tags in real-world space (or the digital equivalent in the real-world space) may be stored and maintained in a database. Positions of physical Tags may be determined via techniques based upon wireless communication and be updated periodically. A period of update may be contingent upon variables including, user preference, Tag movement, change in environmental conditions, User query or other variable that may be converted into a programmable command. In another example of some embodiment, an Agent may interact with a user interface and understand the presence of Tags that are outside of the RTA 854 and adjust one or both of a position and direction that the Smart Device to cause the Smart Device to be positioned such that the RTA 854 encompasses a position of the Tag of interest.

Figure 9A:
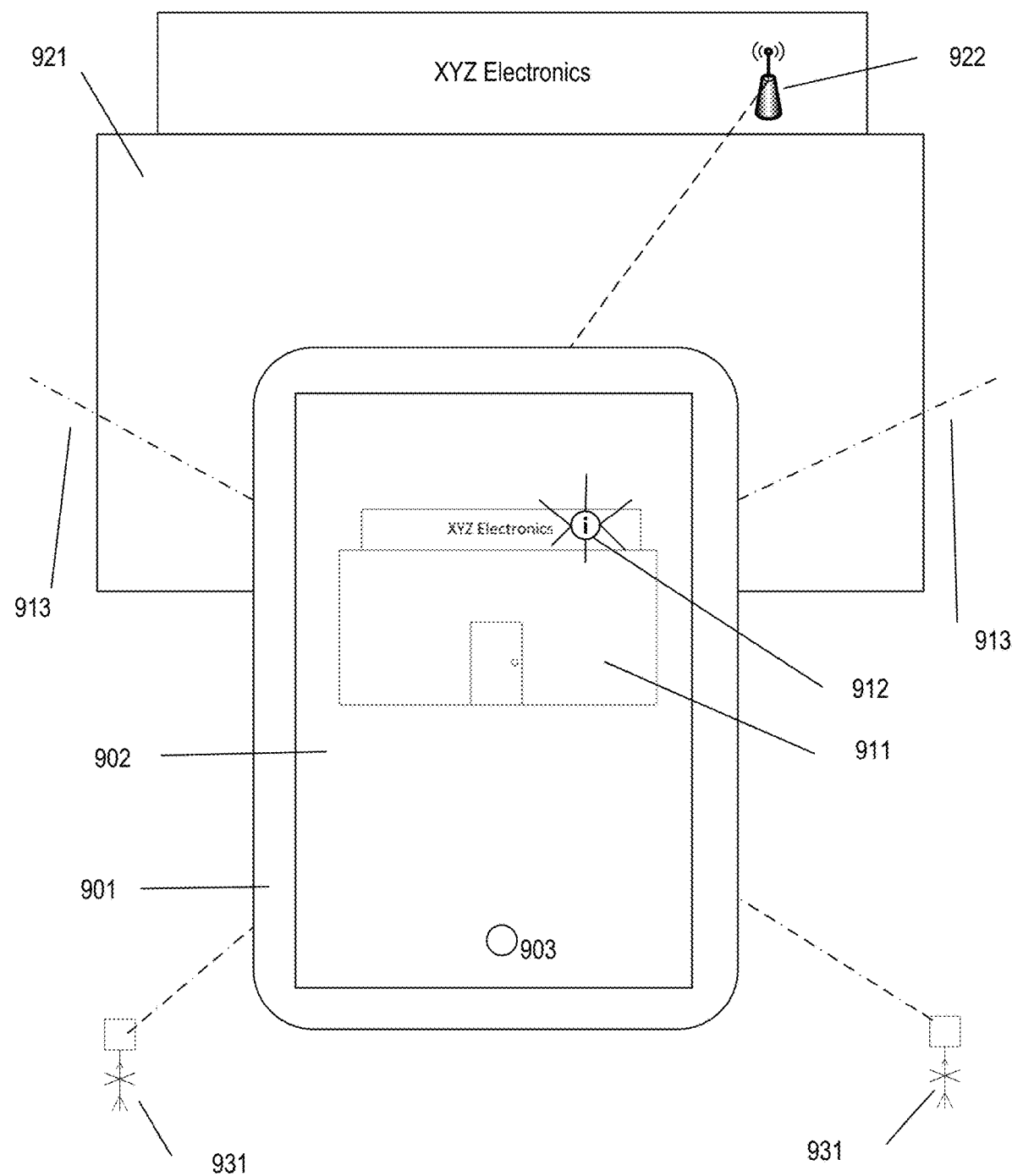
FIGS. 9A-9C illustrate additional aspects of information display.

Referring to illustration FIG. 9A, an exemplary apparatus for effectuating the methods described herein is shown, wherein Smart Device 901 has within its Radio Target Area a Structure 921. Smart Device 901 may display a User Interface in smart Device Display 902 based upon data generated by an Energy-Receiving Sensor 903 incorporated into the Smart Device 901 or operative in conjunction with the Smart Device 901. The Energy-Receiving Sensor 903 may produce data representative of an area from which the Energy-Receiving Sensor 903 received energy. A User Interface in smart Device Display 902 may be generated that is based upon relative values of some or all of the data produced by the Energy-Receiving Sensor 903.

Smart Device 901 may have its position and direction determined using the orienteering methods described herein, with reference to Reference Point Transceiver 931. The position may be determined relative to a Base Node, which may operate as an origin in a coordinate system associated with Structure 921 and its surroundings. The position-determination step may be aided with reference to Transmitter 922, which in some embodiments, may be a Reference Point Transceiver. In this example, Transmitter 922 is positioned proximate to the Structure 921.

A receiver on Smart Device 901 may be operative to receive a wireless logical communication from Transmitter 922. This communication may be in one of a variety of modalities, such as Bluetooth, ultra-wideband, radiofrequency, etc. Based upon the signal, Smart Device 901 may transmit to a server a database query based upon a determined set of coordinates of Transmitter 922.

If the database contains an entry comprising, as a data structure, a set of coordinates proximate to the set of coordinates of Transmitter 922, then Smart Device Display 902 may display Icon 912 proximate to the location of Transmitter 922, as displayed on Smart Device Display 902, or otherwise on the virtual representation of the Shop 911. In this way, a user of Smart Device 901 may be alerted to the presence of information associated with Structure 921 in which the user may be interested.

In some embodiments, Icon 912 may be displayed on Smart Device Display 902 only if Smart Device 901 can transmit appropriate permissions to the database. For example, Icon 912 may only display if Smart Device 901 is on a certain Wi-Fi network or if the user of Smart Device 901 has input the appropriate credentials. In other embodiments, Icon 912 may display on any Smart Device Display 902 (if the Radio Target Area Cone includes Transmitter 922), but further functionality may be based upon inputting a password (or, in some embodiments, correctly input the answer to a question).

In some embodiments, the appearance of Icon 912 may change based upon an identity of the user or based upon some other dynamic. For example, if the user has a certain UUID, and the database includes a message specifically intended for a user with that UUID, then the icon may flash to indicate the presence of a message. This message may be displayed textually, visually, audibly, or by a hologram. Similarly, the database may record each instance in which it is accessed by a query from a Smart Device. Such a record may include a time stamp. If data related to Structure 921 has changed since the last time stamp, then Icon 912 may turn red (for example) to indicate such a change. In addition, digital content may be appended to any content already in the database, such as additional alphanumeric annotation, an audio file, an image file, a video file, or a story file.

Activation of an interactive user device encompassing Icon 912, additional functionality may be provided to the user of the Smart Device 901. For example, selecting Icon 912 may display information about Structure 921, such as shop hours or discounts. Alternatively, activating the interactive user device associated with Icon 912 may generate a control panel, which may allow the user to control aspects relating to sensors or other electronics within Structure 921. For example, upon confirmation that Smart Device 901 has the appropriate permissions, selecting Icon 912 may allow the user to turn off the lights within Structure 921.

The Smart Device 901 may also display other functional buttons on its smart Device Display 902. In some examples, one such function may be to show displays of the sensor RTA 913 in the context of the universal Radio Target Area surrounding the user. By activating the functional button, the user may be presented with a set of options to display the universal Radio Target Area.

Figure 9B:
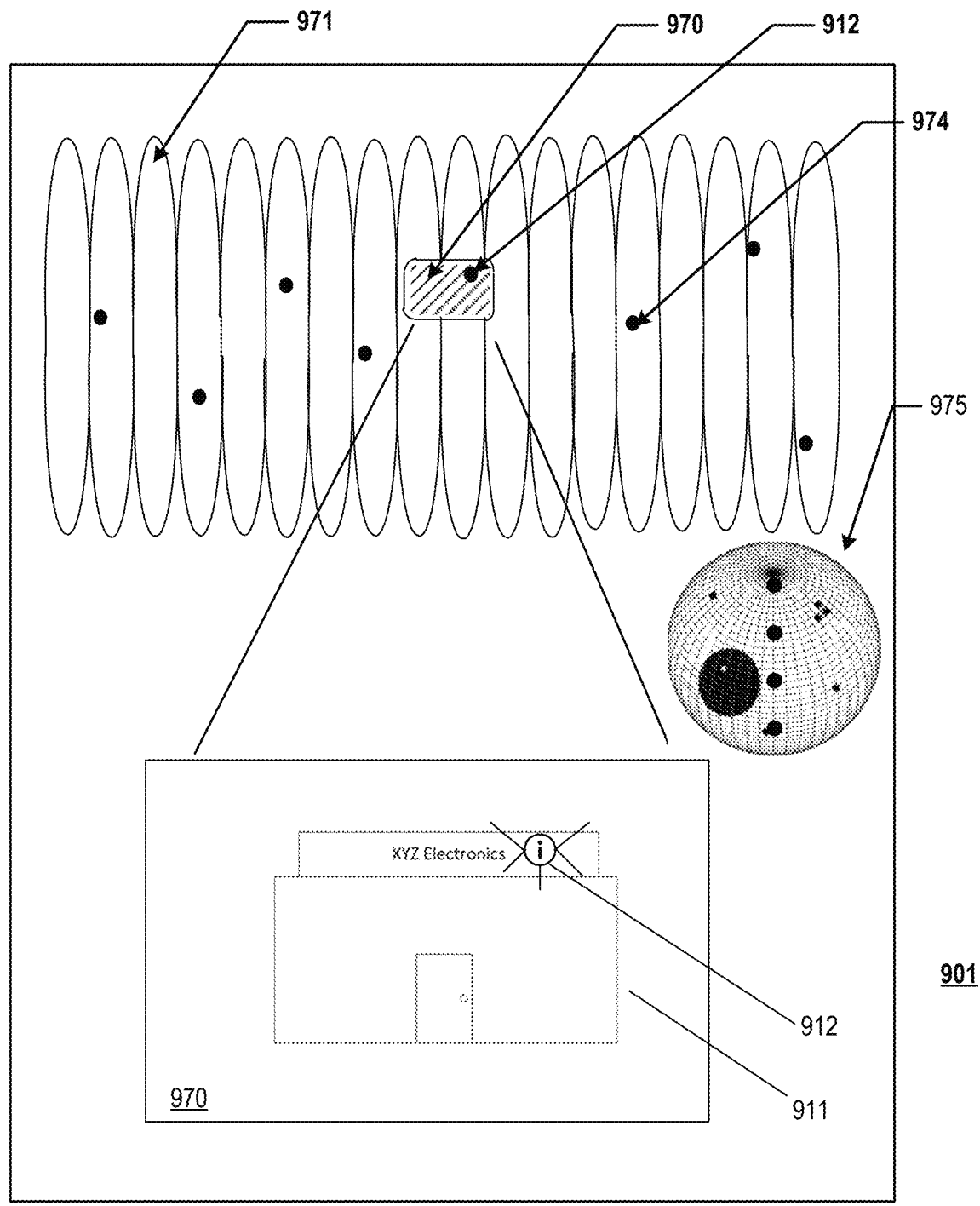

Referring to illustration FIG. 9B, an example of a means of illustrating an RTA 970 is provided. The display screen of the Smart Device 901 may display a number of information components. A similar illustration as FIG. 8G may be included as Inset 975. However, a different illustration of the RTA 970 may be formed by flattening the surface of the illustrated sphere into a flat depiction where each of the surface regions may be flattened into a Segment 971. The RTA 970 may be illustrated on the flat segments. A Tag or Icon 912 may be located within the device RTA 970 showing Structure 921. The Icon 912 may also be included in the real time display of a representation of data generated by an energy-receiving Sensor. Tags may also be located outside of the RTA 970. An Agent may move around the Smart Device 901 to locate an RTA that encompasses Tag 974.

Figure 9C:
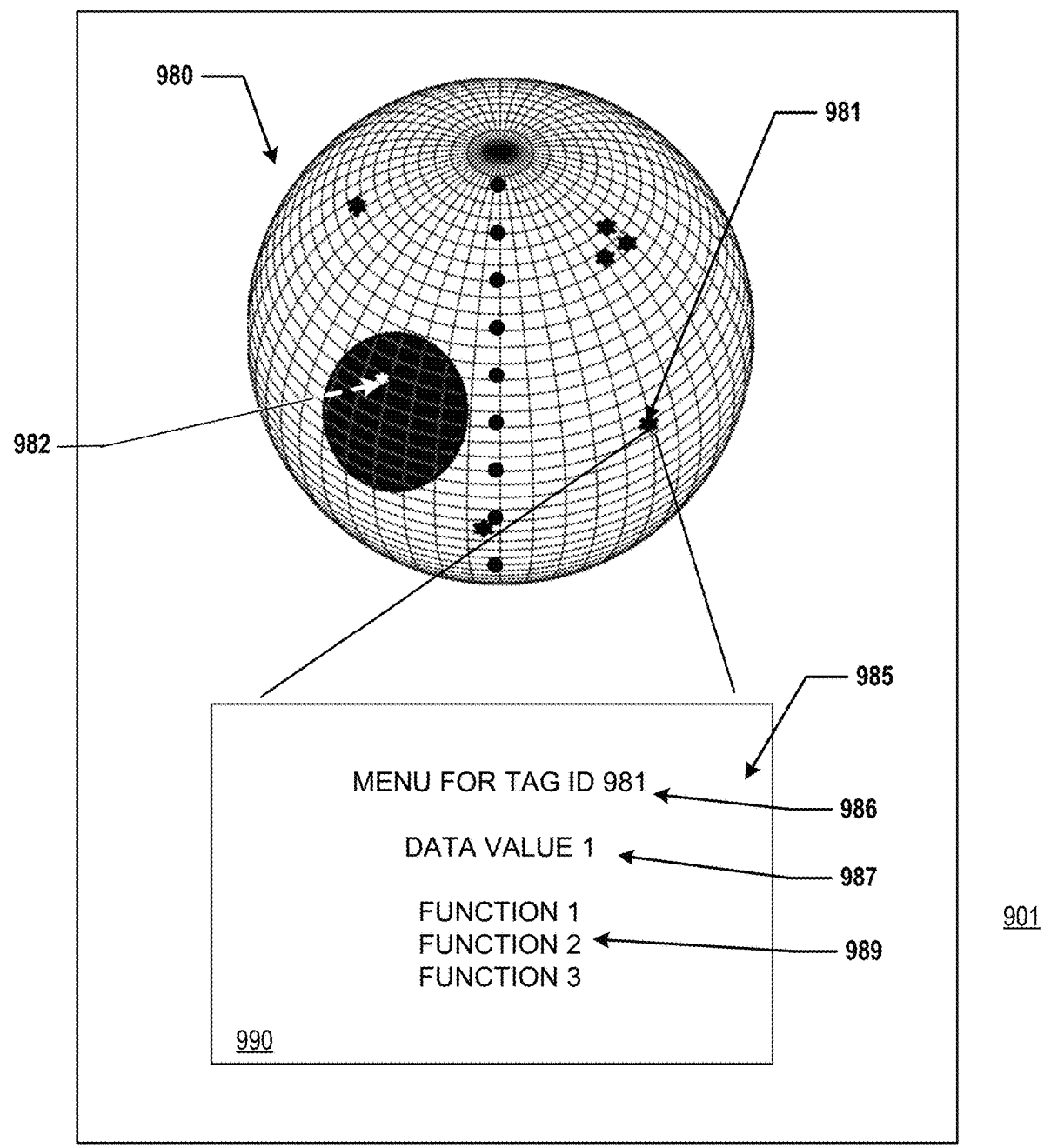

Referring to FIG. 9C, Item 980, an Exemplary Display Screen 990 for Smart Device 901 that may be displayed when a user activates a Tag at a location outside the RTA 982 is illustrated. When the user activates the exemplary Tag 981, a Menu 985 may display. Amongst the various information such as text, imagery, video content and the like that may be displayed an identification of the Tag 986, associated textual information and Data 987 as well as functional Buttons 989 may be displayed on the user interface and may be used by the user to activate additional function including new display layers, content integration and control function such as in a non-limiting sense a control to revert to a previous menu display.

In some examples, a Smart Device 901 may function as a Tag. The Tag functionality may include providing location-related information as broadcasted digital content. In providing such broadcasted digital content, the Smart Device tab may employ numerous forms of security protocols for the protection of the information and authorization of its use which may include sign-in/password protocols, sharing of encryption keys and the like. In similar methods, a central server may provide content related to a Tag and may manage security protocols and the like where a Smart Device acting as a Tag may merely share an identification phrase that a user could use with applications running or connecting with the central server could use to be authorized for additional content. Location may be determined by the various means as described herein including wireless communication with position Nodes by GPS, Cellular, Wi-Fi, Ultrawideband, Bluetooth, and the like. If the Smart Device is operating in a mesh Node, the mesh could communicate within Nodes relative and absolute location information, which the Smart Device may share as its role as a Tag, in addition to location, and other sensor data at the Smart Device such as temperature, vibration, sensor imagery, LiDAR scan imagery, and sound sensing.

In addition to real-world data, the Smart Device Tag may also provide virtual content associated with itself and its connected environment. The Smart Device may provide content stored within its memory devices and may provide dynamically calculated results of processing on content stored in its memory devices. The virtual content may also correspond to a user interface of the Smart Device Tag that may be used to initiate or authorize functions of the Smart Device including real-world activities such a communication via internet protocol, text, phone, or video.

In some embodiments, an energy-receiving Sensor may receive energy associated with a LiDAR transmission and/or other functionality involved in LiDAR scanning which can be used to interrogate the local environment for physical shapes. In a Smart Device Tag function, the Smart Device may stream its video and scanning data directly or through a server model. Some Smart Devices may be configured to operate as smart security monitoring systems and may provide the video, topographic, audio, and other sensor streams as Tag related content. There may be numerous manners that a Smart Device could function as a Tag in an environment.

A Smart Device with either a single- or multiple-sensor system may also have a LiDAR scanning capability or other three-dimensional scanning capability. The Smart Device may utilize a number of systems to refine and improve its accuracy in determining the location that it is at. In an example, a Smart Device may utilize a GPS or cellular system to get an approximate location of the device. In a next step, a user may initiate the Smart Device to take a series of image and scanning data acquisitions of its environment. For example, the user may move the phone by hand toward different directions while maintaining their feet in a fixed location. The phone may use one of the orientation methods as have been discussed to determine its orientation as it is moved to different vantage points. The Smart Device may either process those images and compare against a database in its memory, or it may communicate the data to a server to do the comparison. With an approximate location, the orientation information, and the streams of video and/or topographic information, a calculation may be performed to match the image/topographic information to a more exact positional location. In alternative examples, the device may use the image and/or topographic information to determine the orientation of the device itself.

In some examples, the Smart Device may act as a receiver of one or multiple types of wireless energy input. For example, the acquisition of data based upon a visual light spectrum (approximately 380 to 700 nm wavelength) may be modelled as spatially characterized electromagnetic energy. Electromagnetic energy in the visible band may enter a focusing lens and be focused up an array of devices. The devices may be CMOS-active pixel sensors, CMOS back-illuminated sensors, or CCDs, as non-limiting examples, to receive the energy and convert it into spatially arrayed pixel data.

In some examples, the Smart Device may have an energy-receiving Sensor incorporated or attached which may quantify energy levels for frequencies outside the visible spectrum. Any optics employed in such sensors may be different from the previously discussed CMOS and CCD Sensors since some of those energy receiving devices may have filters or lenses that absorb wavelengths outside of the visible spectrum. Sensors with infrared capabilities may have specialized optics and may use different materials for the CMOS and CCD elements—such as indium gallium arsenide-based sensors for wavelengths in the regime of 0.7-2.5 µm.

Alternatively, entirely different sensing elements, such as bolometers, which sense temperature differences of the incoming radiation, may be employed for longer wavelengths in the regime of 7-14 µm and may include filters that remove other wavelengths. A display of an infrared Sensor, which senses incoming energy in the infrared band, may be rendered on a typical visual display, but the colors of such displays may have no direct physical meaning. Instead, a color scheme may be instituted to represent different infrared wavelengths with different visible colors. Alternatively, the colors may be used to represent different intensities of infrared energy received across bands of infrared wavelengths.

In some examples, a Smart Device may both project and receive energy. For example, a Smart Device may scan the topography of its surroundings by use of LiDAR. In LiDAR, a laser may be used to emit energy into the environment. The energy may be emitted as pulses or continuous trains, and the light source may be scanned across the environment. Light emitted from the Smart Device may proceed into the environment until it is absorbed or reflected. When it is reflected and subsequently received at the Sensor, the transit time can be converted to distance measurements of the environment. Many different wavelengths of light may be used to scan an environment, but numerous factors may favor certain choices such as invisibility to human/animal eyes, safety, absorption by the airspace surrounding the user and the like. Atmospheric gases may absorb significant amounts of infrared transmissions at certain frequencies; therefore, for LiDAR to be effective in the infrared spectral region, certain bands of emitted frequencies may be favored. A standard LiDAR system may operate at a band from 900-1100 nm infrared wavelength or at a band centered at approximately 1550 nm. As discussed previously, select optic components and materials may be useful for these wavelengths and the detectors may have improved function based on materials such as "black" silicon, germanium, indium phosphide, gallium arsenide, and indium gallium arsenide as exemplary detector materials.

In an example, a laser light source may be rastered across a dimension of forward-looking positions of a Smart Device, which may be represented by a conic section or Radio Target Area in front of the Smart Device. As the light is raster across the surface it can address, it may be pulsed on or off. As the light travels out along a collimated path, it may interact with a surface and a portion of the intensity may be reflected backwards.

A resulting reflected ray may come back to the Smart Device and be received by a Sensor in the device. Since the emitted light source may be orders of magnitude more intense than the surroundings, reflected light may dominate a background intensity and the signal detected may be compared with the time of the leading edge of the laser pulse. The repeated acquisition of the timing signals in the various directions can be used to form a point cloud that represents the distance to reflective features from the Smart Device.

As mentioned previously, sound may be reflected off of surfaces and the transit time may be used to characterize a distance between a focused ultrasonic transducer and a reflective surface. In similar manners, points or lines of focused sound emissions may be pulsed at the environment and a sensor or array of sensors may detect the reflected signals and feed the result to a controller which may calculate point cloud representation or other or topographic line representations of the measured surface topography. In some examples, ultrasonic focused and scanned soundwaves in the frequency range of hundreds of megahertz may result in small, focused sources whose reflections may be detected by magnetic or piezoelectric sound transducers as non-limiting examples.

A Smart Device may have numerous different types of energy-collection devices which may characterize data values with spatial relevance. As mentioned before, infrared imaging may be performed on some Smart Devices, and a user may desire to view a spatial representation of the infrared imaging that represents the data as it may appear if the user's eyes could perceive the energy. In some examples, data values for the wireless energy sensing of infrared energy may be assigned color values and displayed in an image format. For example, low levels of infrared energy, which may relate to colder temperatures in the imaged regions, may be assigned blue color values, and high levels of infrared energy, which may relate to warmer temperatures, may be assigned red color values. Other color assignments to data values may be used. A legend for the conversion of the color values to the data values may be provided.

In some examples, the data descriptive of spatially descriptive energy levels quantified by an Energy-Receiving Sensor data may be portrayed in a user interface. In some user interfaces, representations based upon spatially representative energy levels of different wavelengths may be aggregated or otherwise combined in one or more related user interfaces. Such a combination may allow a user to understand the regional nature of various quantified energy.

In some examples, a user interface may allow for display of the positional location image points. In some examples, a location of a pixel element chosen by a user may be converted to a real-world location within the RTA which may be represented in Cartesian coordinates (X, Y, Z) or in other coordinate systems such as polar coordinate systems involving angles and distances as discussed previously. In some examples, topographic data obtained by scanning an area with an RTA may be used to quantify topography within the RTA. A user interface based upon such quantified energy levels may include virtual presentations of the quantified energy levels from different perspectives and may allow for coordinate grids (Cartesian or other) to coordinate placement of facets of a user interface based upon combinations of energy level data, Tag locations and perspective relevance.

In some examples, distinct structures within the RTA may be highlighted and assigned positional coordinates. In some examples, this may occur by image processing directly, in other examples a user interface may allow for a user to pick items/regions of interest in an RTA presentation.

In other examples, real and virtual Tags may exist within the RTA. A physical Tag may include a position Node, another Smart Device, or any device with communication capability that can communicate with either a position Node or with the Smart Device of the user directly. Such physical Tags may be located in numerous manners. In some examples, the physical Tag may have a direct determination of its location either because it is stationary and has been programmed with its location or because it has the capability of determining its own position with the various methods as have been described herein. In other examples, a physical Tag may be able to communicate with Nodes such as Reference Position Transceivers and a location may be determined based upon an exchange of data, such as timing values, in the wireless communications. A Node may also be functional to determine, store and communicate a location of other Tags. The Smart Device of the user may gain access to the locations of Tags, either because they are publicly available or because the user has established rights digitally to obtain the information from some or all of these physical Tags.

There may also be virtual Tags that are associated with positional coordinates. The distinction of these Tags over physical Tags is that there may be no physical presence to the virtual Tag. It may be a digital or virtual-world entity that has an association with a real-world positional coordinate. Except for this distinction, a virtual Tag and a real-world Tag may behave similarly with respect to their association with a physical coordinate.

In these examples, an interactive user interface based upon energy levels and Tags located with an RTA may have icons associated with the placement of Tags. The user interface may include an icon positional designation and a graphic to indicate the presence of a Tag. It may be apparent that, in some cases, multiple Tags may lay along a single direction from a given Smart Device location and RTA, and thus multiple icons may be included within a user interface in close proximity. The user interface may indicate multiple Tag icons by color changes, blinking or other indicators. As an RTA is changed, Tags along a same perspective may resolve into different directions for Tags with different positional coordinates.

The Tag icon may indicate to the user a digital functionality associated with a real-world or virtual Tag. For example, the icon may allow a user to choose the functionality of the icon by moving a cursor over the icon and making a keystroke or mouse click or for touch screens by pressing the display location of the Tag icon. The choosing of the Tag icon may activate user interface dialogs to allow the user to control subsequent functionality. In cases of superimposed Tag icons on a same pixel location in a user display, a first functionality may allow the user to choose one of the multiple Tag icons to interact with. In some examples, a Tag icon may be displayed with an associated ID/name and a user may select the icon with voice commands rather than physically selecting the icon as described previously. Displays of these Tags may follow similar protocols as have been discussed in reference to FIGS. 9A-9D.

Referring now to FIG. 10A, a method for generating an augmented-reality Radio Target Area for a Smart Device is shown. At step 1001, wireless energy of a first wavelength is received into a wireless receiver. In exemplary embodiments, this step may include receiving image data based on visible light into a sensor of the Smart Device. The wireless energy may be dispersed over a one-, two-, or three-dimensional space in a defined physical area, and may be received into a one-, two-, or three-dimensional array in the receiver. The wireless energy may take the form of electromagnetic radiation, such as light in the human-visible light spectrum (generally having a wavelength between 380 nm-740 nm), ultraviolet light (generally having a wavelength between 10.0 nm-400 nm), or infrared light (generally having a wavelength between 740 nm-2.00 mm) as examples. The set of wireless energy available to the wireless receiver is the Smart Device's Radio Target Area.

The wireless receiver may be a Smart Device sensor, including a CMOS active pixel sensor, a CMOS back illuminated sensors, CCD, or a LIDAR apparatus, including a solid-state/MEMS-based LIDAR. The wireless receiver may comprise an array or other plurality of other wireless receivers. The wireless receiver may be operative to receive the wireless energy into an array of an appropriate dimension for subsequent display (possibly after processing) on the Smart Device. For example, where the wireless receiver is a Sensor, the Sensor may be operative to translate the wireless energy into a two-dimensional array.

At step 1002, a pattern of digital values is generated based upon receipt of wireless energy into the wireless receiver. This pattern of digital values may be based on one or more qualities of the received wireless energy, including its intensity, spatial dispersion, wavelength, or angle of arrival. The pattern may be placed into an appropriate array. For example, if the display of the Smart Device is a two-dimensional display, then the pattern of digital values may comprise a two-dimensional representation of the image data received. In some embodiments, the pattern of digital values may be based on an aggregated set of values from an array of receivers. For example, if the basis of the digital values is the intensity of the wireless energy received into the receiver, then the digital value assigned to a given entry in the array may be based on a weighted average of intensity of wireless energy received at a plurality of the receivers in the array. Optionally, at step 1003, the wireless receiver may receive the wireless energy as an analog signal (for example, if the wireless receiver is a black-and-white sensor or an unfiltered CCD) and convert the analog signal to digital values through filtration or other analog-to-digital conversion. The set of digital values within the Radio Target Area is the Digital Radio Target Area.

With the Smart Device wireless receiver's Radio Target Area determined, the Smart Device's position should be determined as well, along with the positions of any items of interest in a given space. Collectively, the Smart Device and the item of interest may comprise wireless Nodes. Accordingly, at step 1004, coordinates representative of a wireless Node may be determined relative to a base Node. These coordinates may be determined in any appropriate coordinate system (such as Cartesian, polar, spherical polar, or cylindrical polar) and may be determined via RTLS or the orienteering-triangulation methods with various wavelengths or modalities, such as ultra-wideband, Bluetooth, etc. Additionally, the coordinates may be determined using an angle of arrival or angle of departure of a signal to or from the base Node, along with the distance from the base Node. By way of non-limiting example, this could produce a dataset that correlates the coordinates of three elements with the identities of those elements: {(0,0,0), BaseNode; (1,1,1), SmartDevice; (2,2,2), ItemOfInterest}. While this example may be used throughout the following discussion, it is understood to be non-limiting, as a given space may include a plurality of items of interest. Note that, in some embodiments, the Smart Device itself may become a dynamic database entry with a continuously (or periodically) updating set of coordinates. This may be useful in allowing a plurality of Smart Devices engaged with the system at the same time to interact with one another.

At step 1005, the position of the Base Node is determined relative to the defined physical area. In exemplary embodiments, this may include establishing the Base Node as an origin in the coordinate system and determining vectors from the Base Node to boundaries and items of interest (i.e., the distance from the Base Node and the direction from the Base Node to the boundaries and items of interest). In some examples, the Base Node may have an established reference relative to a global coordinate system established.

At step 1006, a Target Area is generated within a controller of the Smart Device. The Target Area may be the set of coordinates (relative to the Base Node) within the Radio Target Area of the wireless receiver. The Target Area may be limited by the physical boundaries of the given space, such as walls, floors, ceilings, occlusions, etc. The Target Area may also be limited by distances that various types of signals may travel. For example, a sensor of audio signals may not be able to practically pickup signals over a background noise level that originate more than 1000 feet from a user position, purely as an example. In such a case, the Target Area for such signal types may be limited to that dimension.

At step 1007, respective positions of one or more wireless Nodes within the Target Area are determined. These positions may be determined relative to the physical Target Area or the Radio Target Area. The determination may be made with reference to the dataset discussed at step 1005, or it may be made dynamically based upon one or more Base Nodes and/or the Radio Target Area. Moreover, the determination may additionally be based on receipt of a wireless signal into the Smart Device from the wireless Node. This signal may indicate a position using the orienteering methods described herein.

At step 1008, a user interface may be generated on the Smart Device based upon the pattern of digital values generated at step 1002. The user interface may comprise a plurality of pixels, wherein each pixel comprises a visible color based upon the pattern of digital values generated at step 1002. For example, if the digital values were based upon receipt of visible light into the wireless receiver (e.g., a sensor), then the display may reflect a reasonably accurate color photograph of the Radio Target Area of the wireless receiver. If the digital values were based upon an intensity of received light from, for example, LIDAR, then the display may reflect a scan of the Radio Target Area. In some embodiments, the pixel may include an intensity of energy received into the receiver. In this way, aspects of the Radio Target Area characterized by an intensity of energy may be emphasized. For example, this may produce a LIDAR relief of an area or a heatmap of an area.

At step 1009, an icon may be generated in the user interface. Preferably the icon will be placed at a position relative to data quantifying received energy levels. In some embodiments, the icon location in a user interface will be indicative of a position of a Tag (Virtual or Physical). This position may be quantified via positional coordinates, such as Cartesian Coordinates, Polar Coordinates, Spherical Coordinates, and the like. The icon may be based upon an input from a user, stored data, quantified environmental conditions or other criteria related to an aspect of the Radio Target Area.

For example, an icon may indicate information about an Item of Interest located at a given set of coordinates within the Radio Target Area or Digital Radio Target Area. In another embodiment, the user may indicate on the display a position in which the user wishes to place an icon and add information about an Item of Interest (thus creating a new entry in the database, which may be populated with the coordinates of the indicated position). Moreover, the icon may change colors based upon the pattern of digital values. The icon may be overlaid on top of the display. The icon may resemble the letter "i," a question mark, a thumbnail, or any other suitable image from a library. In some embodiments, the icon may change depending on one or more attributes of its corresponding database entry. For example, if the icon located at (4,4,4) relates to a restaurant menu, then the icon may resemble the letter "i" or a thumbnail of a menu. On the other hand, if this database entry is modified so that the corresponding database entry is a message, then the icon may update to a picture of an envelope.

In some embodiments, the icon-generation step may be based upon an inquiry to a database that uses the Digital Radio Target Area as an input. For example, upon generation of the Digital Radio Target Area, an associated set of coordinates in one or more dimensions may be generated. This may then be submitted to a database. An associated display may be as illustrated in FIG. 9A. In some embodiments, the icon-generation step may be based upon an inquiry to a database that uses the user's position coordinates as an input. In these embodiments, both the Digital Radio Target Area based on an RTA as well as the universal Radio Target Area may be included in an inquiry submitted to the database. An associated display may be as illustrated in FIG. 9C. In some examples, the user may have an option to limit or filter the types of database entries that may be queried for, such as in a non-limiting sense, the existence of real-world Tags, virtual Tags, sensor data values and streams from a particular class of sensors and the like.

Continuing with the example from step 1004, the Digital Radio Target Area may comprise the set of coordinates: ([1.5,10], [1.5,10], [1.5,10]). In this example, the database may return information about the Item of Interest, but not about the Base Node. The Digital Radio Target Area may update when the Smart Device position changes, or by user input, the Digital Radio Target Area may remain static after a certain instance in time.

Figure 10B:
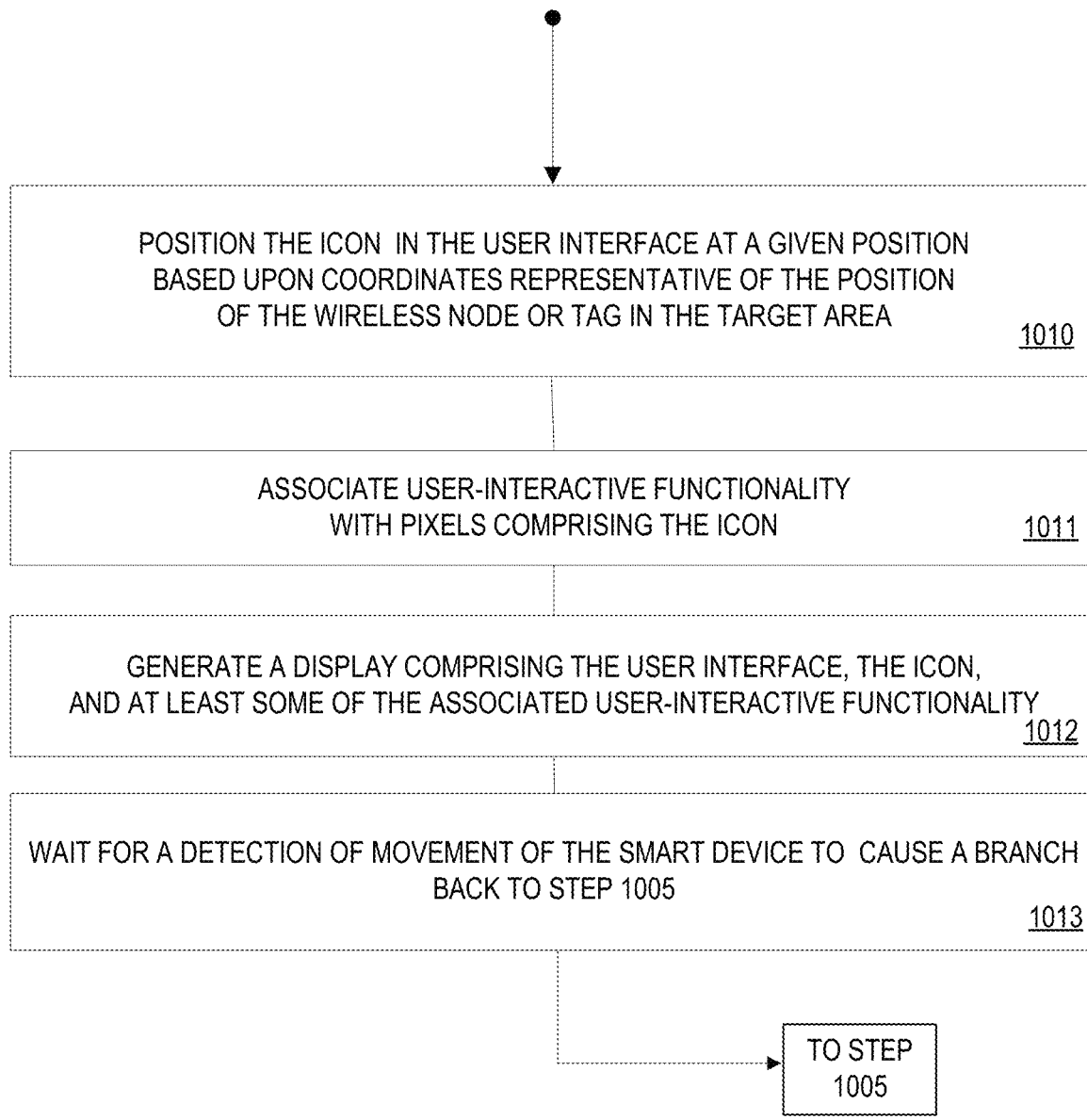

Continuing with FIG. 10B, at step 1010, the icon may be positioned in the user interface at a given position based upon coordinates representative of the position of the wireless Node or Tag in the Target Area. This may comprise a selection of a multitude of pixels related to the position of the wireless Node or Tag and changing those pixels from the digital values determined at step 1002 to a second set of pixels to indicate the presence of an icon. In some embodiments, the icon may be dynamically updated based upon movement of the Smart Device (and, accordingly, the wireless receiver). In some embodiments, the icon may be permanently associated with a set of coordinates. In such embodiments, the icon may be generated whenever a Smart Device with appropriate permissions includes in its Radio Target Area the set of coordinates of Nodes or Tags associated with the icon.

At step 1011, user-interactive functionality may be associated with the pixels comprising the icon. This may allow the user to "select" the icon by means of an input device (e.g., mouse, touchpad, keyboard), touchscreen, digital input, etc. Upon selection, the icon may be operative to interact with the user in one or more ways, including: displaying a message intended for the user (by text, audio, video, hologram, etc.); requesting credentials from the user to verify permissions (e.g., a password), displaying information about an item associated with the icon, prompting the user to update information about an item associated with the icon, etc. The user-interactive functionality may display static information (e.g., dimensions of the item), display dynamic information (e.g., an alarm state or sensor information relating to the item; for example, if the item is a refrigerator, internal temperature may be displayed), or produce a control panel that allows the user to issue control commands (e.g., remotely operating an automated apparatus by resetting an alarm state, taking remedial action based upon a sensor state as described herein, etc.) or to issue menu control commands such as to invoke a different user interface or screen of a user interface.

This may be useful in geospatial applications, or in procedurally generated activities. For example, a first user may generate a positional designation on a user interactive device, such as, for example, an augmented-reality display to leave a narrative, icon or other input associated with the first use. Additionally, the same or another user may log positional coordinates and upload an image that could be displayed submitting a database query including those coordinates. Entry of the coordinates and essential credentials may provide access to the content associated with the positional coordinates.

At step 1012, the preceding steps may be integrated by generating a display comprising the user interface, the icon, and at least some of the associated user-interactive functionality. In embodiments, in which a plurality of Smart Devices are themselves part of the database, this may allow various users to send messages, images, etc. to each other.

At step 1013, detection of movement of the Smart device may cause a branch back to step 1005. Based upon that movement of the Smart Device, a defined physical area from which wireless energy is received (i.e., the Radio Target Area based upon the Target Area) may be changed. The movement may be detected using input from wireless communications, magnetic field sensors, an accelerometer, feature-recognition software, or other similar apparatus and algorithms. In other examples, the position of the Smart Device may be dynamically obtained using any of the techniques of position determination, such as triangulation with reference nodes. Here, too, a change of position detected in this manner may cause a branch back to step 1005. The Target Area may be based upon the position of the Base Node, the relative positions of the wireless Nodes, and the Smart Device.

Figure 11:
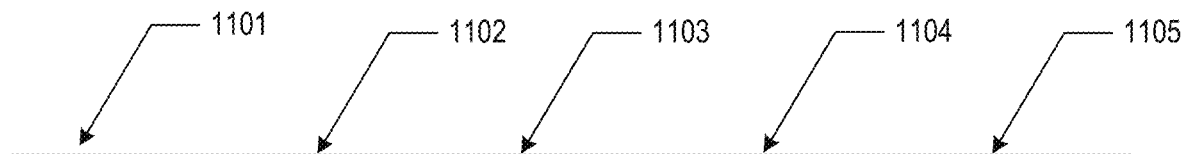
FIG. 11 illustrates an exemplary database structure according to the instant specification.

Referring now to FIG. 11, an exemplary database structure usable in conjunction with the present disclosure is shown. In this non-limiting example, the database has five sets of information: Coordinates 1101 associated with an action, Permissions 1102 associated with the action, the Type 1103 of action, Attributes 1104 for the action, and Notes 1105. The example shown in FIG. 11 may suppose the following: the augmented-reality system is deployed in an enclosed space, definable by a coordinate system set relative to a Base Node having an origin point (0,0,0); the enclosed space spans, in that coordinate system, ([0, 10], [0, 10], [0, 10]) (in some embodiments, each coordinate may include an alphanumeric number, digital number, hexadecimal number or other quantifiable value); and the Radio Target Area is ([1, 10], [1, 10], [1,10]).

The bolded entries in the database shown in FIG. 11 represent the database responses to the query given by the Radio Target Area of the Smart Device; i.e., all entries having a Coordinate value within the Radio Target Area. In some embodiments, the database may sort through all coordinates within the Radio Target Area and then return any entries for which the Smart Device has appropriate permissions. In other embodiments, the database may sort through all entries for which the Smart Device has appropriate permissions and then return any entries with coordinates within the Radio Target Area. The latter approach may be beneficial in circumstances in which there are numerous database entries with varying permissions; for example, if a database has 10,000,000 entries, but a given user might only have access to five of those entries, sorting by permissions first may be more beneficial.

The ActionType variable may include any action for which interactivity with an icon may be desirable. In FIG. 11, the ActionType variables shown are Information, Message, Action, and Directions. Each of these represents functionalities within the scope of this disclosure. For example, Information may relate to information that the Smart Device user may find helpful. Continuing with the shop example from FIG. 9A, Information may include store hours, discounts, reviews, etc. Similarly, Message may be a message to the general public (e.g., an announcement), or a message tailored to a specific user. In the latter case, permissions may operate to ensure that only the specific user (or set of users) may access the Message.

Action may relate to any action that a sensor, electronic device, or other apparatus connected to the database may take. For example, Action may include changing a temperature, measuring a temperature, turning off lights, activating an emergency sprinkler system, opening a door, etc. In some embodiments, prior to taking the Action, a password may be requested as part of the permission check.

Directions may show a user how to navigate (using, in exemplary embodiments, orienteering methods) from the current position to a desired position. For example, upon scanning an entry on a map, virtual arrows may be generated to guide the user to a chosen store.

The ActionAttributes may have attributes based on the ActionType. For example, if the ActionType is Information or Message, then the ActionAttributes may be a text string or a stored audiovisual file containing the message. Similarly, if the ActionType requires a sensor or other electronic device to take an Action, then the ActionAttributes may include a command or subroutine to effect such an Action. In the example shown here, the ActionType Directions comprises an ActionAttribute that includes a command to the Smart Device (i.e., show directions in the form of green arrows).

Figure 12:
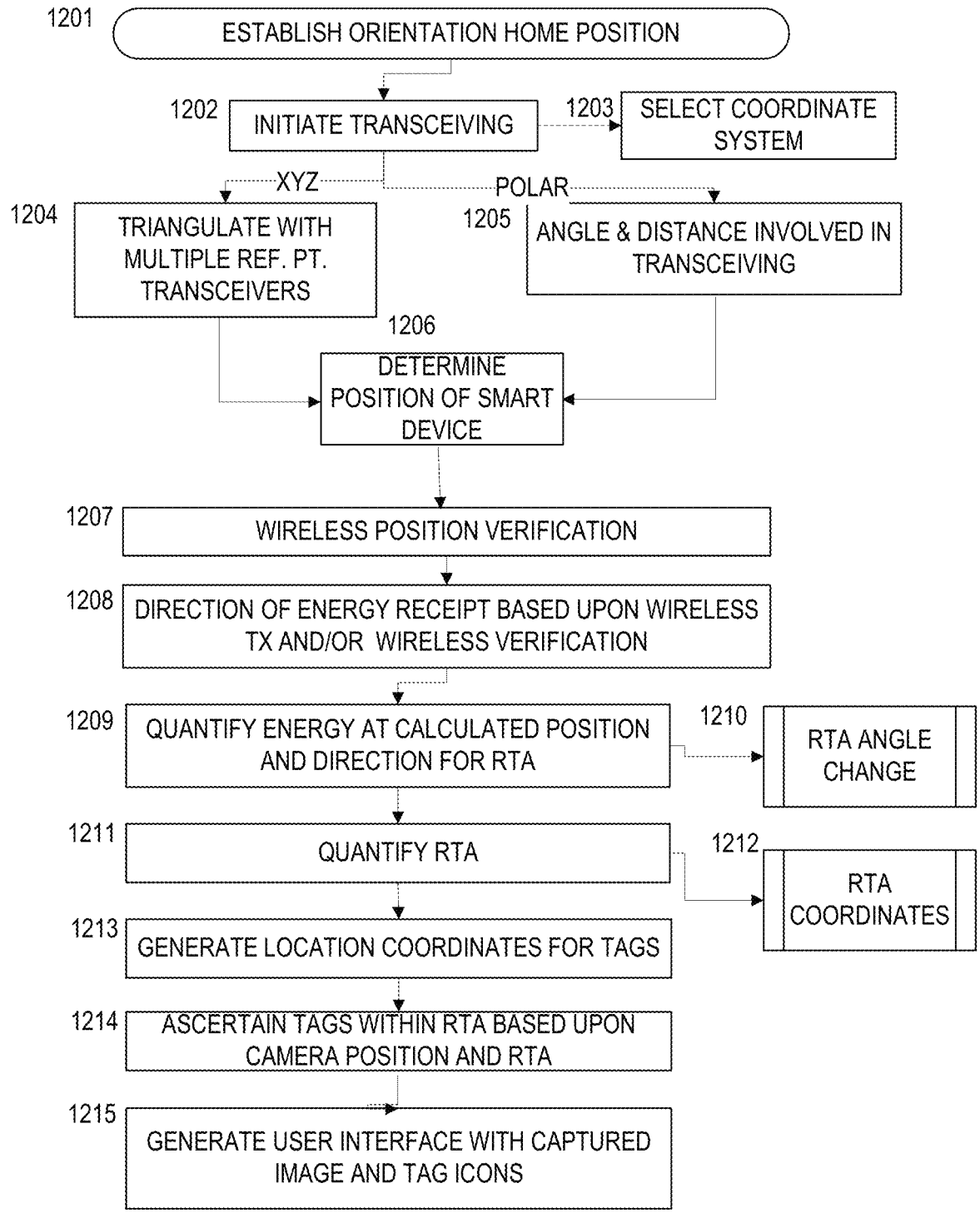
FIG. 12 illustrates an additional exemplary method for displaying Radio Target Areas with Smart Devices.

Referring to FIG. 12, an illustration of alternative methods for display of information relating to RTA is provided. At the beginning of the process, a system of components which may include a smart device with a user of the smart device may be established. Amongst the various components a Home Position may be established for all the components at step 1201. The system may proceed by establishing and initiating transceiving of data and information at step 1202.

In some examples, the user may be prompted to choose a desired coordinate system for the display at step 1203. In other examples, a user interface of the system may have a setpoint function which the user may invoke to gain access to user settable parameters which may include the type of coordinate system to use, such as for example Cartesian or spherical coordinates.

In still further examples, the system may decide to default to a particular coordinate system depending on the nature of the type of data its positional reference devices may be obtaining or providing.

At step 1204, if the coordinate system was chosen as Cartesian coordinates, the system may utilize triangulation amongst multiple reference Position Transceivers. Alternatively, at step 1205 if the coordinate system was chosen as polar coordinates, the system may utilize positioning systems that utilize angles and distances involved in transceiving and location. In either event, at step 1206, the position of a Sensor attached to the smart device of the user may be determined. In some examples, the system may have multiple and redundant location systems. A combination of such position determinations may result in superior accuracy of an aggregated position result. Accordingly, at optional step 1207, a wireless position determination may be performed with the smart device to establish a verification of the position of the Smart Device and the Sensor attached. Referring now to step 1208, a direction that the sensor is facing may be determined. Although there may be a number of different manners of determining orientation as have been described herein, in an example, the orientation may be determined based upon wireless transmission and/or wireless verification.

Referring now to step 1209, an energy-receiving Sensor included in the Smart Device or in logical communication with the Smart Device may be used to quantify energy levels perceivable at the position and in the direction of the Smart Device. The resulting quantification may depend on aspects of the Sensor device, but the resulting data will quantify a characteristic for the RTA.

In some embodiments, an optional step 1210 may be performed by an element of the system such as the smart device or a server in communication with the Smart Device. The element of the system may compare one or more of position information, orientation information and the image data itself to calculate an estimate of whether the RTA angle has changed for the sensing element.

In general, at step 1211, the RTA of the Sensor device used to capture the image in step 1209 may be quantified. In an optional step 1212, coordinates relating to the instant RTA of the image may be established. In some examples, this may relate to a range of three-dimensional coordinates that are addressed by the RTA of the Sensor element. In general, at step 1213, the system may look up, or in some cases generate, location coordinates for Tags that are determined to be within the quantified RTA. In some database systems that the system may have access to, real-world or virtual-world tags may be tracked in a coordinate system with a certain origin.

If the current origin established at step 1201 is offset from a particular database related origin, then one or both the coordinate system values may be converted to each other to align their respective origins. At step 1214, the Tags in an aligned coordinate system may have their positions compared to the current RTA and a selection for the set of Tags that are within the RTA may be made.

In some alternative examples, a display of all Tags that are authorized for access to the user regardless of whether they are in the RTA may be made using associated aligned coordinates as discussed in reference to step 1213.

Referring now to step 1215, in an example, the Smart Device of the user may be used to generate and display a user interface to the user based upon the captured image and the associated tag icons within the RTA. These associated Tag icons may have at least the functionality as has been discussed in reference to FIGS. 10A and 10B.

Figure 13:
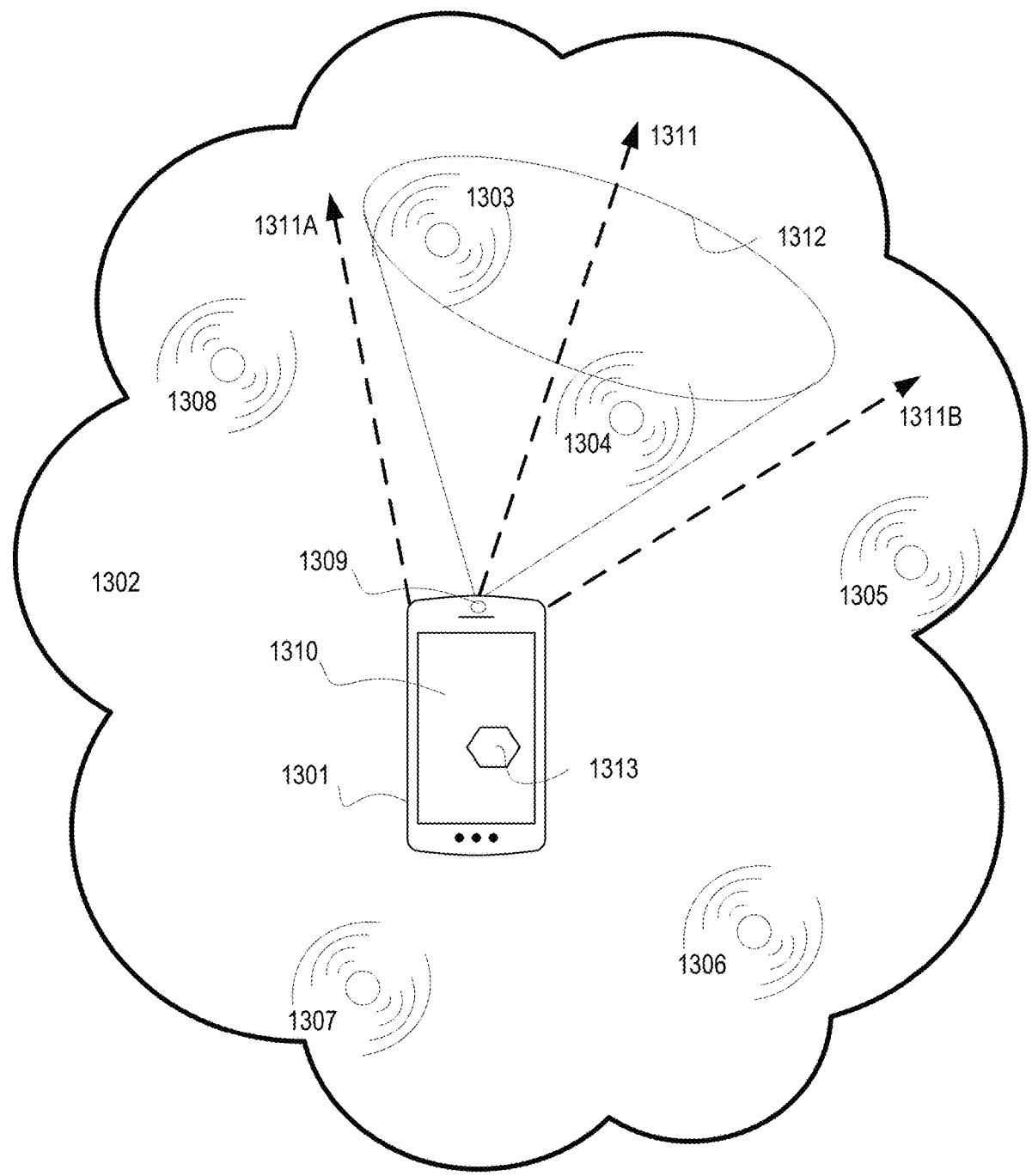
FIG. 13 illustrates exemplary aspects of Wireless Communication Areas in Radio Target Area display.

Referring now to FIG. 13, a Smart Device 1301 is illustrated within a Wireless Communication Area (WCA) 1302. The extent of the particular WCA 1302 may be defined according to a select bandwidth and/or a particular modality of the wireless communication the Smart Device 1301 uses to transmit and receive information.

For example, bandwidths may include those associated with UWB, Wi-Fi, Bluetooth, ANT, ultrasonic, infrared, and cellular modalities of communication. In general, unless otherwise constrained by physical modification such as the use of a directional antenna, or the presence of radio frequency interference from a physical object (such as objects with significant metallic content; objects with high water content; electrical fields; etc.), a WCA 1302 may include spherical area(s) emanating from one or more transceivers and/or transceiver antennas operated by the Smart Device 1301.

As discussed extensively herein, and in patent applications referenced by this application, the location of the Smart Device may be determined based upon wireless communication to and/or from the Smart Device 1301; and described via a coordinate system, such as via generation of Cartesian coordinates, or other coordinates such as: polar coordinates, spherical coordinates, and cylindrical coordinates. Modalities of wireless communications that may be referenced to generate location coordinates may include one or more of: RTT (round trip time), time of flight, RSSI (received signal strength indicator); angle of arrival, angle of departure, and other methods, equipment and modalities as have been described herein.

With the location of the Smart Device 1301 determined, a location of the WCA 1302 may be extrapolated based upon the location of the Smart Device and a range or transceiving distance the Smart Device may be capable of.

According to the present invention, a portion of the WCA 1302 may be selected as a Radio Target Area (RTA) 1312 from which the Smart Device 1301 may receive specific bandwidths of electromagnetic radiation. In preferred embodiments, the RTA 1312 may include a frustum expanding outward in a conical shape from one or more Energy Receivers 1309 included in the Smart Device 1301. The frustum shaped RTA 1312 may overlap with a portion of the generally spherically shaped WCA 1302. Other shapes for a Radio Target Area are also within the scope of this specification.

In some embodiments, a shape of the RTA 1312 may be based upon receiving capabilities of the one or more Energy-Receiver 1309 incorporated into or in logical communication with the Smart Device. For example, energy-Receiver 1309 with a Charge-Coupled Device (CCD) or Complementary Metal Oxide Semiconductor (CMOS) receiver may have a single plane receiving surface and be best matched with a frustum of a generally pyramidal or conical shape. Whereas an Energy Receiver 1309 with multiple receiving surfaces (e.g., with multiple CCD and/or CMOS devices) may be arranged to enable a more complex shaped RTA 1312.

In some preferred embodiments, a Direction of Interest 1311 may intersect the RTA 1312. As discussed herein, the Direction of Interest 1311 may be represented by a Ray or Vector in a Direction of Interest 1311. In addition, the Direction of Interest may be represented as a Direction of Interest area, such as a frustum defined by multiple Rays or Vectors in Direction of Interest 1311, 1311A, and 1311B. In various embodiments, the Direction of Interest 1311 area may encompass the RTA 1312 or be a subset of the RTA 1312.

A Direction of Interest 1311 may be determined for example via the methods and devices described herein and in referenced patent applications and may be associated with a direction based upon a Ray or Vector indicative of a Direction of Interest 1311, a direction based upon a magnetic field sensor, an accelerometer, a light beam, correlation between two Tags or Nodes, Agent gestures, or other Smart Device recognized apparatus and/or method.

One or more Transceivers 1303-1305 (typically included within a Smart Device, Tag, or Node) may be located within an area defined by the RTA 1312. According to the present disclosure, a position of the Transceiver 1303-1305 may be determined and a user interactive mechanism may be generated at a position of the Transceiver 1303-1305 within a graphical user interface emulating aspects of the RTA 1312 on the Smart Device 1301 or another user interactive interface screen (not shown, and perhaps at a site remote to the RTA 1312).

According to the present disclosure, some portion of the RTA 1312 (which may include the entirety of the RTA 1312) may be portrayed on an agent Interface 1310, including, in some embodiments, a human-readable graphical user interface (GUI). The Agent Interface 1310 may include a Representation 1313 of a particular level of electromagnetic energy received via the Energy Receiver 1309 and associated with a particular area of the RTA 1312. For example, energy levels of an infrared wavelength that has emanated from or reflected off of an item in the RTA 1312 and received via an infrared receiver in the Smart Device 1301 may be used to generate a heat map type interface display. Similarly, energy that has emanated from or reflected off of an item in the RTA 1312 in the 400 nm to 700 nm range and been received via a charge-coupled/or CMOS image sensing device in the Smart Device 1301 may be portrayed as a human visible image of items in the area included in the RTA 1312.

Other embodiments may include a point cloud derived from electromagnetic energy bouncing off of or emanating from items included in the RTA 1312 or a series of polygons generated based upon a LIDAR receiver in the Smart Device 1301. An Agent Interface 1310 may be presented in a modality understandable to an Agent type. For example, an interface presented to a UAV or UGV may include a digital pattern and an interface presented to a human Agent may include multiple pixels or voxels generating a pattern visible to a human being.

The wireless location methods and apparatus described herein may be deployed in conjunction with one or more Transceivers 1303-1305 or Tags and/or Nodes 1306-1308 located with the WCA 1302 to generate location coordinates for the one or more Transceivers 1303-1305 or Tags and/or Nodes 1306-1308. A controller or other device operating a processor may determine which one or more Transceivers 1303-1305 or Tags and/or Nodes 1306-1308 located within the three-dimensional space included in the RTA 1312 based upon a) the location of the one or more Transceivers 1303-1305 or Tags and/or Nodes 1306-1308; and b) the location of area included in the RTA 1312.

In another aspect of the present disclosure, in some embodiments, some energy levels may not be represented in the Agent Interface 1310. For example, in some embodiments, energy levels reflected off of a particular item may not be included in the Agent Interface 1310. Other embodiments may only represent energy levels that have reflected off of selected items within the RTA 1312 thereby emphasizing the presence of the selected items and ignoring the presence of other items within the RTA 1312.

Figure 14:
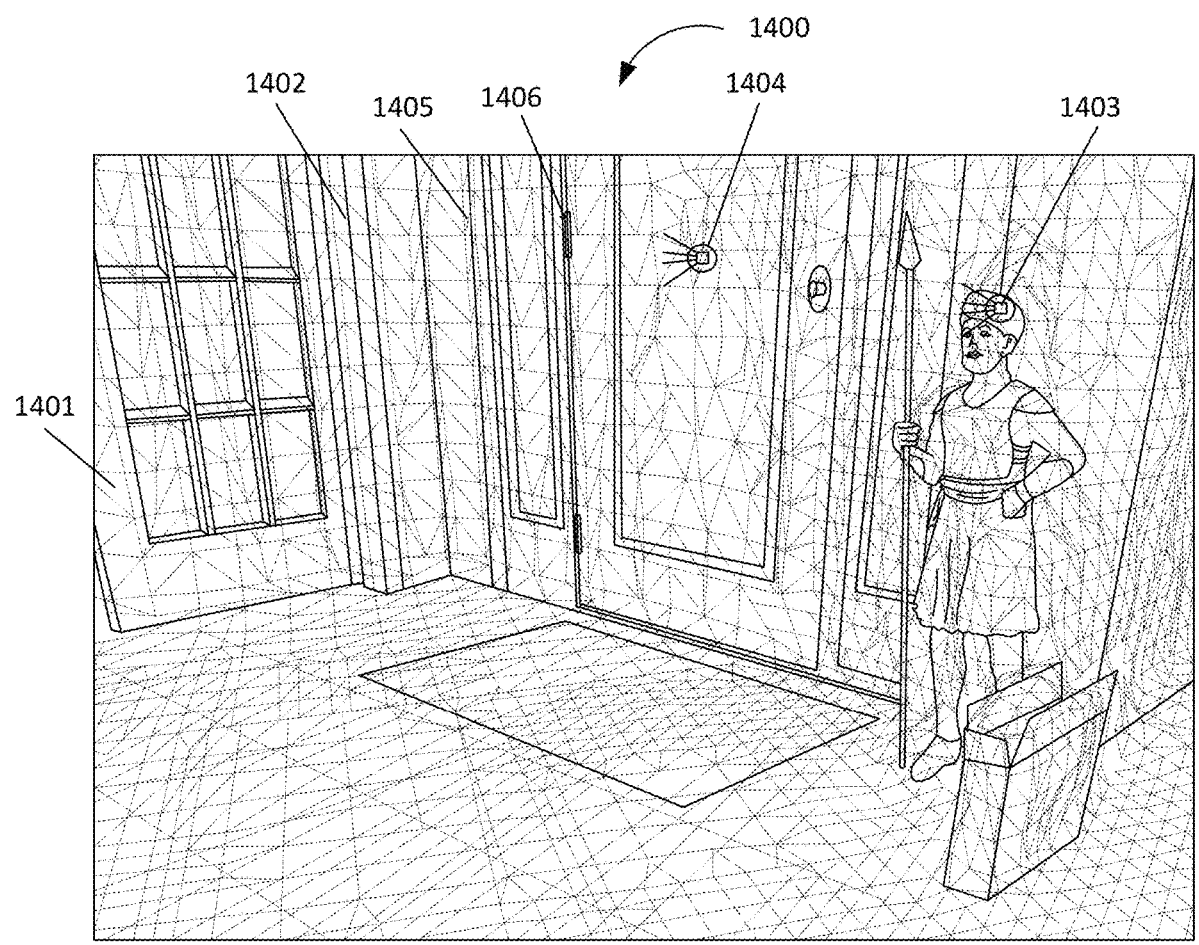
FIG. 14 illustrates a set of polygons generated via LIDAR that may be used for geospatial recognition.

As described above, some portion of the RTA 1312 may be portrayed on an Agent Interface 1310, including, in some embodiments, a human readable graphical user interface (GUI), as a point cloud derived from electromagnetic energy bouncing off of or emanating from items included in the RTA 1312 or a series of polygons generated based upon a LIDAR receiver in the Smart Device 1301. An example of such a representation is shown in FIG. 14. In this example, the GUI includes a Human Visual Image 1401 of an RTA 1400 overlaid with a series of Polygons 1402 generated based upon a LIDAR receiver in the Smart Device. The LIDAR sensor illuminates the RTA 1400 with laser light and then measures the reflection with a sensor. The resulting Polygons 1402 represent differences in laser return times, which provides a topographical representation of objects in the RTA 1400.

In this example, Virtual Tags 1403 and 1404 are created by the Smart Device by methods described herein and icons may be present on the GUI to identify the position of the Virtual Tags 1403 and 1404. The Virtual Tags 1403 and 1404 may for example, represent various locations of interest in the RTA, such as an Object of Interest or an Exit or Entrance. The icons associated with the Virtual Tags 1403 and 1404 may be engaged or "clicked" or otherwise activated to be made operational; for the Smart Device to receive (e.g., retrieved from a database) additional information associated with the object or location of interest.

For example, if the Object of Interest is a statue, clicking on the Icon associated with the Virtual Tag 1403 associated therewith may provide information regarding the statue, such as the history, origin, and the like. If, for example, the Virtual Tag 1404 is associated with an exit of the room, clicking the Virtual Tag may provide information on what is present in the adjacent room, or where the Smart Device is in relation to exiting the building, or any other desired information.

In some embodiments, mathematical data associated with a LIDAR rendering, such as parameters of triangles formed by various LIDAR Points 1405-1406 within an associated RTA may be stored and a relative position of a Smart Device with the RTA 1400 may be determined based upon the recognition of similarities of the LIDAR Points 1405-1406 patterns. A resolution of laser scanning involved in generation of data based upon LIDAR techniques may influence a number of date points within a selected RTA, but in general, pattern recognition and determination of an orientation of a smart device based upon LIDAR data may be much more efficient, than, for example image data-based pattern recognition. In addition, the LIDAR based patterns may be formed in a "fingerprint" of an RTA, wherein it would be very rare, if not impossible to replicate the LIDAR point patterns at two disparate locations. Therefore, recognition of a point pattern may be used to identify a location of a particular RTA.

Figure 15A:
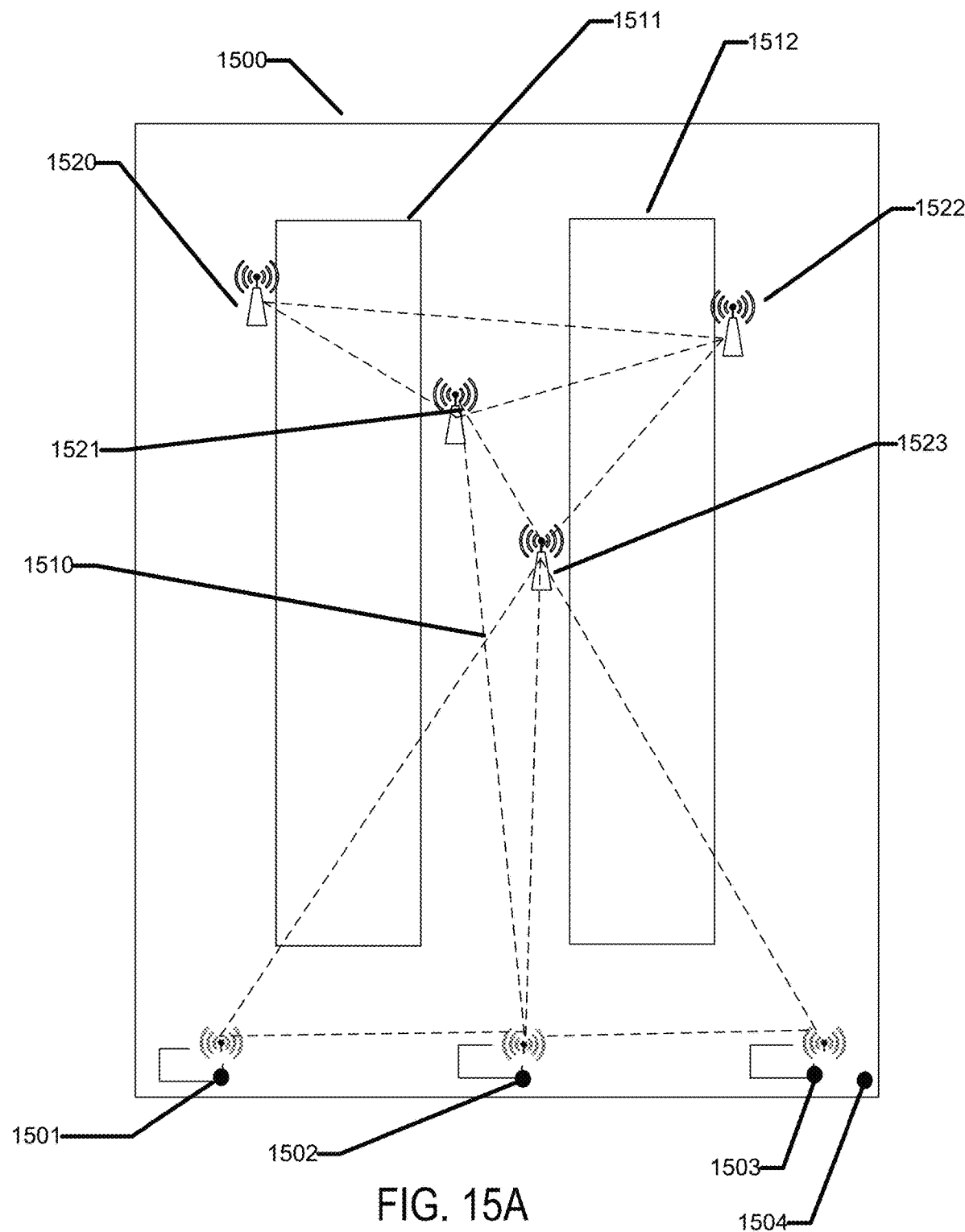
FIG. 15A illustrates a physical location with various stationary and movable wireless Nodes including camera equipped devices.

Referring to FIG. 15A, a representation of a SVAN 1510 is displayed. In this embodiment, Space 1500 may include Structures 1511 and 1512. Structures 1511 and 1512 may have a variety of different characteristics that may impact the performance of SVAN 1510. For example, Structures 1511 and 1512 may be physically closed (e.g., walls, solid Structures) or partially closed (e.g., shelves). Structures 1511 and 1512 may also comprise solid materials (which may be stored for example at a construction site), equipment such as automobiles, tractors, backhoes, and the like. Accordingly, the presence of these Structures may change the transmission characteristics of a wireless network (e.g., Bluetooth). Some Structures may block signals, impede signals, or partially impede signals. For example, shelves may have physical regions that block and other regions that are fully transmissive.

Shelves may provide an example in which the Structures in the Space 1500 may have dynamic characteristics. Such dynamic characteristics may make self-verifying arrays (and corresponding spatial schema) more useful than traditional mapping methods. For example, if a load of metal piping is brought in and placed upon the shelves, a region that was completely transmissive may become impeded to a degree. These characteristics may create different operational characteristics for self-verifying arrays.

In another sense, a shelf may hold a combination of both fixed and mobile devices that comprise a self-verifying array in the space at some given time. This may provide more accurate and more dynamic coverage for the schema. For example, the Space 1500 may be interspersed with an assembly of fixed (or roughly fixed) network Nodes that form a grid pattern (as an example) to ensure that a minimal self-verifying array may be established that covers the Space 1500. This minimal network may be supplemented with "migrant" Nodes that are moved into the Space 1500 and become part of the SVAN 1510. From a signal coverage perspective, more participants may improve characteristics. However, more participants may increase information traffic levels, and a control formalism that limits bandwidth differentially to different network participants may be necessary in some examples.

In FIG. 15A, an example of a Space 1500 with shelving units that make up Structures 1511 and 1512 is illustrated. The space may have a "global" Reference Point 1504 for positioning. There may be fixed wireless communication Nodes 1501, 1502, and 1503 (for this example, all Nodes are at least compliant with Bluetooth 5.1 and transmit at least as Bluetooth radio transmitters; however, this deployment is merely illustrative). The fixed wireless communication Nodes 1501-1503 may also include other aspects/components to them such as an integrated camera system. The integrated camera system may provide a visual perspective of a portion of the space that its corresponding wireless radios may cover. In a self-verifying array, Nodes may be collocated or located relative to a Sensor, such as an image-capture device. Based on a known set position of the Sensor relative to the Node, the Node may transmit information captured by the Sensor to other Nodes. Accordingly, a Node out of both Sensor and radio range of another Node may still receive data from the Sensor through the array. The data from the Sensor reflects a range of data in which a physical characteristic is quantified or capable of being quantified by the Sensor. For example, a Sensor may be an image-capture device, limited in range by both wavelength of image capture (e.g., limited to infrared) and spatial range (e.g., field of view of the image-capture device). This may be particularly desirable in embodiments in which the self-verifying array is deployed in or adjacent to an environment having a characteristic adverse to a Sensor. For example, the low temperatures found in a commercial freezer may impair operation of certain Sensors. Temperature-resistant Sensors may be collocated with Nodes within the freezer, while temperature-vulnerable Sensors (including Sensors capable of detecting conditions within the freezer) may be collocated outside the freezer. Through the self-verifying array comprised of these Nodes, data from the Sensors may be freely transferred among the Nodes, including through fiber optic communication throughout the freezer. It may be desirable to deploy spectrometers and hydrometers in this fashion. Moreover, redundant Nodes may be able to redirect Sensor readings from one Node to a base Node, especially in scenarios when an optimal Node pathway may be obstructed, such as by shelving.

The Space 1500 may also include other fixed Nodes, such as Node 1523, that may not have cameras included. Node 1523 may be important to ensure that regardless of a makeup of migrant communication Nodes, fixed wireless communication Nodes may be able to form a Space 1500 in the absence of items that block radio transmissions. There may also be migrant communication Nodes 1520-1522 affixed on packages, materials, or other items that may be placed and/or stored upon the shelving units.

In some examples, at least a subset of the SVAN-participant Nodes may communicate periodically. The various aspects of data layer communications as have been discussed may occur between the Nodes of the network. At a base level, at least a subset of the Bluetooth transmitters may periodically transmit information such as their unique identifiers, time stamps, known positions and the like. In some embodiments, Nodes may transmit between each other or to a base information about variables between the Nodes, such as computed distances or angles between the Nodes. A Node may receive transmissions from other transmitters and may store the transmissions. In some examples, a Node may act as a repeater by receiving a transmission and then retransmitting the received transmission. A Node acting as a repeater may then take various actions related to the data involved. In an example, the Node may effectively just stream the data where no storage of any kind is made. Alternatively, a Node may store the transmission, then retransmit the transmission (immediately or after a delay) and then delete the stored data. In other examples, a repeater Node may store a received transmission and then retransmit the transmission either for a stated number of times, or until some kind of signal is received after a transmission. Thereafter the Node may also delete the data. In some examples, a Node may store data from an incoming transmission and take the various retransmission actions as have been defined, but then not delete data until its data store is filled. At that point, it may either delete some or all of the stored data, or it may just overwrite stored data with new incoming data and then clean up any remaining data with a deletion or other process.

When a Node acts as a repeater, it may receive data and then merely retransmit the data. Alternatively, a repeater Node may either use the transmission of data or the time during the transmission to acquire and calculate its position and potentially the position of other transmitters in range. During retransmission of the received data, it may also include in the transmission calculations of its own position relative to other transmitters, calculations of other transmitter positions relative to itself, calculations of its own and other transmitter positions relative to an origin, and the like. It may also include other information such as a time stamp for the calculation of positions.

The combined elements of a SVAN may be operated in a way to optimize power management. Some of the network Nodes and transmitting elements may operate in connection with power-providing utility connections in the Structure. Other network Nodes may operate on battery power. Each of the Nodes may self-identify its power source, and either at a decision of a centralized controller or by a cooperative decision-making process, optimized decisions may be taken relative to data transmission, low-power operational modes, data storage and the like. In some examples, where multiple Nodes provide redundant coverage and provide information to a central bridge acting as a repeater, the Nodes may alternate in operation to share the power-draw on individual Nodes. For example, if one of these Nodes is connected to a utility power source, that Node may take the full load. The battery-powered elements may have charge-level detectors and may be able to communicate their power-storage level through the network. Accordingly, an optimization may reduce traffic on the lower battery capacity Nodes.

In some examples of operations, a transmitting Node may transmit a message for a number of redundant cycles to ensure that receivers have a chance to detect the message and receive it. In low power operating environments, receivers may transmit acknowledgements that messages have been received. If a base unit of the network acknowledges receipt of the message, control may be transferred to the base unit to ensure that the message is received by all appropriate network members. Message receivers may make a position determination and broadcast their position if it has changed. A self-verifying array of Bluetooth receivers may provide one of a number of Transceiver network layers where other communication protocols based on different standards or frequencies or modalities of transmission may be employed, such as Wi-Fi, UWB, Cellular bandwidth, ultrasonic, infrared and the like. A Node that is a member of different network layers may communicate and receive data between the different network layers in addition to communicating through a Bluetooth low-energy self-verifying array.

Figure 15B:
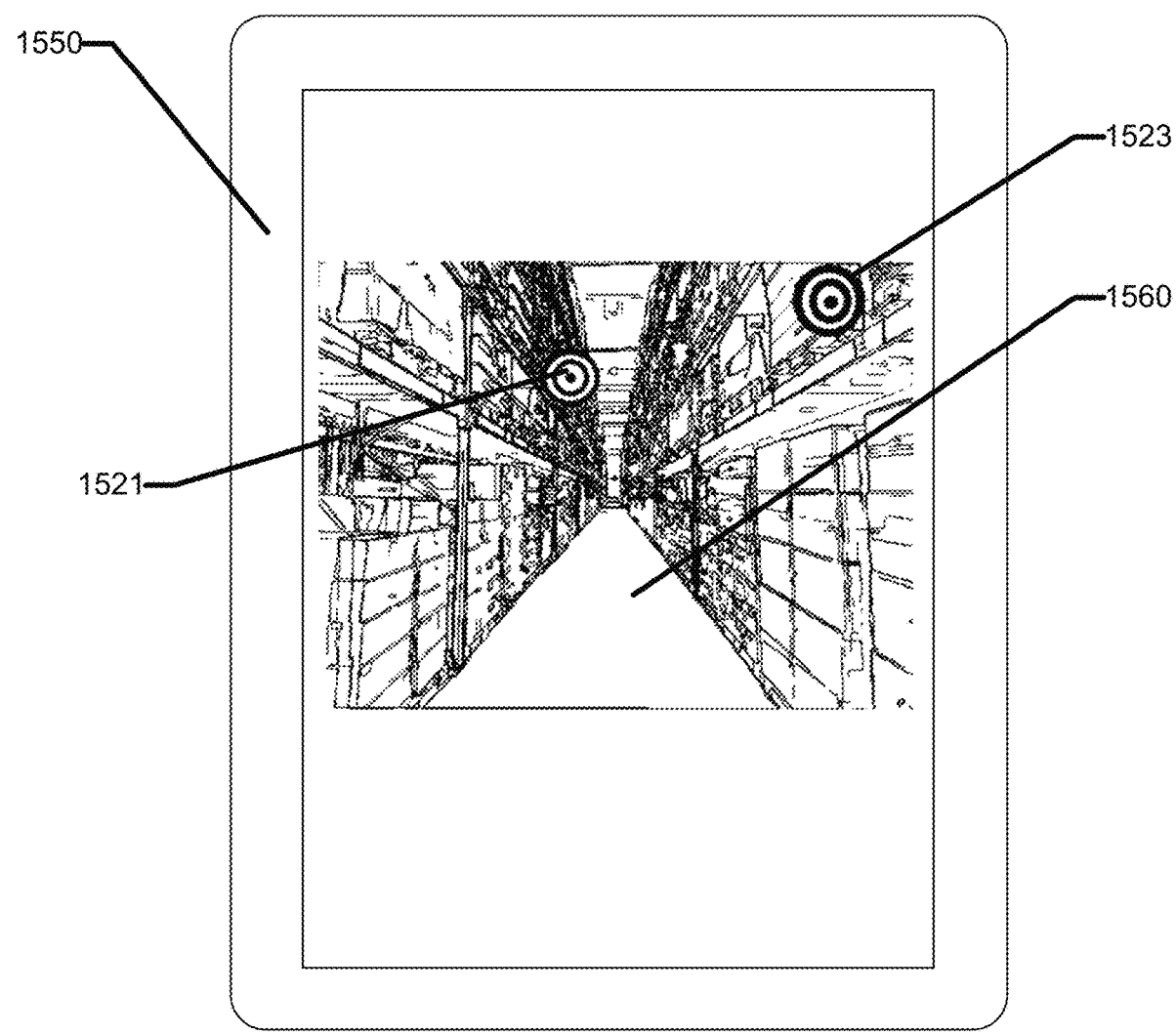
FIG. 15B illustrates a view on a Smart Device incorporating a camera video display with superimposed wireless device location.

Referring to FIG. 15B, an illustration of the view from a camera on a network Node position is presented. A Smart Device 1550 may interact with the self-verifying array and communicate a desire to receive images or video from a camera. In an example, referring back to FIG. 15A, the wireless communication Node 1501 may have a camera that produces an image that in FIG. 15B is presented on the Smart Phone as Image 1560. Processing either on the Smart Device or on processors connected to the network may collect information about the location of other network Nodes through the various processes as described herein and then determine a correct location on the collected image to display icons over the position of the Nodes 1521 and 1523. There may be numerous other types of information that may be overlaid onto the imagery such as Sensor measurements, textual presentations of data values, data related to status and transactions on the network, and the like.

In some examples, the cameras may be maintained in a fixed position or positioned on mounts that can allow the plane of view of the camera to be moved. The Smart Device 1550 may be supported by an agent such that it is oriented in such a manner to point to a particular view-plane from the perspective of the screen. This may either be from a perspective of looking through the smart screen (i.e., in the field of view of a camera associated with the Smart Device 1550) or, in other examples, supporting a screen of a Smart Device 1550 flat (i.e., parallel to a ground plane) and pointing in a direction of interest based on a direction of orientation of the Smart Device 1550. In related applications, it is disclosed that a Direction of Interest may be determined based on wireless communications. In some examples, orientation aspects of Transceivers upon the Smart Device 1550 may be employed to determine Rays of interest of the user (for example, to point the Smart Device 1550 in a Direction of Interest to the user). In other examples, other Sensors on the Smart Device such as accelerometers, magnetometers, and the like may be able to infer a direction in which the Smart Device is pointed. Once a Direction of Interest is determined, the camera may be moved to correspond to a plane perpendicular to a Ray associated with the Direction of Interest (i.e., such that the Ray is a normal vector to the plane). An assessment of items of interest whose coordinates may lie in the field of view of the selected view plane may be made, thus presenting data to the user, and allowing the user to filter out or learn more about the items.

Figure 15C:
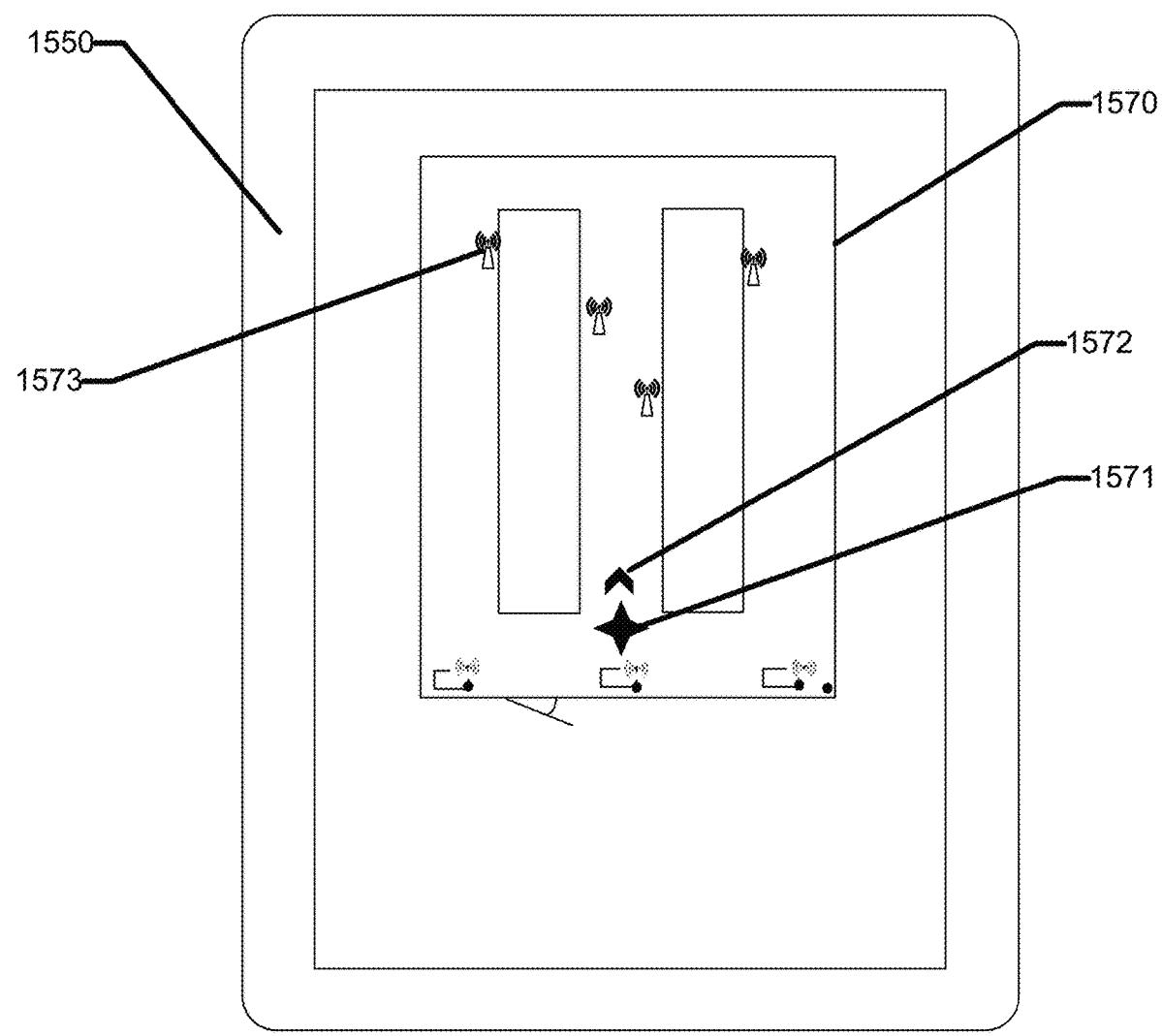
FIG. 15C illustrates a view on a Smart Device showing a map of known device locations as well as known user location and user orientation.

Referring now to FIG. 15C, another type of presentation is illustrated where a plan view or map view of the Space 1570 may be presented. In some examples, a Smart Device may access a virtual model (AVM) or other spatial schema that contains spatial data relating to the space that the user is in. The view may also include a presentation of the Structure, including features such as walls, doors, supports, shelving, equipment, and the like. The location of network Nodes may be illustrated by Icons at the two-dimensional locations determined by the various position-mapping processes as described herein. The location of the User 1571 may also be superimposed upon the map with a different Icon, and this location may be dynamically updated as the User 1571 is moving. There may also be an iconic representation of the Heading 1572 of the User 1571 which may be determined by the wireless protocols as discussed herein or it may be estimated based on the time-evolution of the position of the user (for example, through dead-reckoning). Items of interest may be presented on the map at any location surrounding the user such as in front, to the side or behind the user. In some other examples, only items in the view-plane (determined by the heading of the user) may be illustrated on the Smart Device 1550. Textual data and other types of information display such as color gradation may also be superimposed on the map to represent data values such as Sensor input, network characteristics, and the like. In some examples, a relative height of items of interest relative to the floor or to the Smart Device may be presented on the image as a text presentation.

Figure 15D:
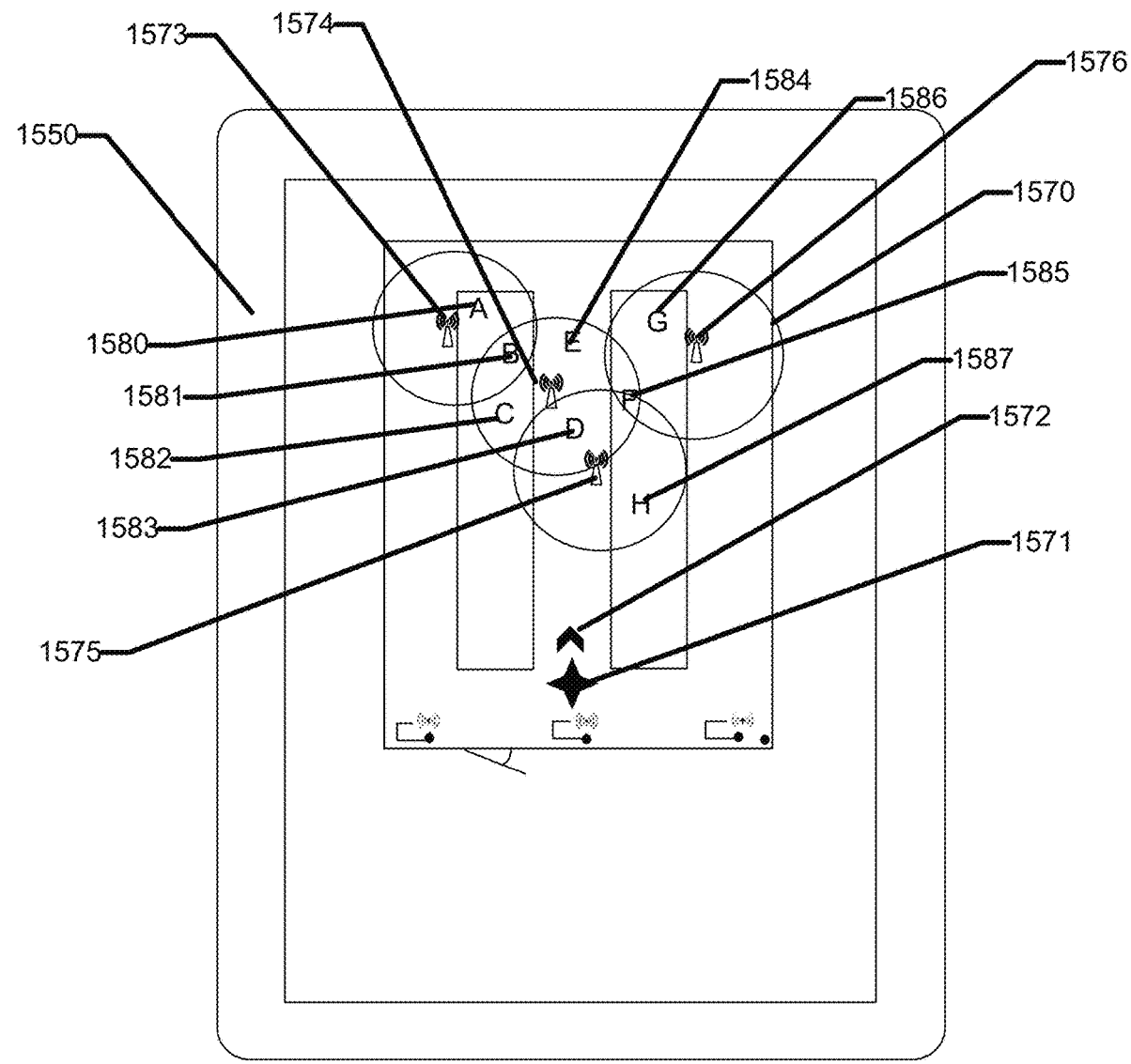
FIG. 15D illustrates a view of devices displayed on a Smart Device showing a map of known location equipped SVAN Node locations as well as regionally associated non-location equipped devices.

Referring to FIG. 15D an extension of location tracking is illustrated for devices that do not have positional capabilities (such as a GPS) but can respond to transmissions within a certain distance. The range of the device can allow a localization to be within a certain distance from a Node. In some examples, nanowatt Bluetooth Nodes that operate without battery power may be cheaply attached to items for tracking and/or can be affixed with Sensors to provide data acquisition. These devices may typically depend upon energy harvesting for their operation. In some examples, a transmission from a Node of the SVAN may itself carry enough energy to enable an RFID tag or other type of passive tag to respond with a low-energy transmission. Accordingly, a Node may transmit sufficient energy to activate an RFID, such as, for example, an RFID that has an identifier of an item to which it is affixed. The devices may be unable to perform all the wireless functions discussed herein, but they may be capable of transmitting identification data and perhaps Sensor data.

In some examples, RFIDs may be employed. Bluetooth self-verifying array Nodes may also have incorporated RFID tag readers that can similarly transmit a unique identifier in response to a transmission from the self-verifying array Node. In FIG. 15D, a Smart Device 1550 may display a map-form presentation of a Space 1570 (similar to the previous discussion with SVAN Nodes located in a two-dimensional coordinate system). In an exemplary embodiment, ultralow-power Bluetooth Nodes or RFID Nodes may be located on elements such as packages or equipment placed on the illustrated shelves. In response to transmissions from the SVAN Nodes, various low-power tags may respond. In some examples, the localization of the low-power tag may be based on further refinement of measurements, such as measurements of the returned signal strength.

Referring again to FIG. 15D, a SVAN Node 1573 may detect two transmitting Nodes (labeled "A" 1580 and "B" 1581 in FIG. 15D). Since Node "B" 1581 may also be detected by a neighboring SVAN Node 1574, it may be inferred that the Node may be in a region located between the two SVAN Nodes (i.e., since Node "B" is located in the overlap of the coverage areas of SVAN Nodes 1573 and 1574, it is likely that Node "B" is located somewhere between SVAN Nodes 1573 and 1574). Other Nodes received by SVAN Node 1574, such as Nodes 1582 and 1584, may not be detected by other SVAN Nodes and thus may be located in non-overlapped regions. As a further illustration, Node "D" 1583 may be detected both by SVAN Nodes 1574 and 1575. Node "F" 1585 may be detected by three different SVAN Nodes 1574, 1575 and 1576. Thus, the position of Node "F" may be determined with a high level of confidence. Node "G" 1586 may be located only in SVAN Node 1576. Node "H" 1587 may be located only in SVAN Node 1575. This data may provide localization information for regions around Bluetooth SVAN Nodes.

The non-limiting example discussed has included a Structure with obstructions in the form of shelves; however, obstructions may include any item that interferes with or inhibits or decreases quality of inter-Node communication within the self-verifying array.

Some self-verifying arrays may be established in an outdoor environment, such as a construction site. There may be numerous items, such as equipment, tools, and materials to which Nodes may be attached. In some examples, at a construction site there may be significant utility in establishing fixed Transceiver position as the site is initially established. The self-verifying array may track and locate the various equipment and materials through radio-frequency communications (e.g., via RFID). Furthermore, establishment of fixed points across the construction site may allow for a self-verifying array of significant size to be established. As described in reference to FIG. 15D, there can be RFIDs or Bluetooth Nodes that may be attached to various materials such as structural beams, wallboard pallets, and the like. In these examples, the transmitting Nodes may not have battery elements for cost or environmental conditions reasons. The location of various components of construction may be tracked as they are moved across the site. In some embodiments, an AVM may be used to compare expected movements of components to the observed movements. As the Structure is built and studied during the creation of AVMs, the various Bluetooth Nodes may still be able to provide communications as to components that make up Structure or are embedded within Structure.

Figure 15E:
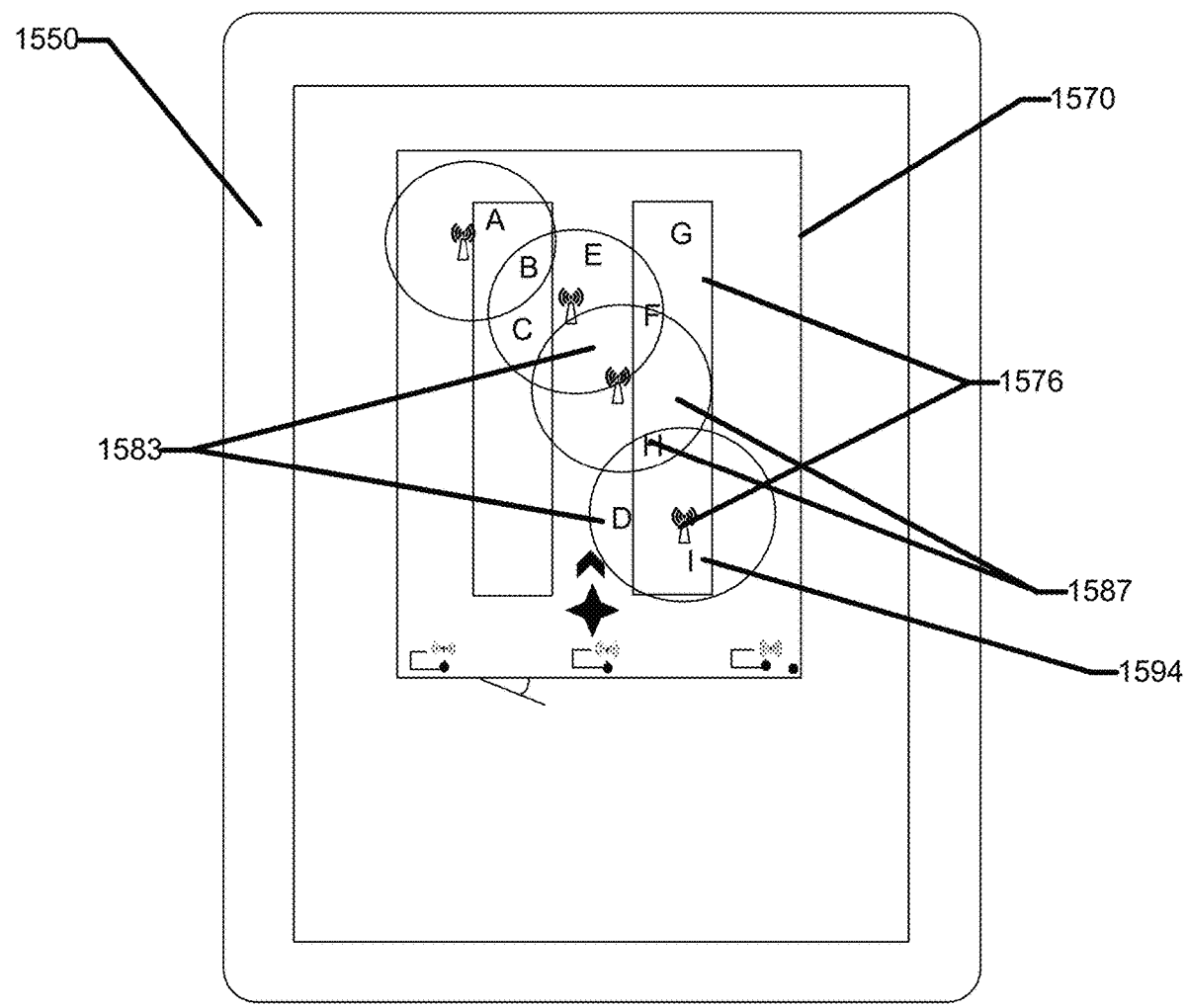
FIG. 15E illustrates a view of a SVAN displayed on a Smart Device showing movement of known location Node locations as well as movement of regionally associated non-location equipped devices.

Referring to FIG. 15E, elements of a self-verifying array in a Space 1570 may have dynamic locations and their movement may have ramification. In an example, SVAN Node 1576 may physically move to another location. The various self-verifying array data layers relating to location of elements may update for this move and the updated tables may be communicated to the Nodes of the network as has been described. At the new location, SVAN Node 1576 may signal to devices in its new region for response. There may be transmitting Nodes and RFIDS that are and have been in the new region that SVAN Node 1576 has moved to. For example, item "I" 1594 may be located by SVAN Node 1576 in its new location. As well, items with transmitting Nodes on them may also move as illustrated by the detected movement of item "D" 1583. Another type of change may be that when SVAN Node 1576 occupies its new location, item "H" 1587 may be detected in the region of two network Nodes now, and therefore its location may be refined to that region where the two network Nodes overlap in coverage.

Figure 15F:
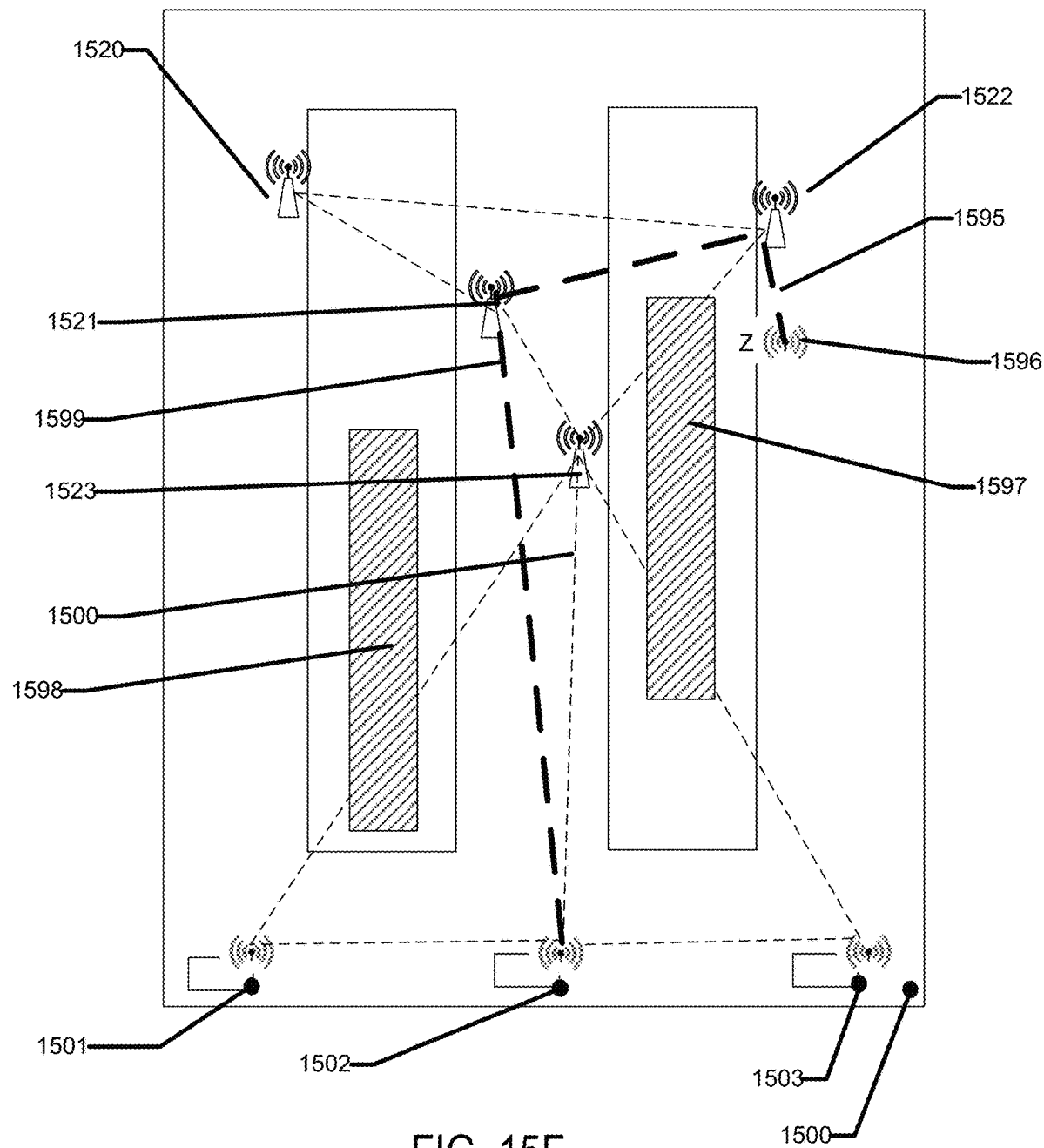
FIG. 15F illustrates a view of a SVAN being used to look around blockages.

Referring now to FIG. 15F, an illustration of a complex space where regions within the space may block or impede wireless communications is provided. In some examples, parts of a Structure like internal walls, conduits, equipment, structural beams, and elevators/shafts may provide permanent or temporary blockage of wireless transmission. For example, as an elevator passes through a particular floor, it may block transmissions through the elevator shaft that may otherwise occur. Shelves may temporarily have materials or equipment moved to positions on the shelves as illustrated by regions 1597 and 1598, which may block wireless transmissions. The Self-Verifying Array and its Nodes 1501-1503 and 1520-1523 may be able to cooperate and provide coverage of the Self-Verifying Array around such blockage. For example, a wireless communication Node 1596 may be too far from Node 1503 to communicate directly with it and communication from other fixed wireless communication Nodes 1501 and 1502 may be blocked by the blockage as discussed. The SVAN may still communicate 1595 with the wireless communication Node 1596 by connecting a Path 1599 shown in thick dashed lines essentially communicating with line-of-sight paths around the blockages.

Glossary

"Agent" as used herein refers to a person or automation capable of supporting a Smart Device at a geospatial location relative to a Ground Plane.

"Augmented Virtual Model" (sometimes referred to herein as "AVM"): as used herein is a digital representation of a real property parcel including one or more three-dimensional representations of physical structures suitable for use and As Built data captured descriptive of the real property parcel. An Augmented Virtual Model includes As Built Features of the structure and may include improvements and features contained within a Processing Facility.

"Bluetooth" as used herein means the Wireless Personal Area Network (WPAN) standards managed and maintained by Bluetooth SIG. Unless otherwise specifically limited to a subset of all Bluetooth standards, the Bluetooth will encompass all Bluetooth standards (e.g., Bluetooth 4.0; 5.0; 5.1 and BLE versions).

"Digital Content" as used herein refers to any artifact that may be quantified in digital form, by way of non-limiting example, digital content may include, one or more of: alphanumeric text; audio files; image data; video data; digital stories and media.

"Energy-Receiving Sensor" as used herein refers to a device capable of receiving energy from a Radio Target Area and quantifying the received energy as a digital value.

"Ground Plane" as used herein refers to horizontal plane from which a direction of interest may be projected.

"Image Capture Device" or "Scanner" as used herein refers to apparatus for capturing digital or analog image data, an Image capture device may be one or both of: a two-dimensional sensor (sometimes referred to as "2D") or a three-dimensional sensor (sometimes referred to as "3D"). In some examples an Image Capture Device includes a charge-coupled device ("CCD") sensor. "Intelligent Automation" as used herein refers to a logical processing by a device, system, machine or equipment item (such as data gathering, analysis, artificial intelligence, and functional operation) and communication capabilities.

"MultiModal" as used herein refers to the ability of a device to communicate using multiple protocols and/or bandwidths. Examples of multimodal may include being capable of communication using two or more of: Ultra-Wideband, Bluetooth; Bluetooth Low Energy; Wi-Fi; Wi-Fi RT; GPS; ultrasonic; infrared protocols and/or mediums.

"Node" as used herein means a device including at least a processor, a digital storage, and a wireless transceiver.

"Physical Tag" as used here shall mean a physical device with a transceiver capable of wireless communication sufficient to determine a geospatial position of the device. The Physical Tag may also be associated with a data set that is not contingent upon the geospatial location of the physical device.

"Radio Target Area" an area from which an energy-receiving Sensor will receive energy of a type and bandwidth that may be quantified by the energy-receiving Sensor.

"Ray" as used herein refers to a straight line including a starting point and extending indefinitely in a direction.

"Sensor" as used herein refers to one or more of a solid state, electro-mechanical, and mechanical device capable of transducing a physical condition or property into an analogue or digital representation and/or metric.

"Smart Device" as used herein includes an electronic device including, or in logical communication with, a processor and digital storage and capable of executing logical commands.

"Smart Receptacle" as used herein includes a case or other receiver of a smart device with components capable of receiving wireless transmissions from multiple wireless positional reference transceivers. In some embodiments, the smart receptacle will include a wireless transmitter and/or a physical connector for creating an electrical path for carrying one or both of electrical power and logic signals between an associated Smart Device and the Smart Receptacle.

"Structure" as used herein refers to a manufactured assembly of parts connected in an ordered way. Examples of a Structure in this disclosure include a building; a subassembly of a building; a bridge, a roadway, a train track, a train trestle, an aqueduct; a tunnel a dam, and a retainer berm.

"Tag" as used herein refers to digital content and access rights associated with a geospatial position.

"Transceive" as used herein refers to an act of transmitting and receiving data.

"Transceiver" as used herein refers to an electronic device capable of one or both of wirelessly transmitting and receiving data.

"Vector" as used herein refers to a magnitude and a direction as may be represented and/or modeled by a directed line segment with a length that represents the magnitude and an orientation in space that represents the direction.

"Virtual Tag" as used here shall mean digital content associated with a location identified via positional coordinates.

"Wireless Communication Area" (sometimes referred to as "WCA") as used herein means an area through which wireless communication may be completed. A size of a WCA may be dependent upon a specified modality of wireless communication and an environment through which the wireless communication takes place. In discussion (and as illustrated), a WCA may be portrayed as being spherical in shape, however in a physical environment a shape of a WCA may be amorphous or of changing shape and more resemble a cloud of thinning density around the edges.

Data analysis techniques, such as a Fast Fourier Transform; structured queries; and unstructured queries may yield relevant pattern information.

A number of embodiments of the present disclosure have been described. While this specification contains many specific implementation details, there should not be construed as limitations on the scope of any disclosures or of what may be claimed, but rather as descriptions of features specific to particular embodiments of the present disclosure. While embodiments of the present disclosure are described herein by way of example using several illustrative drawings, those skilled in the art will recognize the present disclosure is not limited to the embodiments or drawings described. It should be understood the drawings and the detailed description thereto are not intended to limit the present disclosure to the form disclosed, but to the contrary, the present disclosure is to cover all modification, equivalents and alternatives falling within the spirit and scope of embodiments of the present disclosure as defined by the appended claims.

The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including but not limited to. To facilitate understanding, like reference numerals have been used, where possible, to designate like elements common to the figures.

The phrases "at least one," "one or more," and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted the terms "comprising," "including," and "having" can be used interchangeably.

Certain features that are described in this specification in the context of separate embodiments can also be implemented in combination in a single embodiment. Conversely, various features that are described in the context of a single embodiment can also be implemented in combination in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while method steps may be depicted in the drawings in a particular order, this should not be understood as requiring that such operations be performed in the particular order shown or in a sequential order, or that all illustrated operations be performed, to achieve desirable results.

Certain features that are described in this specification in the context of separate embodiments can also be implemented in combination in a single embodiment. Conversely, various features that are described in the context of a single embodiment can also be implemented in combination in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order show, or sequential order, to achieve desirable results. In certain implementations, multitasking and parallel processing may be advantageous. Nevertheless, it will be understood that various modifications may be made without departing from the spirit and scope of the claimed disclosure.

What is claimed is:

1. An Agent supportable device for indicating an item of interest, the Agent supportable device comprising:
   a. a smart device supportable by an Agent at a location relative to a ground plane, the smart device comprising:
   b. a memory storing a software program;
   c. a directional sensor enabling an indication of a magnetic based direction;
   d. an antenna configured to communicate with a wireless data transceiver;
   e. an ultra-wideband (UWB) receiver in logical communication with the antenna;
   f. a transmitter also in logical communication with the antenna;
   g. a user interface surface;
   h. a clock;
   i. a processor in logical communication with the memory, the processor operative via execution of the software program to cause the Agent supportable device to:
      i. with the UWB receiver, receive a first digital communication from the wireless data transceiver comprising a UWB transceiver, the first digital communication comprising an identifier and data, useful in determining a distance of the wireless data transceiver from the smart device supportable by the Agent;
      ii. referencing the first digital communication, generate the distance between the wireless data transceiver and the smart device supportable by the Agent;
      iii. with the transmitter, transmit a second digital communication to the wireless data transceiver, the second digital communication comprising data, useful to determine a direction of the wireless data transceiver in relation to the smart device supportable by the Agent;
      iv. calculate timing of at least one of the first digital communication and the second digital communication;

v. based upon the second digital communication, generate the direction of the wireless data transceiver in relation to the smart device supportable by the Agent;

vi. generate a direction of the wireless data transceiver comprising the UWB transceiver in relation to the Agent supportable device;

vii. display a user interface on the user interface surface, the user interface comprising an indication of the direction of the wireless data transceiver in relation to the Agent supportable device, the direction of the wireless data transceiver comprising a direction of interest; and viii. display on the user interface the distance between the Agent supportable device and the wireless data transceiver.

2. The Agent supportable device of claim 1 additionally comprising a location sensor comprising a circuitry capable of detecting GPS signals and the processor is additionally operative via execution of the software program to cause the Agent supportable device to generate a location of the Agent supportable device.

3. The Agent supportable device of claim 1 additionally comprising a network interface enabling the Agent supportable device to communicate via a wireless data communication standard.

4. The Agent supportable device of claim 1, additionally comprising a magnetic force sensor comprising a Hall Effect Sensor.

5. The Agent supportable device of claim 1, additionally comprising a motion sensor comprising an accelerometer and the processor is additionally operative via execution of the software program to cause the Agent supportable device to sense one or more of: physical acceleration, orientation, and vibration.

6. The Agent supportable device of claim 1 wherein the processor is additionally operative via execution of the software program to generate vector indicating the direction of interest.

7. The Agent supportable device of claim 6 wherein the vector is at an angle that is Perpendicular to a plane of user interface surface.

8. The Agent supportable device of claim 1 wherein the distance between the wireless data transceiver and the smart device supportable by the Agent is generated based upon a round trip time comprising one of a first communication and a second communication.

9. The Agent supportable device of claim 1 wherein the distance between the wireless data transceiver and the smart device supportable by the Agent is generated based upon a time of flight comprising one of a first communication and a second communication.

10. The Agent supportable device of claim 1 wherein the direction of the wireless data transceiver and the smart device supportable by the Agent is generated based upon at least one of: an angle of arrival and an angle of departure of a wireless transmission.

11. The Agent supportable device of claim 1 additionally comprising a light source emitting energy and the processor is additionally operative via execution of the software program to cause the Agent supportable device to receive reflected energy emitted from the light source as received image data.

12. The Agent supportable device of claim 2 wherein the Agent comprises a person or automation capable of supporting a Smart Device at a geospatial location relative to a Ground Plane.

13. The Agent supportable device of claim 12 wherein the processor is additionally operative via execution of the software program to cause the location sensor to receive global positioning signals (GPS) and then reference the GPS to generate the location of the Agent supportable device.

14. The Agent supportable device of claim 13 wherein the processor is additionally operative via execution of the software program to reference the GPS and indicate in the user interface at least one of: an address, a unit number, and a lot number.

15. The Agent supportable device of claim 1 wherein the processor is additionally operative via execution of the software program to cause the Agent supportable device to generate an angle of transmission of the second digital communication.

16. The Agent supportable device of claim 1 wherein the processor is additionally operative via execution of the software program to cause the Agent supportable device to generate an angle of arrival of the first digital communication.

17. The Agent supportable device of claim 1 wherein the Agent supportable device additionally comprises an accelerometer and the processor is additionally operative via execution of the software program to cause the Agent supportable device to indicate in the user interface, movement of the Agent supportable device towards or away from the wireless data transceiver.

18. The Agent supportable device of claim 1, wherein the processor is additionally operative via execution of the software program to cause the Agent supportable device to generate indicators of distance from the wireless data transceiver based upon a comparison of timing signals received from the wireless data transceiver.

19. The Agent supportable device of claim 1, wherein the processor is additionally operative via execution of the software program to cause the Agent supportable device to generate potential locations of multiple wireless data transceivers.

20. The Agent supportable device of claim 1, wherein the processor is additionally operative via execution of the software program to cause the Agent supportable device to generate a virtual tag in the use.

* * * * *